(12) United States Patent
Chen et al.

(10) Patent No.: US 7,993,937 B2
(45) Date of Patent: Aug. 9, 2011

(54) DC AND RF HYBRID PROCESSING SYSTEM

(75) Inventors: Lee Chen, Cedar Creek, TX (US);
Merritt Funk, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/887,576

(22) Filed: Sep. 22, 2010

(65) Prior Publication Data

US 2011/0070665 A1  Mar. 24, 2011

Related U.S. Application Data

(60) Provisional application No. 61/245,146, filed on Sep. 23, 2009.

(51) Int. Cl.
*H01L 21/00* (2006.01)
*H01L 21/66* (2006.01)
*G01R 31/26* (2006.01)

(52) U.S. Cl. .......... 438/10; 438/5; 438/16; 438/17; 438/18; 257/E21.528

(58) Field of Classification Search .......... 438/5, 9, 438/16, 17, 18; 257/E21.528
See application file for complete search history.

(56) References Cited

U.S. PATENT DOCUMENTS

| | | | |
|---|---|---|---|
| 4,478,874 A | 10/1984 | Hahn | |
| 4,858,556 A | 8/1989 | Siebert | |
| 5,114,556 A | 5/1992 | Lamont, Jr. | |
| 5,578,238 A | 11/1996 | Weiss et al. | |
| 6,045,618 A | 4/2000 | Raoux et al. | |
| 6,051,113 A | 4/2000 | Moslehi | |
| 6,187,072 B1 | 2/2001 | Cheung et al. | |
| 6,193,802 B1 | 2/2001 | Pang et al. | |
| 6,228,754 B1 | 5/2001 | Iacoponi et al. | |
| 6,255,222 B1 | 7/2001 | Xia et al. | |
| 6,303,490 B1 | 10/2001 | Jeng | |
| 6,372,156 B1 | 4/2002 | Kong et al. | |
| 6,503,379 B1 | 1/2003 | Kidd et al. | |
| 6,517,913 B1 | 2/2003 | Cheung et al. | |
| 6,541,392 B2 | 4/2003 | Avniel et al. | |
| 6,800,494 B1 | 10/2004 | Castle et al. | |
| 6,905,578 B1 | 6/2005 | Moslehi et al. | |
| 7,189,437 B2 | 3/2007 | Kidd et al. | |
| 7,193,228 B2 | 3/2007 | Bowering et al. | |
| 7,250,196 B1 | 7/2007 | Kidd et al. | |
| 2002/0034882 A1 | 3/2002 | Avniel et al. | |
| 2002/0092616 A1 | 7/2002 | Kim | |
| 2003/0054953 A1 | 3/2003 | He et al. | |
| 2003/0136670 A1 | 7/2003 | Kidd et al. | |
| 2003/0159925 A1 | 8/2003 | Sako | |
| 2003/0180450 A1 | 9/2003 | Kidd et al. | |
| 2005/0031796 A1 | 2/2005 | Wu et al. | |
| 2005/0126497 A1 | 6/2005 | Kidd et al. | |
| 2005/0194475 A1 | 9/2005 | Kim et al. | |
| 2005/0199830 A1 | 9/2005 | Bowering et al. | |
| 2005/0205211 A1 | 9/2005 | Singh et al. | |
| 2006/0006382 A1 | 1/2006 | Moser | |
| 2006/0121816 A1 | 6/2006 | Lee et al. | |
| 2007/0170378 A1 | 7/2007 | Bowering et al. | |
| 2007/0259132 A1 | 11/2007 | Moser | |
| 2008/0075877 A1 | 3/2008 | He et al. | |
| 2008/0121620 A1 | 5/2008 | Guo et al. | |
| 2008/0141939 A1 | 6/2008 | Gillard et al. | |
| 2008/0179183 A1 | 7/2008 | Boitnott et al. | |
| 2009/0086401 A1 | 4/2009 | Samir et al. | |
| 2009/0218311 A1 | 9/2009 | Jiang et al. | |
| 2010/0058986 A1 | 3/2010 | Kidd et al. | |
| 2010/0096255 A1 | 4/2010 | Ye et al. | |

*Primary Examiner* — Jarrett J Stark

(57) ABSTRACT

The invention can provide apparatus and methods for processing substrates and/or wafers in real-time using at least one Direct Current (DC)/Radio Frequency (RF) Hybrid (DC/RFH) processing system and associated Direct Current/Radio Frequency Hybrid (DC/RFH) procedures and DC/RFH process parameters and/or DC/RFH models.

19 Claims, 49 Drawing Sheets

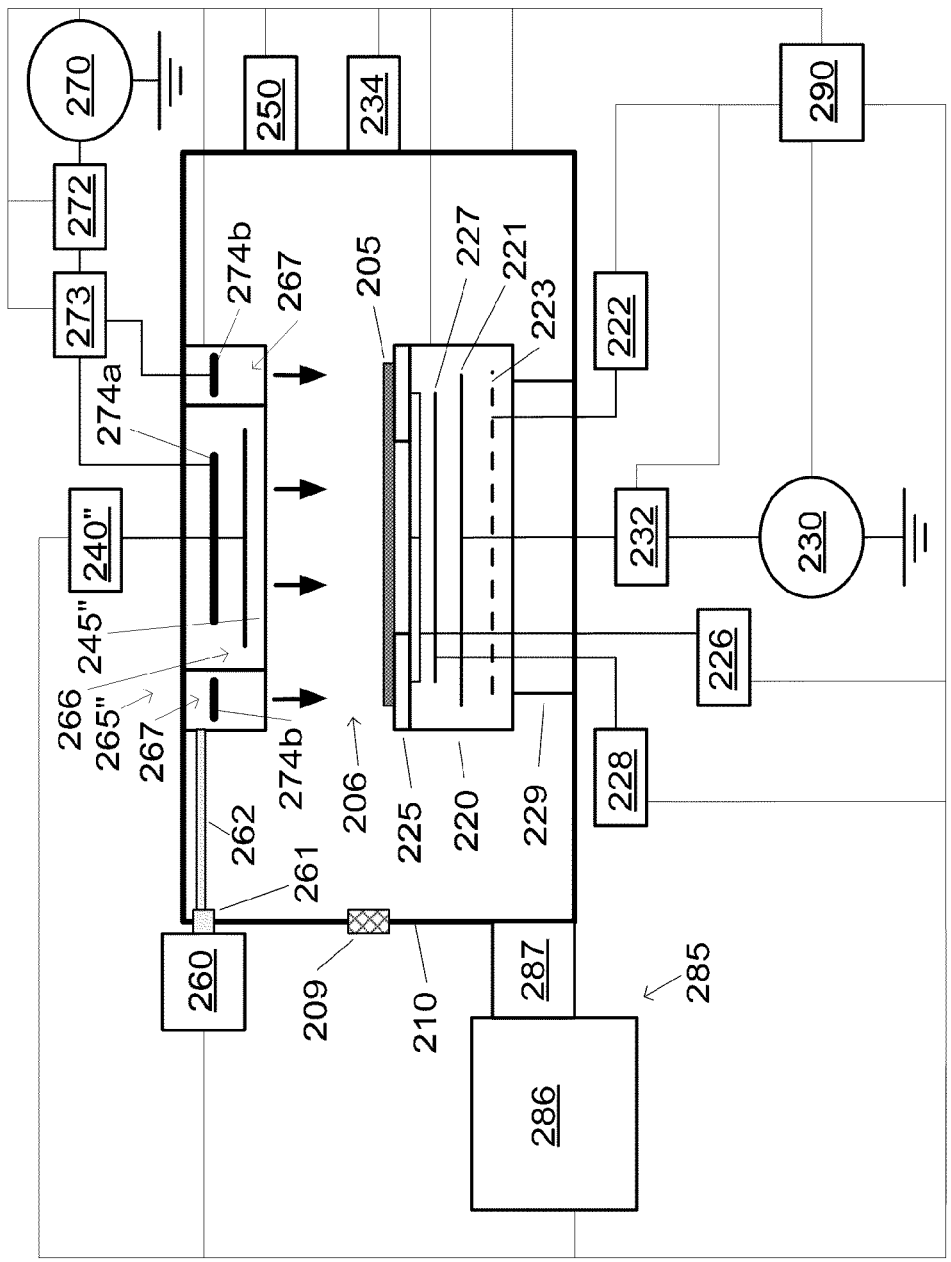

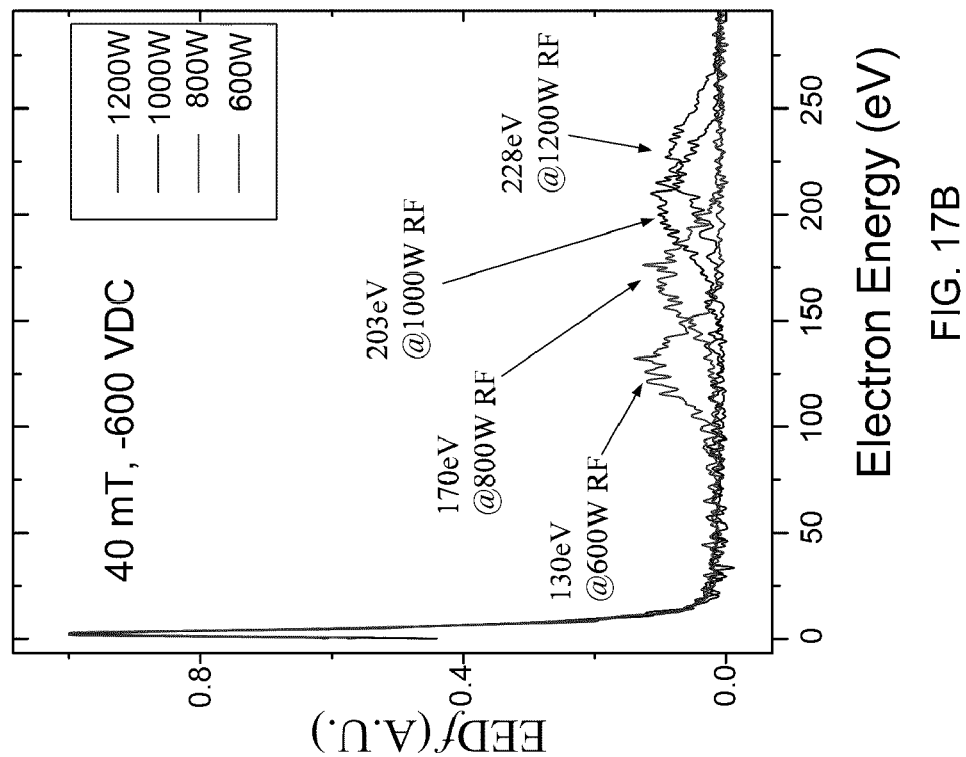
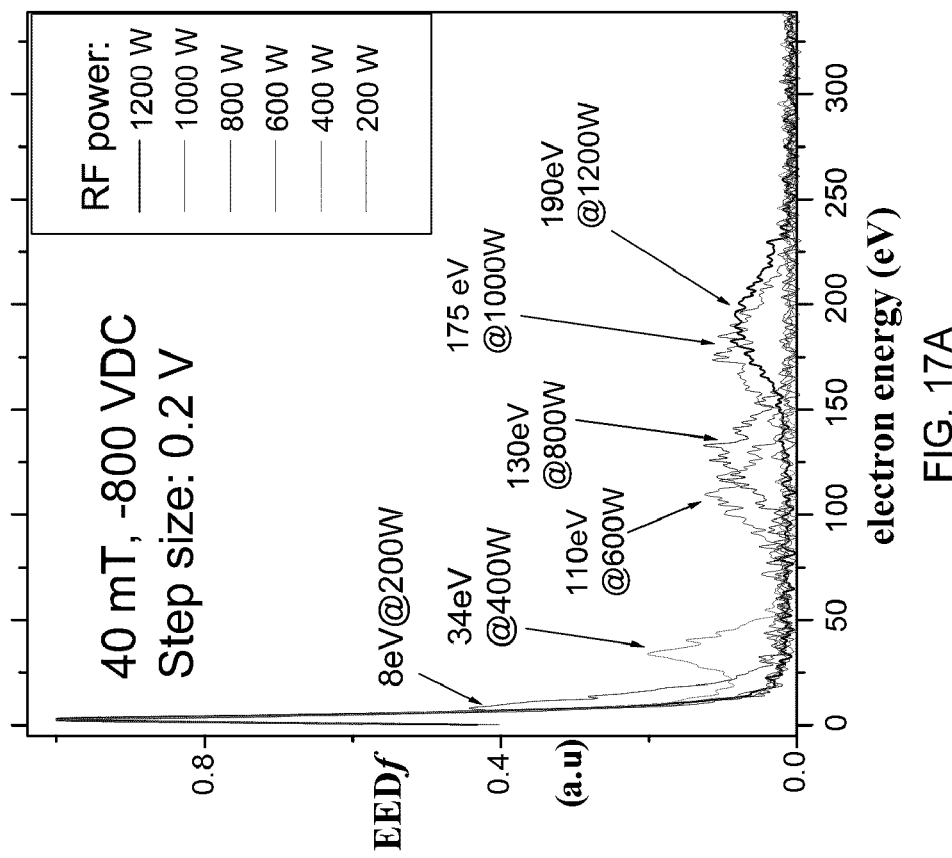
FIG. 17B
FIG. 17A

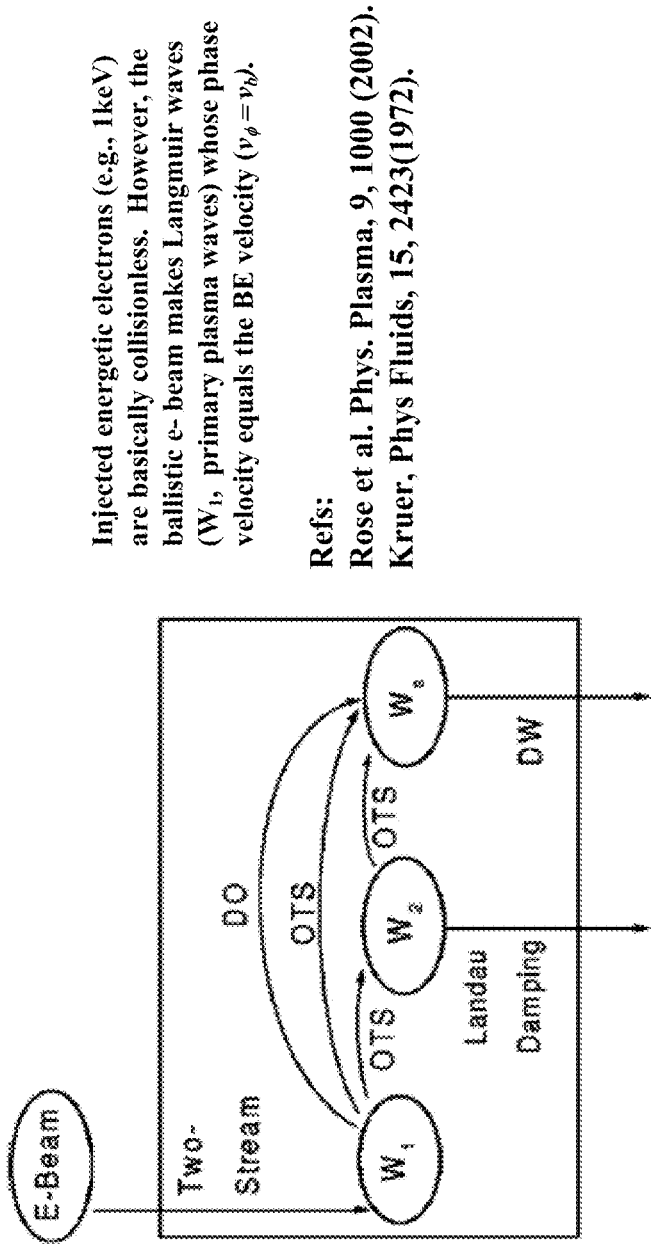

FIG. 21

FIG. 1. Flow diagram illustrating the distribution of wave energy as described by the rate equation model. $W_1$, $W_2$, and $W_3$ are the energy densities of the primary electrostatic, secondary electrostatic, and ion density waves. TS=two-stream, OTS=oscillating two-stream, DO is the interaction between the electrostatic and ion waves, L=Landau damping, and DW is the nonlinear ion wave damping term.

wave instability summary (1) main branch: oscillating 2-stream instability (OTS)[4] $\Rightarrow$ $W_1$ is converted to shorter $\lambda$ secondary-wave $W_2$ and ion-wave $W_s$. Reduced $v_\phi$ of $W_2$ is Landau damped by lower-velocity electrons and the Maxwellian tail, increasing their population. The instability growth rate[8,9] ($W_2$ growth rate is $\Gamma^{OTS}$, where $m_e/m_i$ is e-/ion mass, $T$ is the plasma temperature, $\varepsilon_I$ is $W_1$ energy density.

(2) parametric oscillations[5,6] and Doppler shift[2,7] of moving frame $\omega_P$ to lap-frame $\omega_P$ (e.g., for RF-sheath-edge stochastic e- stream) both an produce $\omega < \omega_P$ damping waves (imaginary). Without even invoking the ion waves[5,6], the $\omega < \omega_P$ waaves are damped by thermal e- toward the shorter $\lambda_\phi$; reduced $v_\phi$ can then couple to the Maxwellian tail via Landau damping. Also, the electrostatic waves can be broadband through interactions and couple strongly to ion density waves as their frequencies near[2,4]. Ion waves can then become resonantly strong at frequencies (e.g., 20kHz) characteristic to the chamber size.

(3) Interaction between the electrostatic and ion waves (DO)[4] $\Rightarrow$ as $W_s$ grow strong, ion waves can interact nonlinearly with the higher $v_\phi$ plasma waves and thereby increase the energy density of the second wave $W_2$ (and that of $W_s$ as well). The massive ions easily damp the primary waves to shorter $\lambda$ (lower $v_\phi$) secondary waves. Its $W_2$ growth rate[10,11] is $\Gamma^{DO}$, where $\varepsilon_s$ is ion-wave energy density, $k_s$ is the ion-wave number, $\lambda_D$ is Debye length.

[3]F. F. Chen, *Introduction to Plasma Physics*, 1st ed. (Plenum Press, New York, 1974)
[4]D. V. Rose, J. U. Guillory, J. H. Beall, *Phys. Plasmas* 9, 1000 (2002)
[5]I. Silin, R. Sydora, K. Sauer, *Phys. Plasmas* 14, 012106 (2007)
[6]P. Gogalraja, J. Forster, *Appl. Phys. Lett.* 77, 3526 (2000)
[7]P. Rolland, *Phys. Fluids* 8, 2114 (1965)
[8]H. P. Freund et al., *Phys. Fluids* 23, 518 (1980)
[9]H. P. Freund et al., *Phys. Fluids* 23, 139 (1980)
[10]J. Dawson et al., *Phys. Fluids* 5, 517 (1962)
[11]J. Dawson et al., *Phys. Fluids* 6, 394 (1963)

FIG. 22B some beam-plasma references

Conrad et al. *PRL*, 30, 827 (1973).
Hopman, *Plasma Physics*, 10, 315 (1967)
Freese, *Phys. Fluids* 22, 2367 (1979)
Hopman, *Plasma Physics*, 9, 39 (1967)
Jones, *Phys. Fluids*, 19, 548 (1976).
Goldstein, *Phys. Fluids*, 21, 1569 (1978).

Boundary effect could be important, see:
Boswell, Phys Fluids B, 1, 1502 (1989).
Min, Planet. Space Sci., 42, 47 (1994).

Plasma waves, Landau and inverse-Landau (1) BE gained energy through continuous acceleration by sheath field. Specific-$v_\phi$ Landau Damping makes $v_\phi$-equivalent mono-energetic electrons. The population of this mono-energetic electron group is determined by $dN/dt$ = supply+loss = 0. This additional loss is electron inelastic collisions (e.g., ionization).

ballistic electron (BE) energy spread & BE peak shift
Note: ◆ BE energy spread
■ BE peak shift
$$\frac{E^2}{4\pi} = \frac{\alpha n_b m_e V_b^3}{\nu_{eff} L}$$
$\nu_{eff}$ = collision freq., $L$ = length
$V_b$ = beam velocity, $n_b$ = beam density
Ref.: Min, Planet Space Sci., 42, 47 (1994)
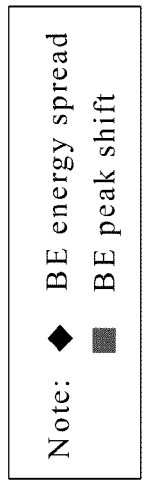
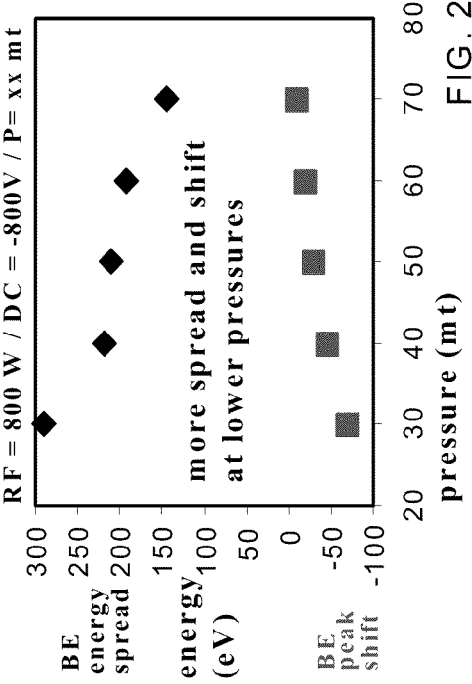
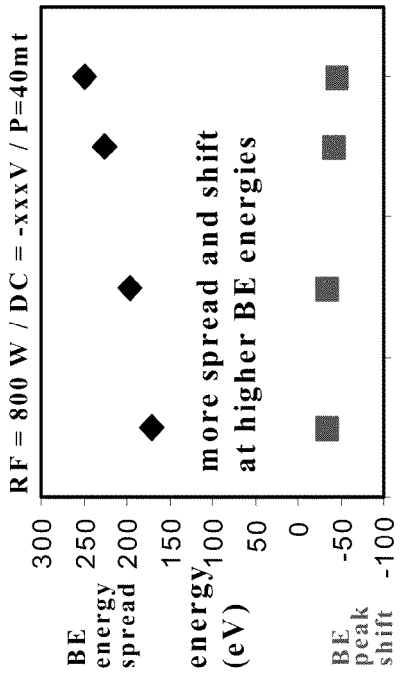
FIG. 25A
FIG. 25B
FIG. 25C

*triangle-shape* middle-energy peak's dependency on RF, DC (BE energy) and P
Note: ▲ = peak height (a.u.)
▬ = energy spread
◆ = energy
*summary:* middle-energy peak's energy trends with RF-sheath thickness, $s$.
$$s \propto \frac{V_0^{3/4}}{n_e^{1/2} T_e^{1/4}}$$
$V_0$ = thermal-electron-free sheath potential ~ RF $V_{PP}$.
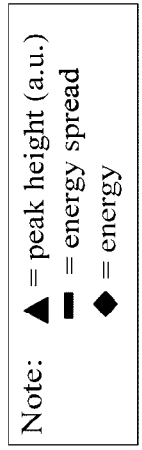
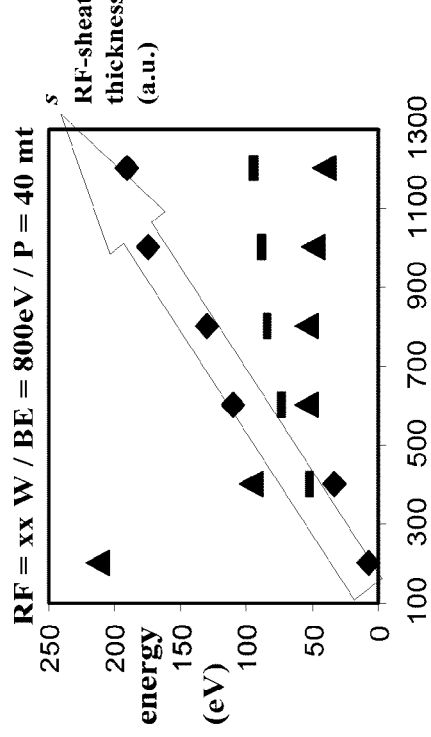
FIG. 26A
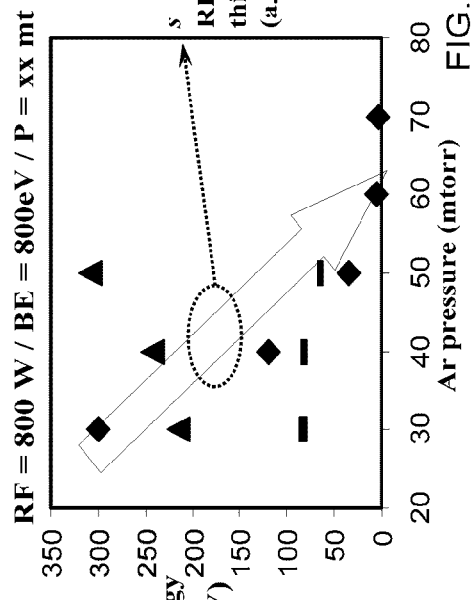
FIG. 26C
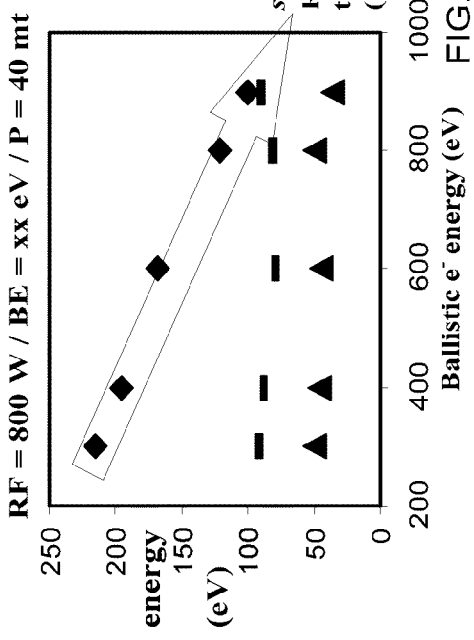
FIG. 26B

Langmuir waves in a bounded plasma plasma waves cannot exist inside the thermal-electron-free sheath; sheath-edge will reflect Langmuir waves:

(1) "reflection and absorption of electron plasma waves in a bounded plasma", H. Sugai, et al, Plasma Physic, Vol. 17, pp. 985-990.

(2) "Landau resonant heating using standing waves excited by a distributed circuit for electron velocity distribution control", C. K. Birdsall, et al, Phys. of Plasma, vol. 9 #5, 2002

Reflection at plasma sheath edge would set up standing waves which significantly enhance the E field of the potential waves. Multi-mode standing waves are Landau damped producing broadband (energy) energetic electrons. Therefore, there must be of standing wave in order to produce a single peak.

FIG. 27 bounded plasma, DC – DC sheaths plasma electron waves reflect at sheath-edge [K. Saeki, H. Sugai et al.,., Plasma Phys. 17 (1975)] - wave cannot exist in the electron-free sheath region.

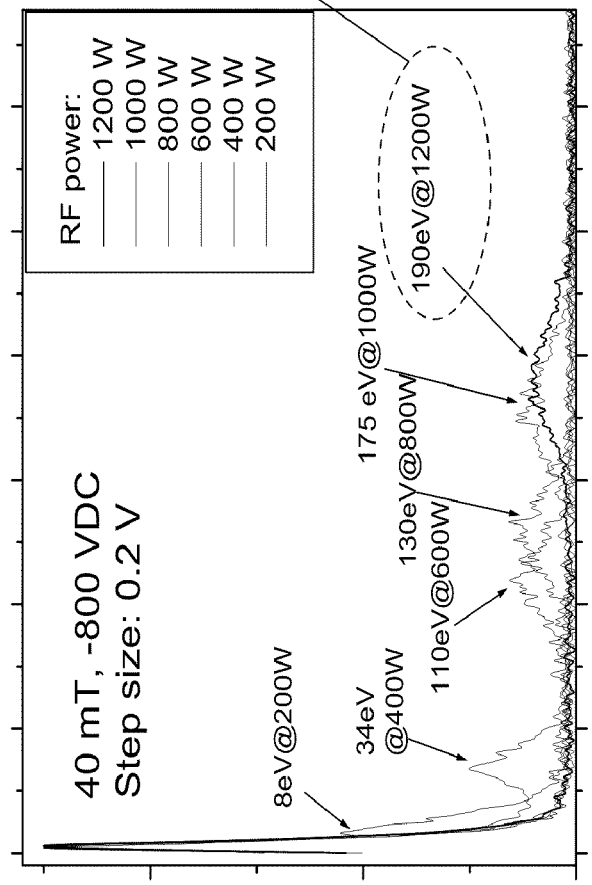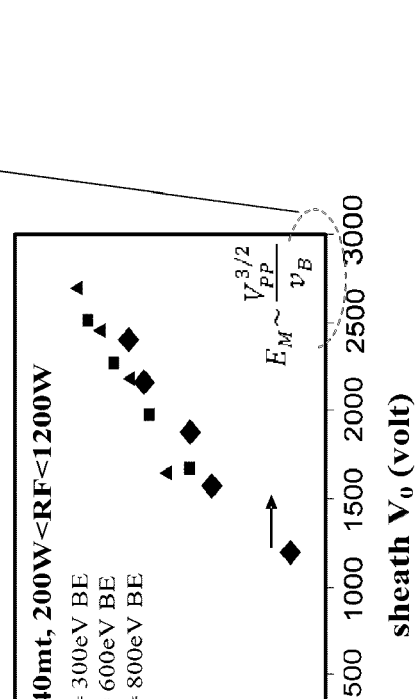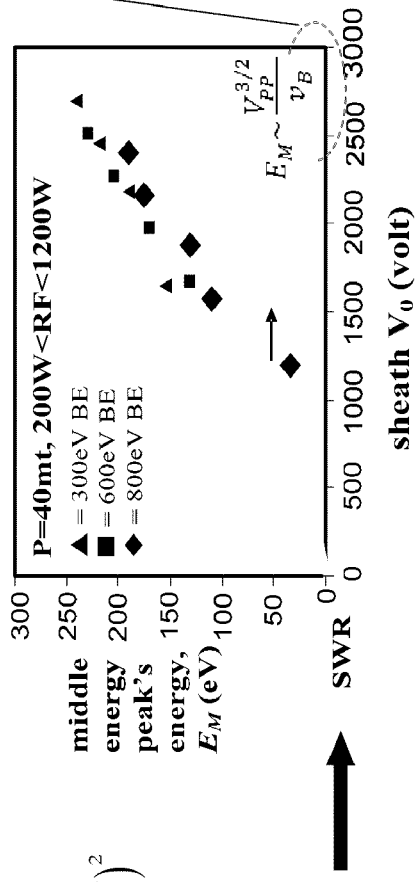
FIG. 30A

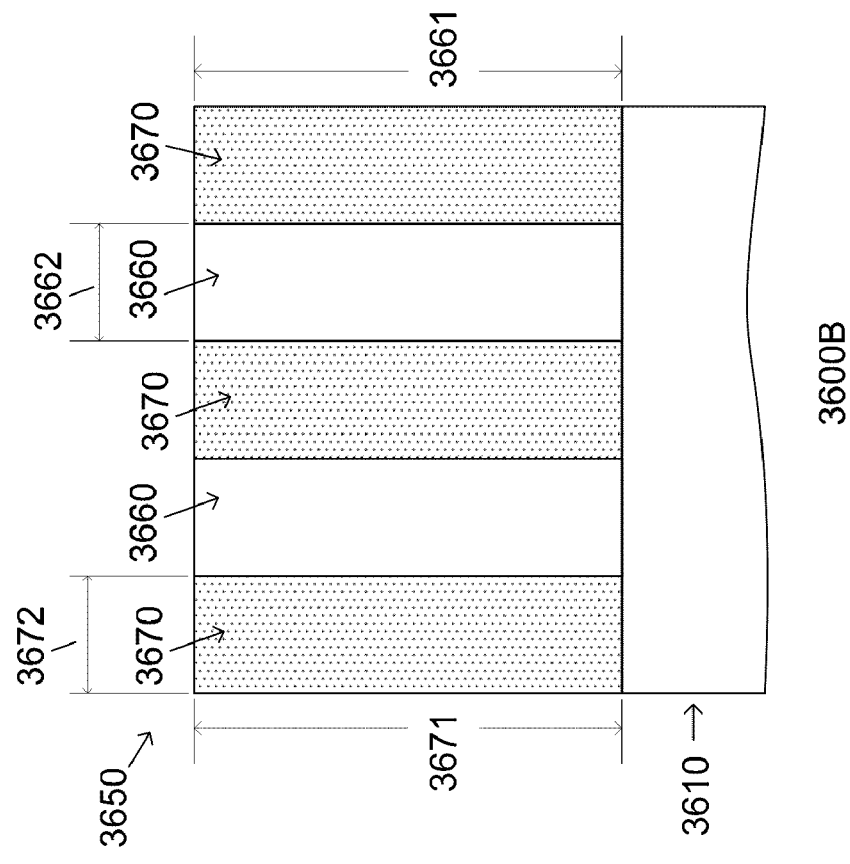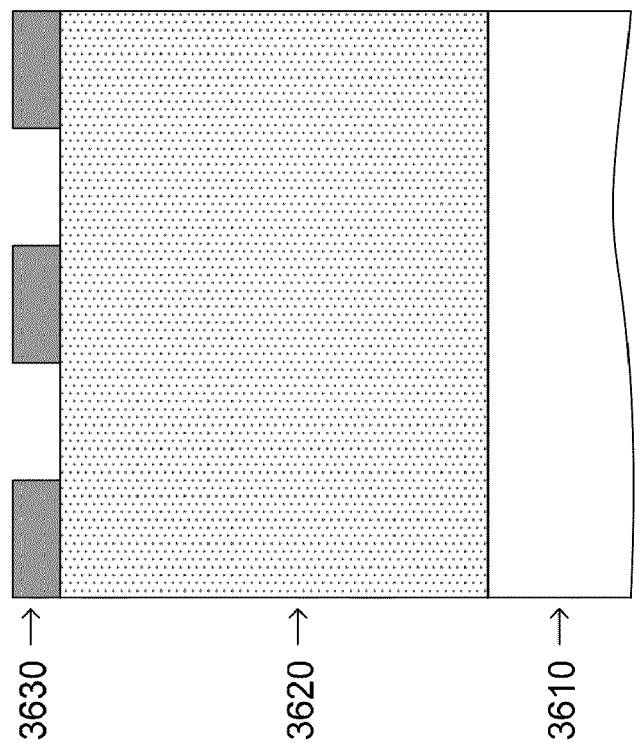
FIG. 36

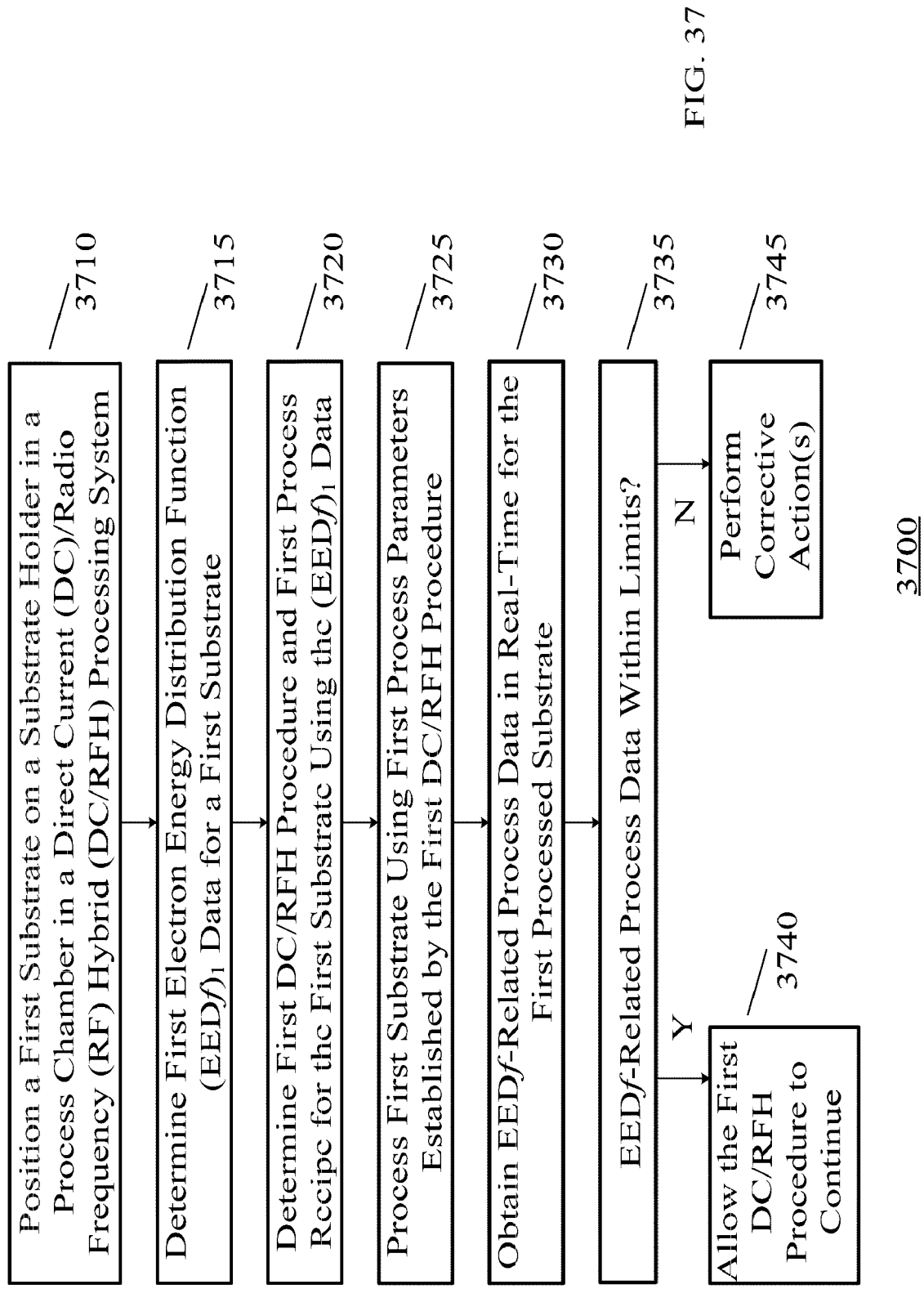

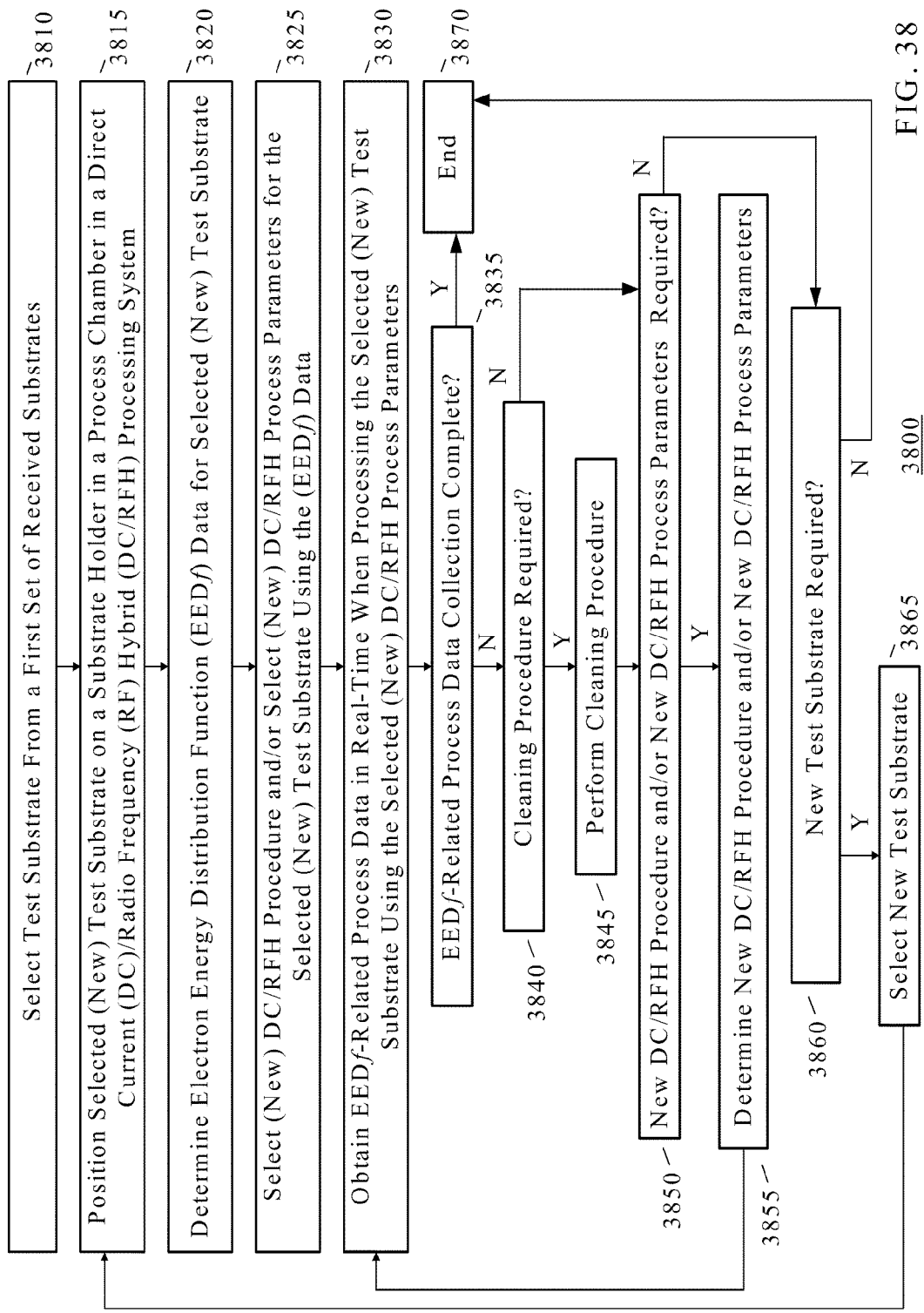

DC AND RF HYBRID PROCESSING SYSTEM

BACKGROUND OF THE INVENTION

1. Field of the Invention

The present invention relates to substrate processing, and more particularly to apparatus and methods for processing substrates and/or wafers in real-time using Direct Current (DC) and Radio Frequency (RF) Hybrid processing tools and associated Direct Current/Radio Frequency Hybrid (DC/RFH) recipes and/or models.

2. Description of the Related Art

Etch process behavior is inherently non-linear and interactive from step-to-step (layers) or as process stacks are compiled (etch/cvd/implant). With the knowledge of the process interactions based on physical modeling of Tokyo Electron Limited (TEL) chambers, base processes, imperial data, and measurements from process refinement and tuning the control of Critical Dimension (CD), Sidewall Angle (SWA), depths, film thicknesses, over etching, undercuts, surface cleaning and damage control can be recursively calculated and optimized using multi-input multi-output non-linear models. Current low cost products use a bulk silicon technology. As the transistor continues to shrink in size, the impact of the channel depth is becoming critical (ultra-shallow source/drain extensions). As the Silicon on Insulator (SOI) film shrinks, smaller variations in the gate and/or spacer thickness and thickness of the SOI film can affect the transistor's performance. When etch procedures are not controlled, the removal of the material near the gate affects the electrical performance.

Current high performance microprocessors use PD SOI (partially depleted Silicon-on-Insulator film—giving a threshold voltage of 0.2 volts). PD SOI films are around 50 nm thick while the gate and/or spacer reduction amount can be a large percentage (10%) of the total gate and/or spacer thickness. The future generation of SOI films is named FD SOI (fully depleted giving a threshold voltage 0.08 volts and a thickness of ~25 nm). Currently theses films are not in production due to limitations in thickness control uniformity and defects. Channel mobility degrades with decreasing SOI thickness. With thinner films, the control of the metal-gate structures becomes more critical.

SUMMARY OF THE INVENTION

The invention can provide apparatus and methods for processing substrates and/or wafers in real-time using at least one Direct Current (DC)/Radio Frequency (RF) Hybrid (DC/RFH) processing system and associated Direct Current/Radio Frequency Hybrid (DC/RFH) procedures and DC/RFH process parameters and/or DC/RFH models.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2A-2D show exemplary block diagrams of etching subsystems in accordance with embodiments of the invention;

FIGS. 17A and 17B illustrate additional exemplary ballistic electron (BE) energy data for the DC/RFH processing system in accordance with embodiments of the invention;

FIG. 21 illustrates an exemplary flow diagram of the distribution of wave energy in accordance with embodiments of the invention;

FIGS. 22A and 22B illustrate wave instability summary data for the DC/RFH processing system in accordance with embodiments of the invention;

FIGS. 25A, 25B, and 25C illustrate additional ballistic electron (BE) data for the DC/RFH processing system in accordance with embodiments of the invention;

FIGS. 26A, 26B, and 26C illustrate middle-energy peak data for the DC/RFH processing system in accordance with embodiments of the invention;

FIG. 27 illustrates additional plasma references in accordance with embodiments of the invention;

FIGS. 30A and 30B illustrate standing wave resonance (SWR) data and summary data in accordance with embodiments of the invention;

FIG. 36 illustrates an exemplary view of a DC/RFH etching procedure using a dielectric structure in accordance with embodiments of the invention; and FIG. 37 shows an exemplary flow diagram of another method of processing substrates using a DC/RFH processing system in accordance with embodiments of the invention; and FIG. 38 shows another exemplary flow diagram of another method of processing substrates using a DC/RFH processing system in accordance with embodiments of the invention.

DETAILED DESCRIPTION

The invention provides apparatus and methods for processing substrates and/or wafers in real-time using at least one Direct Current (DC)/Radio Frequency (RF) Hybrid (DC/RFH) processing system and associated Direct Current/Radio Frequency Hybrid (DC/RFH) procedures and DC/RFH process parameters and/or DC/RFH models In some embodiments, apparatus and methods are provided for creating and/or using a metrology library that includes profile data and diffraction signal data for various features and periodic structures formed on a substrate, such as a substrate for preparing electronic devices.

One or more evaluation features can be provided at various locations on a substrate and can be used to evaluate and/or verify DC/RFH processing procedures and associated models. Substrates can have real-time and historical data associated with them, and the substrate data can include DC/RFH processing data. In addition, the substrate can have other data associated with them, and the other data can include geometric/layer structure data, the number of required sites, the number of visited sites, confidence data and/or risk data for one or more of the sites, site ranking data, transferring sequence data, or process-related data, or evaluation/verification-related data, or any combination thereof. The data associated with substrates can include transfer sequence data that can be used to establish when and where to transfer the substrates, and transfer sequences can be changed using operational state data.

During etch mask dry developing and/or etching, a dry plasma process can be utilized, and the plasma is formed from a process gas by coupling electro-magnetic (EM) energy, such as radio frequency (RF) power, to the process gas in order to heat electrons and cause subsequent ionization and dissociation of the atomic and/or molecular composition of the process gas.

As feature sizes decrease below the 45 nm (nanometer) technology node, accurate processing and/or measurement data becomes more important and more difficult to obtain. DC/RFH processing procedures can be used to more accurately process and/or measure these ultra-small devices and features. The data from a DC/RFH processing procedure can be compared with the warning and/or control limits. When a run-rule is violated, an alarm can be generated indicating a processing problem, and correction procedures can be performed in real time.

Figure 1:
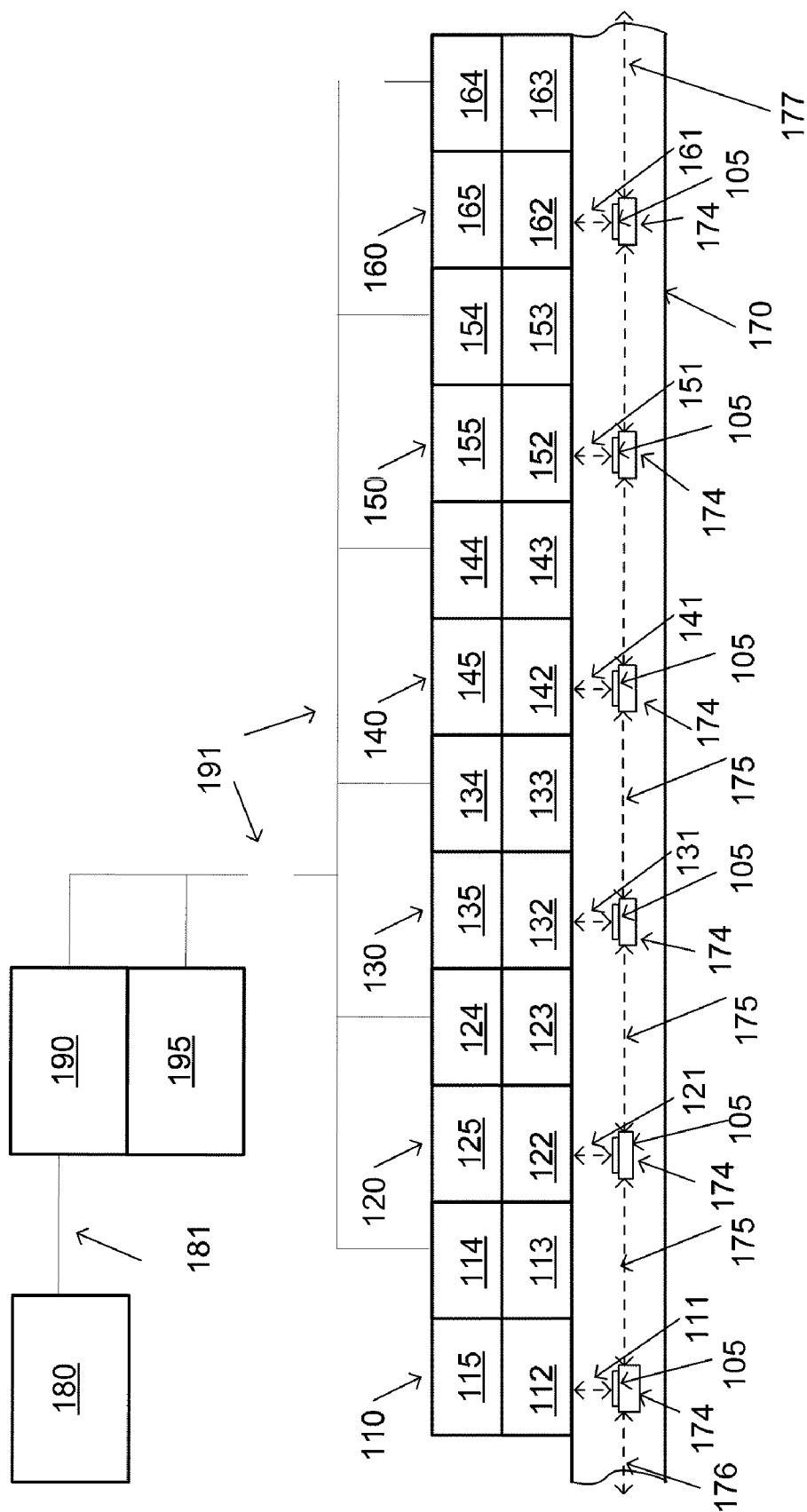
FIG. 1 shows an exemplary block diagram of a processing system in accordance with embodiments of the invention.

FIG. 1 shows an exemplary block diagram of a processing system in accordance with embodiments of the invention. In the illustrated embodiment, processing system 100 comprises a lithography subsystem 110, an exposure subsystem 120, an etch subsystem 130, a deposition subsystem 140, an inspection subsystem 150, an evaluation subsystem 160, a transfer subsystem 170, a manufacturing execution system (MES) 180, a system controller 190, and a memory/database 195. Single subsystems (110, 120, 130, 140, 150, 160, and 170) are shown in the illustrated embodiment, but this is not required for the invention. In some embodiments, multiple subsystems (110, 120, 130, 140, 150, 160, and 170) can be used in a processing system 100. For example, the etch subsystem 130 can include one or more Direct Current/Radio Frequency Hybrid (DC/RFH) processing tools and the (DC/RFH) processing tools in the etch subsystem 130 can be used to perform, validate, and/or update one or more of the Direct Current/Radio Frequency Hybrid (DC/RFH) process recipes and/or models. In addition, one or more of the subsystems (110, 120, 140, 150, 160, and 170) can comprise one or more processing tools and/or elements that can be used to perform additional procedures associated with the (DC/RFH) process recipes and/or models.

The system controller 190 can be coupled to the lithography subsystem 110, the exposure subsystem 120, the etch subsystem 130, the deposition subsystem 140, the inspection subsystem 150, the evaluation subsystem 160, and the transfer subsystem 170 using a data transfer subsystem 191. The system controller 190 can be coupled to the MES 180 using a first data transfer subsystem 181. Alternatively, other configurations may be used. For example, the etch subsystem 130, the deposition subsystem 140, a portion of the inspection subsystem 150, a portion of the evaluation subsystem 160, and a portion of the transfer subsystem 170 can be subsystems available from Tokyo Electron Limited.

The lithography subsystem 110 can comprise one or more transfer/storage elements 112, one or more processing elements 113, one or more controllers 114, and one or more evaluation elements 115. One or more of the transfer/storage elements 112 can be coupled to one or more of the processing elements 113 and/or to one or more of the evaluation elements 115 and can be coupled 111 to the transfer subsystem 170. The transfer subsystem 170 can be coupled 111 to the lithography subsystem 110, and one or more substrates 105 can be transferred via coupling 111 between the transfer subsystem 170 and the lithography subsystem 110 in real time. For example, the transfer subsystem 170 can be coupled to one or more of the transfer/storage elements 112, to one or more of the processing elements 113, and/or to one or more of the evaluation elements 115. One or more of the controllers 114 can be coupled to one or more of the transfer/storage elements 112, to one or more of the processing elements 113, and/or to one or more of the evaluation elements 115. Alternatively, the lithography subsystem 110 may be configured differently.

In some embodiments, the lithography subsystem 110 can include a CLEAN TRACK™ LITHIUS Pro™-i/LITHIUS Pro V-i coater/developer that can be configured and optimized for advanced single-patterning or double-patterning technology. The lithography subsystem 110 can perform coating procedures, thermal procedures, measurement procedures, inspection procedures, alignment procedures, and/or storage procedures on one or more substrates. For example, one or more lithography-related processes can be used to deposit one or more masking layers that can include radiation-sensitive material (photoresist) and/or anti-reflective coating (ARC) material, and the lithography subsystem 110 can be used to thermally process (bake) one or more of the masking layers. In addition, lithography subsystem 110 can be used to develop, measure, and/or inspect one or more of the patterned masking layers on one or more of the substrates.

The exposure subsystem 120 can comprise one or more transfer/storage elements 122, one or more processing elements 123, one or more controllers 124, and one or more evaluation elements 125. One or more of the transfer/storage elements 122 can be coupled to one or more of the processing elements 123 and/or to one or more of the evaluation elements 125 and can be coupled 121 to the transfer subsystem 170. The transfer subsystem 170 can be coupled 121 to the exposure subsystem 120, and one or more substrates 105 can be transferred via coupling 121 between the transfer subsystem 170 and the exposure subsystem 120 in real time. For example, the transfer subsystem 170 can be coupled to one or more of the transfer/storage elements 122, to one or more of the processing elements 123, and/or to one or more of the evaluation elements 125. One or more of the controllers 124 can be coupled to one or more of the transfer/storage elements 122, to one or more of the processing elements 123, and/or to one or more of the evaluation elements 125.

In some embodiments, the exposure subsystem 120 can be used to perform wet and/or dry exposure procedures, and in other cases, the exposure subsystem 120 can be used to perform extreme ultraviolet (EUV) exposure procedures or e-beam writing procedures.

The etch subsystem 130 can comprise one or more transfer/storage elements 132, one or more processing elements 133, one or more controllers 134, and one or more evaluation elements 135. One or more of the transfer/storage elements 132 can be coupled to one or more of the processing elements 133 and/or to one or more of the evaluation elements 135 and can be coupled 131 to the transfer subsystem 170. The transfer subsystem 170 can be coupled 131 to the etch subsystem 130, and one or more substrates 105 can be transferred via coupling 131 between the transfer subsystem 170 and the etch subsystem 130 in real time. For example, the transfer subsystem 170 can be coupled to one or more of the transfer/storage elements 132, to one or more of the processing elements 133, and/or to one or more of the evaluation elements 135. One or more of the controllers 134 can be coupled to one or more of the transfer/storage elements 132, to one or more of the processing elements 133, and/or to one or more of the evaluation elements 135. For example, one or more of the processing elements 133 can include (DC/RFH) processing systems that can be used to perform plasma or non-plasma etching, ashing, and/or cleaning procedures, or plasma or non-plasma etching procedures. Evaluation procedures and/or inspection procedures can be used to measure and/or inspect one or more surfaces and/or layers of the substrates.

The deposition subsystem 140 can comprise one or more transfer/storage elements 142, one or more processing elements 143, one or more controllers 144, and one or more evaluation elements 145. One or more of the transfer/storage elements 142 can be coupled to one or more of the processing elements 143 and/or to one or more of the evaluation elements 145 and can be coupled 141 to the transfer subsystem 170. The transfer subsystem 170 can be coupled 141 to the deposition subsystem 140, and one or more substrates 105 can be transferred via coupling 141 between the transfer subsystem 170 and the deposition subsystem 140 in real time. For example, the transfer subsystem 170 can be coupled to one or more of the transfer/storage elements 142, to one or more of the processing elements 143, and/or to one or more of the evaluation elements 145. One or more of the controllers 144 can be coupled to one or more of the transfer/storage elements 142, to one or more of the processing elements 143, and/or to one or more of the evaluation elements 145. For example, one or more of the processing elements 143 can be used to perform physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, and/or plasma enhanced chemical vapor deposition (PECVD) procedures. Evaluation procedures and/or inspection procedures can be used to measure and/or inspect one or more surfaces of the substrates.

The inspection subsystem 150 can comprise one or more transfer/storage elements 152, one or more processing elements 153, one or more controllers 154, and one or more inspection elements 155. One or more of the transfer/storage elements 152 can be coupled to one or more of the processing elements 153 and/or to one or more of the inspection elements 155 and can be coupled 151 to the transfer subsystem 170. The transfer subsystem 170 can be coupled 151 to the inspection subsystem 150, and one or more substrates 105 can be transferred via coupling 151 between the transfer subsystem 170 and the inspection subsystem 150 in real time. For example, the transfer subsystem 170 can be coupled to one or more of the transfer/storage elements 152, to one or more of the processing elements 153, and/or to one or more of the inspection elements 155. One or more of the controllers 154 can be coupled to one or more of the transfer/storage elements 152, to one or more of the processing elements 153, and/or to one or more of the inspection elements 155.

The evaluation subsystem 160 can comprise one or more transfer/storage elements 162, one or more measuring elements 163, one or more controllers 164, and one or more inspection elements 165. One or more of the transfer/storage elements 162 can be coupled to one or more of the measuring elements 163 and/or to one or more of the inspection elements 165 and can be coupled 161 to the transfer subsystem 170. The transfer subsystem 170 can be coupled 161 to the evaluation subsystem 160, and one or more substrates 105 can be transferred via coupling 161 between the transfer subsystem 170 and the evaluation subsystem 160 in real time. For example, the transfer subsystem 170 can be coupled to one or more of the transfer/storage elements 162, to one or more of the measuring elements 163, and/or to one or more of the inspection elements 165. One or more of the controllers 164 can be coupled to one or more of the transfer/storage elements 162, to one or more of the measuring elements 163, and/or to one or more of the inspection elements 165. The evaluation subsystem 160 can comprise one or more measuring elements 163 that can be used to perform real-time optical evaluation procedures that can be used to measure target structures at one or more sites on a substrate using library-based or regression-based techniques. For example, the sites on substrate 105 can include curing-related sites, target sites, overlay sites, alignment sites, measurement sites, verification sites, inspection sites, or damage-assessment sites, or any combination thereof. For example, one or more "golden substrates" or reference chips can be stored and used periodically to verify the performance of one or more of the measuring elements 163, and/or one or more of the inspection elements 165.

In some embodiments, the evaluation subsystem 160 can include integrated Optical Digital Profilometry (iODP) elements (not shown), and iODP elements/systems are available from Timbre Technologies Inc. (a TEL company). Alternatively, other metrology systems and/or inspection systems may be used. For example, iODP techniques can be used to obtain real-time data that can include critical dimension (CD) data, geometric/layer structure data, and thickness data, and the wavelength ranges for the iODP data can range from less than approximately 200 nm to greater than approximately 900 nm. Exemplary iODP elements can include ODP Profiler Library elements, Profiler Application Server (PAS) elements, and ODP Profiler Software elements. The ODP Profiler Library elements can comprise application specific database elements of optical spectra and its corresponding semiconductor profiles, CDs, and film thicknesses. The PAS elements can comprise at least one computer that connects with optical hardware and computer network. The PAS elements can be configured to provide the data communication, ODP library operation, measurement process, results generation, results analysis, and results output. The ODP Profiler Software elements can include the software installed on PAS elements to manage measurement recipe, ODP Profiler library elements, ODP Profiler data, ODP Profiler search/match results, ODP Profiler calculation/analysis results, data communication, and PAS interface to various metrology elements and computer network.

The evaluation subsystem 160 can use polarizing reflectometry, spectroscopic ellipsometry, reflectometry, or other optical measurement techniques to measure accurate device profiles, accurate CDs, and multiple layer film thickness of a substrate. The integrated metrology process (iODP) can be executed as an integrated process in an integrated group of subsystems. In addition, the integrated process eliminates the need to break the substrate for performing the analyses or waiting long periods for data from external systems. iODP techniques can be used with the existing thin film metrology systems for inline profile and CD measurement, and can be integrated with TEL processing systems and/or lithography systems to provide real-time process monitoring and control. Simulated metrology data can be generated by applying Maxwell's equations and using a numerical analysis technique to solve Maxwell's equations.

The transfer subsystem 170 can comprise transfer elements 174 coupled to transfer tracks (175, 176, and 177) that can be used to receive substrates, transfer substrates, align substrates, store substrates, and/or delay substrates. For example, the transfer elements 174 can support two or more substrates. Alternatively, other transferring means may be used. The transfer subsystem 170 can load, transfer, store, and/or unload substrates based on a DC/RFH processing procedure, a DC/RFH-related processing sequence, a transfer sequence, an operational state, the substrate and/or processing states, the processing time, the current time, the substrate data, the number of sites on the substrate, the type of sites on the substrates, the number of required sites, the number of completed sites, the number of remaining sites, or confidence data, or any combination thereof.

In some examples, transfer subsystem 170 can use loading data to determine where and when to transfer a substrate. In other examples, a transfer system can use DC/RFH processing data to determine where and when to transfer a substrate. Alternatively, other procedures may be used. For example, when the first number of substrates is less than or equal to the first number of available processing elements, the first number of substrates can be transferred to the first number of available processing elements in one or more of the subsystems using the transfer subsystem 170. When the first number of substrates is greater than the first number of available processing elements, some of the substrates can be stored and/or delayed using one or more of the transfer/storage elements (112, 122, 132, 142, 152, and 162) and/or the transfer subsystem 170.

In addition, the one or more subsystems (110, 120, 130, 140, 150, 160, and 170) can be used when performing lithography-related procedures, exposure-related procedures, inspection-related procedures, measurement-related procedures, evaluation-related procedures, etch-related procedures, deposition-related procedures, thermal processing procedures, coating-related procedures, alignment-related procedures, polishing-related procedures, storage-related procedures, transfer procedures, cleaning-related procedures, rework-related procedures, oxidation-related procedures, nitridation-related procedures, or external processing elements, or any combination thereof.

Operational state data can be established for the subsystems (110, 120, 130, 140, 150, 160, and 170) and can be used and/or updated by the DC/RFH processing procedures. In addition, operational state data can DC/RFH processing/storage elements (112, 122, 132, 142, 152, and 162), elements (113, 123, 133, 143, 153, and 163), and evaluation elements (115, 125, 135, 145, 155, and 165), and can be updated by DC/RFH processing procedures. For example, the operational state data for the processing elements can include availability data, matching data for the processing elements, expected processing times for some process steps and/or sites, yield data, confidence data and/or risk data for the processing elements, or confidence data and/or risk data for one or more DC/RFH processing procedures. Updated operational states can be obtained by querying in real-time one or more processing elements, and/or one or more subsystems. Updated loading data can be obtained by querying in real-time one or more transfer elements, and/or one or more transfer subsystems.

One or more of the controllers (114, 124, 134, 144, 154, and 164) can be coupled to the system controller 190 and/or to each other using the data transfer subsystem 191. Alternatively, other coupling configurations may be used. The controllers can be coupled in series and/or in parallel and can have one or more input ports and/or one or more output ports. For example, the controllers may include microprocessors having one or more core processing elements.

In addition, subsystems (110, 120, 130, 140, 150, 160, and 170) can be coupled to each other and to other devices using intranet, internet, wired, and/or wireless connections. The controllers (114, 124, 134, 144, and 190) can be coupled to external devices as required.

One or more of the controllers (114, 124, 134, 144, 154, 164, and 190) can be used when performing real-time DC/RFH processing procedures. A controller can receive real-time data from a DC/RFH processing model to update subsystem, processing element, process, recipe, profile, image, pattern, simulation, sequence data, and/or model data. One or more of the controllers (114, 124, 134, 144, 154, 164, and 190) can be used to exchange one or more Semiconductor Equipment Communications Standard (SECS) messages with the Manufacturing Execution Systems (MES) 180 or other systems (not shown), read and/or remove information, feed forward, and/or feedback the information, and/or send information as a SECS message. One or more of the formatted messages can be exchanged between controllers, and the controllers can process messages and extract new data in real-time. When new data is available, the new data can be used in real-time to update a model and/or procedure currently being used for the substrate and/or lot. For example, the current layout can be examined using the updated model and/or procedure when the model and/or procedure can be updated before the current layout is examined. The current layout can be examined using a non-updated model and/or procedure when an update cannot be performed before the current layout is processed. In addition, formatted messages can be used when resists are changed, when resist models are changed, when processing sequences are changed, when design rules are changed, or when layouts are changed.

In some examples, the MES 180 may be configured to monitor some subsystem and/or system processes in real-time, and factory level intervention and/or judgment rules can be used to determine which processes are monitored and which data can be used. For example, factory level intervention and/or judgment rules can be used to determine how to manage the data when a DC/RFH processing error condition occurs. The MES 180 can also provide modeling data, processing sequence data, and/or substrate data.

In addition, controllers (114, 124, 134, 144, 154, 164, and 190) can include memory (not shown) as required. For example, the memory (not shown) can be used for storing information and instructions to be executed by the controllers, and may be used for storing temporary variables or other intermediate information during the execution of instructions by the various computers/processors in the processing system 100. One or more of the controllers (114, 124, 134, 144, 154, 164, and 190), or other system components can comprise the means for reading data and/or instructions from a computer readable medium and can comprise the means for writing data and/or instructions to a computer readable medium.

The processing system 100 can perform a portion of or all of the processing steps of the invention in response to the computers/processors in the processing system executing one or more sequences of one or more instructions contained in a memory and/or received in a message. Such instructions may be received from another computer, a computer readable medium, or a network connection.

In some embodiments, an integrated system can be configured using system components from Tokyo Electron Limited (TEL), and external subsystems and/or tools may be included. For example, measurement elements can be provided that can include a CD-Scanning Electron Microscopy (CDSEM) system, a Transmission Electron Microscopy (TEM) system, a focused ion beam (FIB) system, an Optical Digital Profilometry (ODP) system, an Atomic Force Microscope (AFM) system, or another inspection system. The subsystems and/or processing elements can have different interface requirements, and the controllers can be configured to satisfy these different interface requirements.

One or more of the subsystems (110, 120, 130, 140, 150, 160, and 170) can perform control applications, Graphical User Interface (GUI) applications, and/or database applications. In addition, one or more of the subsystems (110, 120, 130, 140, 150, 160, and 170) and/or controllers (114, 124, 134, 144, 154, 164, and 190) can include Design of Experiment (DOE) applications, Advanced Process Control (APC) applications, Fault Detection and Classification (FDC) applications, and/or Run-to-Run (R2R) applications.

Output data and/or messages from DC/RFH processing procedures can be used in subsequent procedures to optimize the process accuracy and precision. Data can be passed to DC/RFH processing procedures in real-time as real-time variable parameters, overriding current model values, and reducing DOE tables. Real-time data can be used with a library-based system, or regression-based system, or any combination thereof to optimize a DC/RFH processing procedure.

When a library-based process is used, the DC/RFH processing data in the library can be generated and/or enhanced using DC/RFH processing procedures, recipes, profiles, and/or models. For example, the DC/RFH processing data in the library can include simulated and/or measured DC/RFH processing data and corresponding sets of processing sequence data. The library-based processes can be performed in real-time. An alternative procedure for generating DC/RFH processing data for a library can include using a machine learning system (MLS). For example, prior to generating the DC/RFH processing data, the MLS can be trained using known input and output data, and the MLS may be trained with a subset of the DC/RFH processing data.

DC/RFH processing procedures can include intervention and/or judgment rules that can be executed whenever a matching context is encountered. Intervention and/or judgment rules and/or limits can be established based on historical procedures, on the customer's experience, or process knowledge, or obtained from a host computer. Rules can be used in Fault Detection and Classification (FDC) procedures to determine how to respond to alarm conditions, error conditions, fault conditions, and/or warning conditions. The rule-based FDC procedures can prioritize and/or classify faults, predict system performance, predict preventative maintenance schedules, decrease maintenance downtime, and extend the service life of consumable parts in the system. Various actions can take place in response to an alarm/fault, and the actions taken on the alarm/fault can be context-based, and the context data can be specified by a rule, a system/process recipe, a chamber type, identification number, load port number, cassette number, lot number, control job ID, process job ID, slot number, and/or the data type.

Unsuccessful DC/RFH processing procedures can report a failure when one or more limits are exceeded, and successful procedures can create warning messages when limits are being approached. Pre-specified failure actions for procedure errors can be stored in a database, and can be retrieved from the database when an error occurs. For example, DC/RFH processing procedures can reject the data at one or more of the sites for a substrate when a measurement procedure fails.

DC/RFH processing procedures can be used to create, modify, and/or evaluate isolated (widely spaced, or features spaced with no minimum separation dimension) and/or nested (closely spaced, or features spaced with a minimum separation dimension) structures at different times and/or sites. For example, gate stack dimensions and substrate thickness data can be different near isolated and/or nested structures, and gate stack dimensions and substrate thickness data can be different near open areas and/or trench array areas. The features created by the DC/RFH processing procedure can subsequently be used to create optimized features and/or structures for etched isolated and/or nested structures.

Before the DC/RFH processing procedures are performed, one or more curing and/or hardening procedures can be used to reinforce the radiation-sensitive material (photoresist) film, supply optimum polymers, and suppress dissociation of the process gas. Therefore, the surface roughness of the radiation-sensitive material (photoresist) can be decreased. Further, the CD of an opening portion formed in the radiation-sensitive material (photoresist) film can be prevented from expanding, thereby realizing pattern formation with high accuracy. Particularly, these effects are more enhanced by controlling the DC voltage to suitably exercise the three functions described herein, i.e., the sputtering function, plasma optimizing function, and electron supply function.

FIGS. 2A-2D show exemplary block diagrams of etching subsystems in accordance with embodiments of the invention.

In some embodiments, the etching subsystems can include the Tactras™ Vigus™ 300 mm etching systems from Tokyo Electron Limited (TEL). The Tactras™ Vigus™ systems provide excellent performance during high aspect ratio (HAR) etch procedures, high aspect ratio contact (HARC) etch procedures, and advanced damascene integration schemes, and provide higher etch rates and more uniform etch rates, excellent CD control, and high selectivity for newer stop layer films. For example, the Tactras™ Vigus™ 300 mm etching systems can include at least six chambers for maximum productivity and flexibility. In other embodiments, the etching subsystems can include other etching systems from Tokyo Electron Limited (TEL).

Figure 2A:
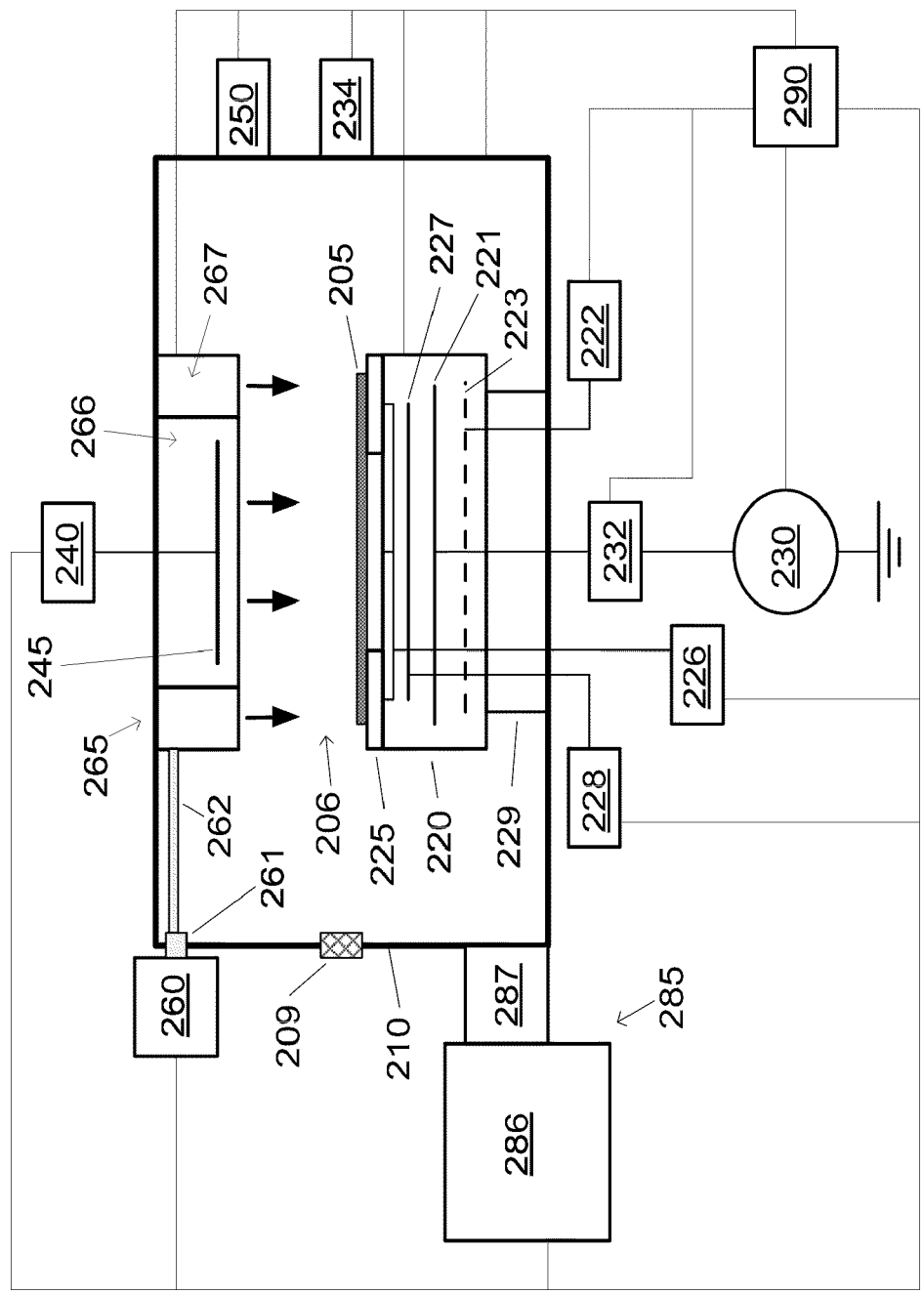

A first exemplary Direct Current (DC) and Radio Frequency (RF) Hybrid processing system 200A is shown in FIG. 2A, and the illustrated DC/RFH processing system 200A includes process chamber 210, substrate holder 220, upon which a substrate 205 to be processed is affixed, Radio Frequency (RF) generator 230, DC supply subsystem 240, gas supply subsystem 260, upper assembly 265, pressure control subsystem 285, and controller 290. For example, substrate holder 220 can be coupled to and insulated from process chamber 210 using base 229. Substrate 205 can be a semiconductor wafer, solar panel, plasma screen, a work piece, or a liquid crystal display (LCD). The upper assembly 265 can include a DC electrode 245 that can be coupled to DC supply subsystem 240, and the DC bias on the DC electrode 245 can vary from about −10 kV to about +10 kV. When the upper assembly 265 includes the DC electrode 245, the DC electrode 245 is isolated from the other elements in the upper assembly 265.

During some DC/RFH procedures, the process chamber 210 can be configured to facilitate the generation of plasma in processing region 206 adjacent a surface of substrate 205, and plasma can be formed via collisions between ballistic electrons (BEs) and an ionizable gas. An ionizable gas or mixture of gases can be introduced to the processing region 206 from the gas injection subsystem 260, and the chamber pressure can be adjusted using the pressure control subsystem 285.

The gas supply subsystem 260 can be coupled to one or more feedthrough elements 261 that can include flow control devices and/or measuring devices, and the feedthrough elements 261 can be coupled to one or more gas supply elements 262. The gas supply elements 262 can be coupled to one or more gas distribution elements (266 and 267) that can include flow control devices and/or measuring devices, and the upper assembly 265 can include one or more central gas flow elements 266 and can include one or more outer gas flow elements 267. For example, the central gas flow elements 266 and the outer gas flow elements 267 can provide the correct mixture of process gases to the processing region 206. In addition, the plasma can be utilized to create materials specific to a predetermined material process, and to aid either the deposition of material to substrate 205 or the removal of material from the exposed surfaces of substrate 205. For example, controller 255 can be used to control vacuum pumping system 286 and gas injection system 260.

Substrate 205 can be transferred into and out of process chamber 210 through a slot valve 209 via robotic transfer system (not shown) where it is received by substrate lift pins (not shown) housed within substrate holder 220 and mechanically translated by devices housed therein. After the substrate 205 is received from transfer system, it can be lowered to an upper surface of substrate holder 220.

The substrate holder can include one or more thermal control elements 223 that can be coupled to one or more thermal control subsystems 222. For example, the thermal control elements 223 can include resistive heating elements and/or thermo-electric heaters/coolers. The substrate holder 220 can include one or more dual (center/edge) backside gas elements 225 that can be coupled to a backside gas supply system 226, and gas can be delivered to the backside of the substrate 205 to improve the gas-gap thermal conductance between substrate 205 and substrate holder 220. The substrate 205 can be affixed to the substrate holder 220 via an electrostatic clamping system 228 and electrostatic clamping electrode 227 configured in the substrate holder 220. A dual (center/edge) backside gas system can be utilized when additional temperature control of the substrate is required at elevated or reduced temperatures. For example, temperature control of the substrate can be useful at temperatures in excess of the steady-state temperature achieved due to a balance of the heat flux delivered to the substrate 205 from the plasma and the heat flux removed from substrate 205 by conduction to the substrate holder 220.

As shown in FIG. 2A, substrate holder 220 can include a lower electrode 221 through which Radio Frequency (RF) power can be coupled to plasma in processing region 206. The RF power can range from about zero watts to about 20,000 watts. For example, lower electrode 221 can be electrically biased at an RF voltage via the transmission of RF power from RF generator 230 through impedance match network 232 to lower electrode 221. The RF bias can serve to heat electrons to form and maintain plasma. A typical frequency for the RF bias can range from 1 MHz to 100 MHz and is preferably 13.56 MHz. In addition, the RF generator 230 can I include additional RF sources that can provide multiple frequencies through impedance match network 232 to lower electrode 221. Furthermore, impedance match network 232 serves to optimize and/or maximize the transfer of RF power to plasma in process chamber 210 by minimizing the reflected power. Various match network topologies and automatic control methods can be utilized.

With continuing reference to FIG. 2A, process gas can be introduced to one or more areas of the processing region 206 from the gas injection subsystem 260 using the central gas flow elements 266 and the outer gas flow elements 267. Alternatively, a different configuration may be used. Process gas can, for example, include a mixture of gases such as argon, Tetrafluoromethane ($CF_4$) and Oxygen ($O_2$), or argon (Ar), $C_4F_8$ and $O_2$ for oxide etch applications, or other chemistries such as, for example, $O_2/CO/Ar/C_4F_8$, $O_2/CO/Ar/C_5F_8$, $O_2/CO/Ar/C_4F_6$, $O_2/Ar/C_4F_6$, $N_2/H_2$, hydrogen bromide (HBr). The feedthrough elements 261, the gas supply elements 262, the central gas flow elements 266, and the outer gas flow elements 267 can be configured to reduce or minimize the introduction of contaminants to substrate 205 and can include filters as required. For example, the central gas flow elements 266, and the outer gas flow elements 267 can provide different flow rates to different regions of the processing region 206 and can provide different process gasses to different regions of the processing region 206. In other embodiments, the plasma species associated with the gas supply system 260 can include Argon (Ar), $CF_4$, $F_2$, $C_4F_8$, CO, $C_5F_8$, $C_4F_6$, $CHF_3$, $N_2/H_2$, or HBr, or any combination of two or more thereof. The central gas flow elements 266 and the outer gas flow elements 267 can provide different flow rates to different regions of the processing region 206, and the flow rates can vary from about zero sccm (standard cubic centimeters per minute) to 1000 sccm.

The pressure control subsystem 285 can include vacuum pumping system 286, such as a turbo-molecular vacuum pump (TMP), capable of a pumping speed up to 5000 liters per second (and greater) and a gate valve 287 for controlling the chamber pressure. In conventional plasma processing devices utilized for dry plasma etch processes, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) may be coupled to the process chamber 210. The pressure-measuring device can be, for example, a Type 628B Baratron absolute capacitance manometer commercially available from MKS Instruments, Inc. (Andover, Mass.).

As depicted in FIG. 2A, the DC/RFH processing system 200A can include one or more sensors 250 coupled to process chamber 210 to obtain performance data, and controller 290 coupled to the sensors 250 to receive performance data. The sensors 250 can include super-Debye trap-period detectors, sub-Debye dump-period detectors, and/or other detectors that can provide Electron Energy Distribution Function (EEDƒ) data. In addition, the sensors 250 can include sensors that provide substrate backside gas pressure data, substrate backside flow data, electrostatic clamping (ESC) voltage data, ESC current data, substrate holder 220 temperature data (or lower electrode (LEL) temperature data), coolant temperature data, upper electrode (UEL) temperature data, forward RF power data, reflected RF power data, RF self-induced DC bias data, RF peak-to-peak voltage data, chamber wall temperature data, process gas flow rate data, process gas partial pressure data, chamber pressure data, matching network data (i.e., C1 and C2 positions), focus ring thickness data, RF hours data, focus ring RF hours data, and DC power data. In addition, the sensors 250 can include one or more optical devices, such as an Optical Emissions Spectroscopy (OES) sensor, for monitoring the light emitted from the plasma in processing region 206. For example, an optical device/sensor can be used as an End Point Detector (EPD) and can provide EPD data. In addition, sensors 250 can include IEA sensors that can be coupled to a chamber wall or the substrate holder 220.

The first DC/RFH processing system 200A can include at least one measurement device 234 that can include a current and/or voltage probes, an oscilloscope, a power meter, a spectrum analyzer, movable Langmuir probes, movable IEA probes/sensors, or a RF Impedance analyzer. For example, the measurement of an electrical signal, such as a time trace of voltage or current, permits the transformation of the signal into frequency domain using discrete Fourier series representation (assuming a periodic signal). Thereafter, the Fourier spectrum (or for a time varying signal, the frequency spectrum) can be monitored and analyzed to characterize the state of a plasma. In addition, the measurement device can include a broadband RF antenna for measuring a radiated RF field external to the process chamber 210, and/or high-speed video cameras for recording real-time plasma conditions.

Controller 290 includes a microprocessor, memory, and a digital I/O port (potentially including D/A and/or A/D converters) capable of generating control voltages sufficient to communicate and activate inputs to DC/RFH processing system 200A as well as monitor outputs from DC/RFH processing system 200A. As shown in FIG. 2A, controller 290 can be coupled to and exchange information with RF generator 230, impedance match network 232, gas injection system 260, vacuum pumping system 286, backside gas supply system 226, temperature control system 228, measurement device 234, electrical measurement device 236, and sensors 250. A program stored in the memory is utilized to interact with the aforementioned components of an etching subsystem 200 according to a stored process recipe.

Figure 2B:
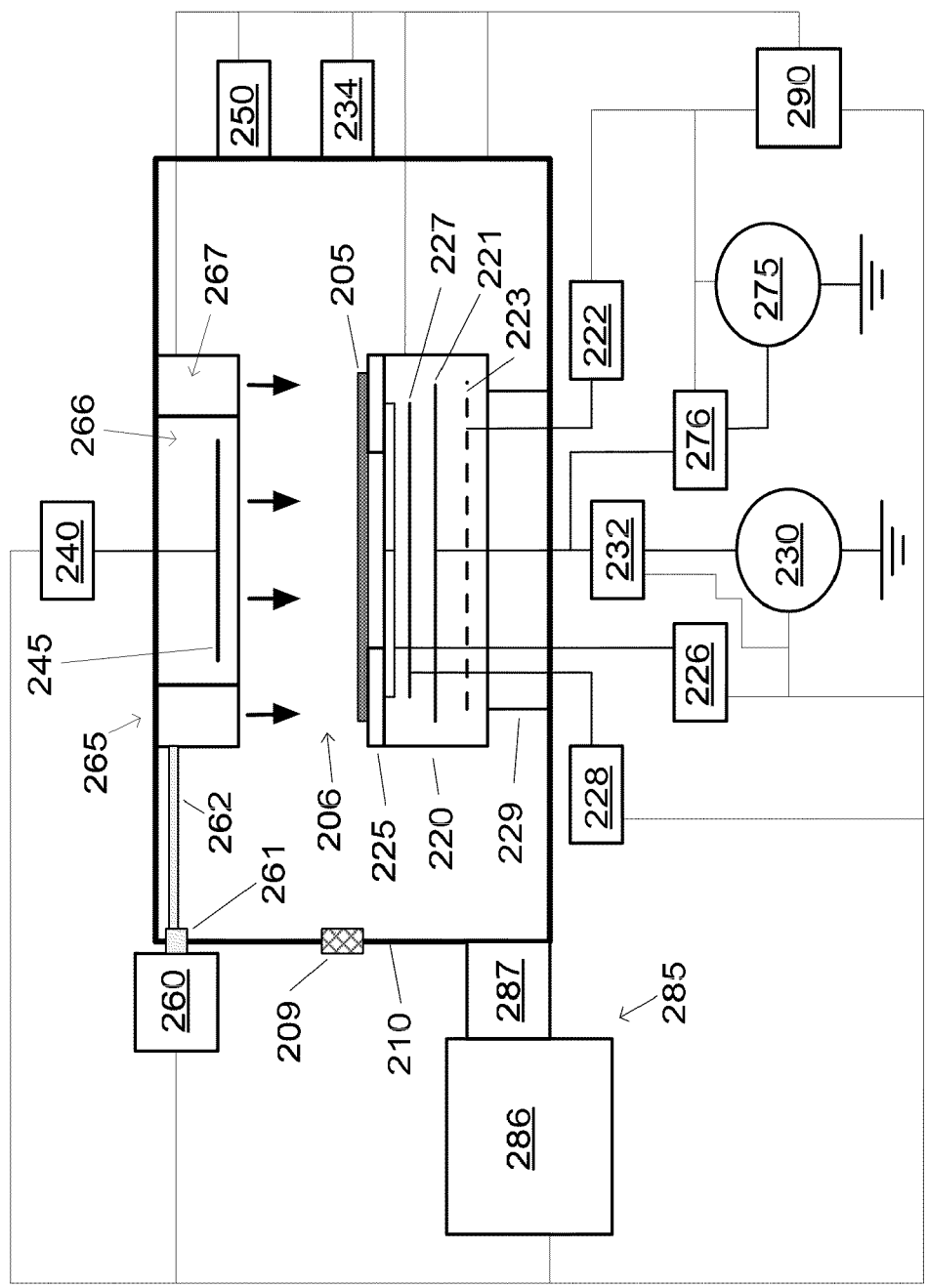

In the second embodiment shown in FIG. 2B, the second DC/RFH processing system 200B can be similar to the first DC/RFH processing system 200A, and can further comprise a second RF source 275 and second match network 276. As shown in FIG. 2B, substrate holder 220 can include a lower electrode 221 through which second RF power can be coupled to plasma in processing region 206. The second RF power can range from about zero watts to about 20,000 watts. For example, lower electrode 221 can be electrically biased at a second RF voltage via the transmission of RF power from the second RF generator 275 through second impedance match network 276 to the lower electrode 221 or to a portion of the lower electrode 221. The second RF voltage can serve to heat ions to form and maintain plasma. A typical frequency for the second RF voltage can range from 1 MHz to 100 MHz and is preferably 13.56 MHz. In addition, the second RF generator 275 can be pulsed, amplitude modulated (AM), and/or frequency modulated (FM). Furthermore, second match network 276 can serve to maximize the transfer of RF power to plasma in process chamber 210 by minimizing the reflected power. Various match network topologies and automatic control methods can be utilized.

Figure 2C:
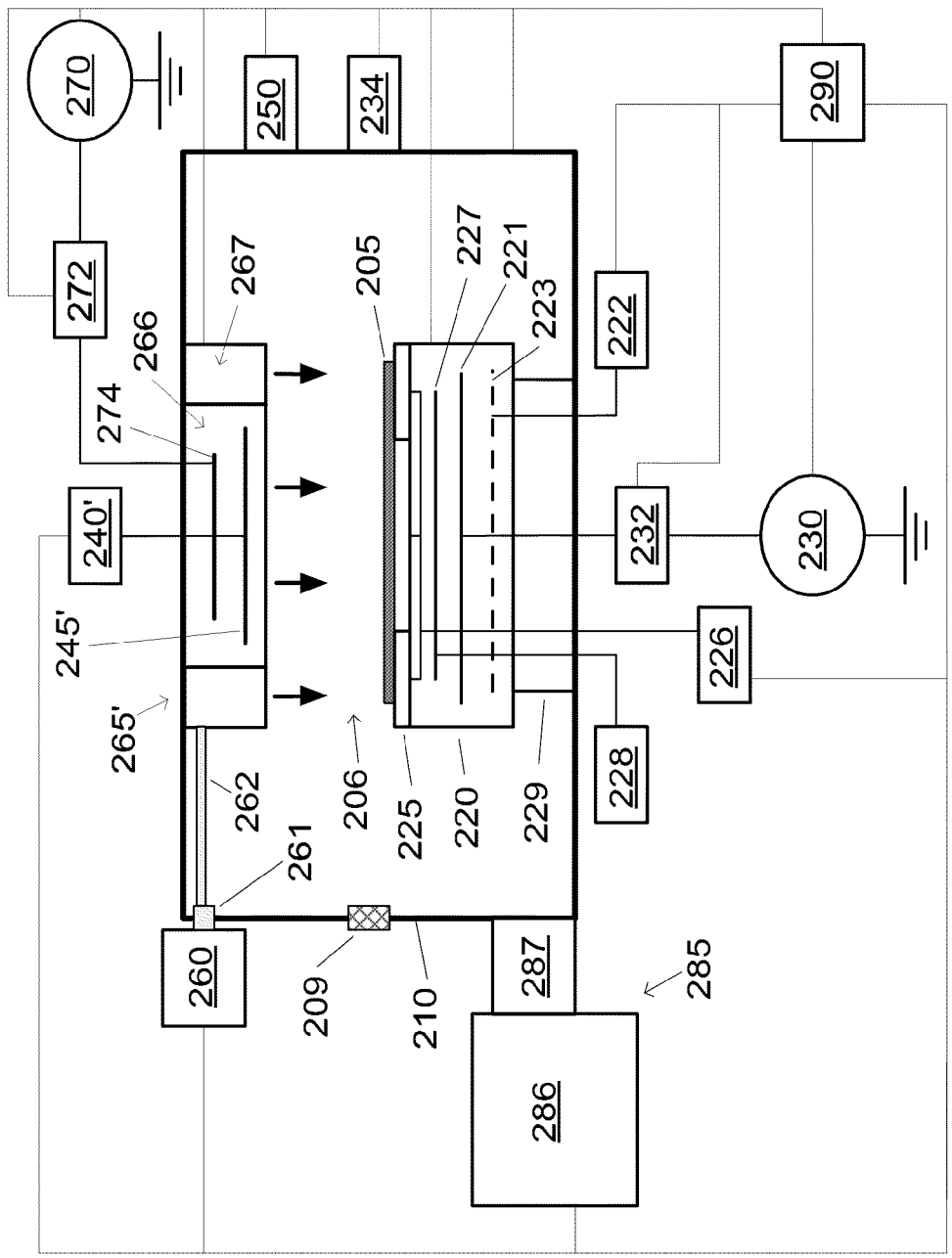

In the third embodiment shown in FIG. 2C, the third DC/RFH processing system 200C can be similar to the first DC/RFH processing system 200A, and can further comprise a second upper assembly 265' that can include another DC electrode 245' that can be coupled to DC supply subsystem 240'. For example, the DC bias on this DC electrode 245' can vary from about −10 kV to about +10 kV. When the second upper assembly 265' includes this DC electrode 245', the DC electrode 245' is isolated from the other elements in the second upper assembly 265'.

In addition, the second upper assembly 265' can include an upper electrode 274 to which second RF power can be coupled from a second RF generator 270 through a second impedance match network 272. The second RF power can range from about zero watts to about 20,000 watts. A second frequency for the application of second RF power to the upper electrode can range from about 0.1 MHz to about 200 MHz, and the first frequency for the application of power to the lower electrode 221 can range from about 0.1 MHz to about 100 MHz. In addition, the second RF generator 272 can include additional RF sources that can provide multiple frequencies through impedance match network 232 to lower electrode 221. Moreover, controller 255 can be coupled to second RF generator 270 and the second impedance match network 272 in order to control the application of the second RF power to upper electrode 274. When the second upper assembly 265' includes the second DC electrode 245', and the upper electrode 274, the second DC electrode 245' and upper electrode 274 are isolated from each other and the other elements in the second upper assembly 265'. The second upper assembly 265' can include one or more of the gas distribution elements (266 and 267). For example, the second DC electrode, the upper electrode 274, and the gas distribution elements (266 and 267) can be isolated from each other as shown.

In the fourth embodiment shown in FIG. 2D, the fourth DC/RFH processing system 200D can be similar to the first DC/RFH processing system 200A, and can further comprise a third upper assembly 265" that can include another DC electrode 245" that can be coupled to the third DC supply subsystem 240". For example, the DC bias on this DC electrode 245" can vary from about −10 kV to about +10 kV. When the third upper assembly 265" includes this DC electrode 245", the DC electrode 245" is isolated from the other elements in the third upper assembly 265".

In addition, the third upper assembly 265" can include a split upper electrode (274a and 274b) to which third RF power can be coupled from a third RF generator 270 through a third impedance match network 272 and an RF power splitter 273. A third frequency for the application of third RF power to the split upper electrode (274a and 274b) can range from about 0.1 MHz to about 200 MHz, and the first frequency for the application of power to the lower electrode 221 can range from about 0.1 MHz to about 100 MHz. In addition, the third RF generator 270 can include additional RF sources that can provide different frequencies through impedance match network 232 to lower electrode 221. Moreover, controller 290 can be coupled to third RF generator 270, the third impedance match network 272 and the RF power splitter 273 in order to control the application of the third RF power to the split upper electrode (274a and 274b). When the third upper assembly 265" includes the third DC electrode 245", and the third RF power to the split upper electrode (274a and 274b), the third DC electrode 245", and the split upper electrode (274a and 274b) are isolated from each other and the other elements in the third upper assembly 265". The third upper assembly 265" can include one or more of the gas distribution elements (266 and 267). For example, the second DC electrode, the split upper electrode (274a and 274b) and the gas distribution elements (266 and 267) can be isolated from each other as shown. The third RF power can range from about zero watts to about 20,000 watts.

In addition, the substrate holder 220 can be configured to position a substrate 205 at a floating potential in the process chamber 210 during processing. Alternatively, the DC/RF hybrid processing system can include an inductively coupled plasma (ICP) source, a transformer coupled plasma (TCP) source, a capacitively coupled plasma (CCP) source, an electron cyclotron resonance (ECR) source, a helicon wave source, a surface wave plasma source, a surface wave plasma source having a slotted plane antenna, etc.

When a process gas includes at least one fluorocarbon gas and at least one inert gas, a first fluorocarbon gas flow rate varying between approximately 10 sccm and approximately 50 sccm and a first inert gas flow rate varying between approximately 3 sccm and approximately 20 sccm, and the fluorocarbon gas comprises $C_4F_6$, $C_4F_8$, $C_5F_8$, $CHF_3$, or $CF_4$, or any combination thereof, and the inert gas comprises Argon (Ar), Helium (He), Krypton (Kr), Neon (Ne), Radon (Rn), or Xenon (Xe), or any combination thereof. When the process gas includes CO, the CO flow rate can vary between approximately 2 sccm and approximately 20 sccm.

Controller 290 can include one or more microprocessors, one or more memory elements, and one or more analog and/or digital I/O devices (potentially including D/A and/or A/D converters) capable of generating control voltages sufficient to communicate and activate inputs to the DC/RFH processing systems (200A-200B). One or more programs stored in the memory can be utilized to interact with the aforementioned components of the DC/RFH processing systems (200A-200B) according to stored process recipes.

The controllers 290 may be implemented as a general-purpose computer system that performs a portion or all of the microprocessor based processing steps of the invention in response to a controller/processor executing one or more sequences of one or more instructions contained in a memory. Such instructions may be read into the controller memory from another computer readable medium, such as a hard disk or a removable media drive. One or more processors in a multi-processing arrangement may also be employed as the control microprocessor to execute the sequences of instructions contained in main memory. In alternative embodiments, hard-wired circuitry may be used in place of or in combination with software instructions. Thus, embodiments are not limited to any specific combination of hardware circuitry and software.

When an etching process is performed by one of the DC/RFH processing systems (200A-200B), the slot valve 209 can be opened, and a substrate 205 can be transferred into the process chamber 210 and placed on the substrate holder 220. The gas supply subsystem 260 can provide a first plasma species and the process chamber 210 can be configured to use a first plasma species to facilitate the generation of etching plasma in the processing region 206 adjacent a surface of the substrate 205. The plasma species can include a fluorocarbon element ($C_xF_y$), such as $C_4F_8$, and may contain another component, such as Ar, or CO. The flow rate for the first plasma species (ions) and/or electrons can be established using the etching recipe. In addition, the pressure inside the process chamber 210 can range from about 1 mtorr (millitorr) to about 1200 mtorr. In other examples, the pressure inside process chamber 210 can range from about 10 mtorr to about 150 mtorr.

Figures 3A, 3B:
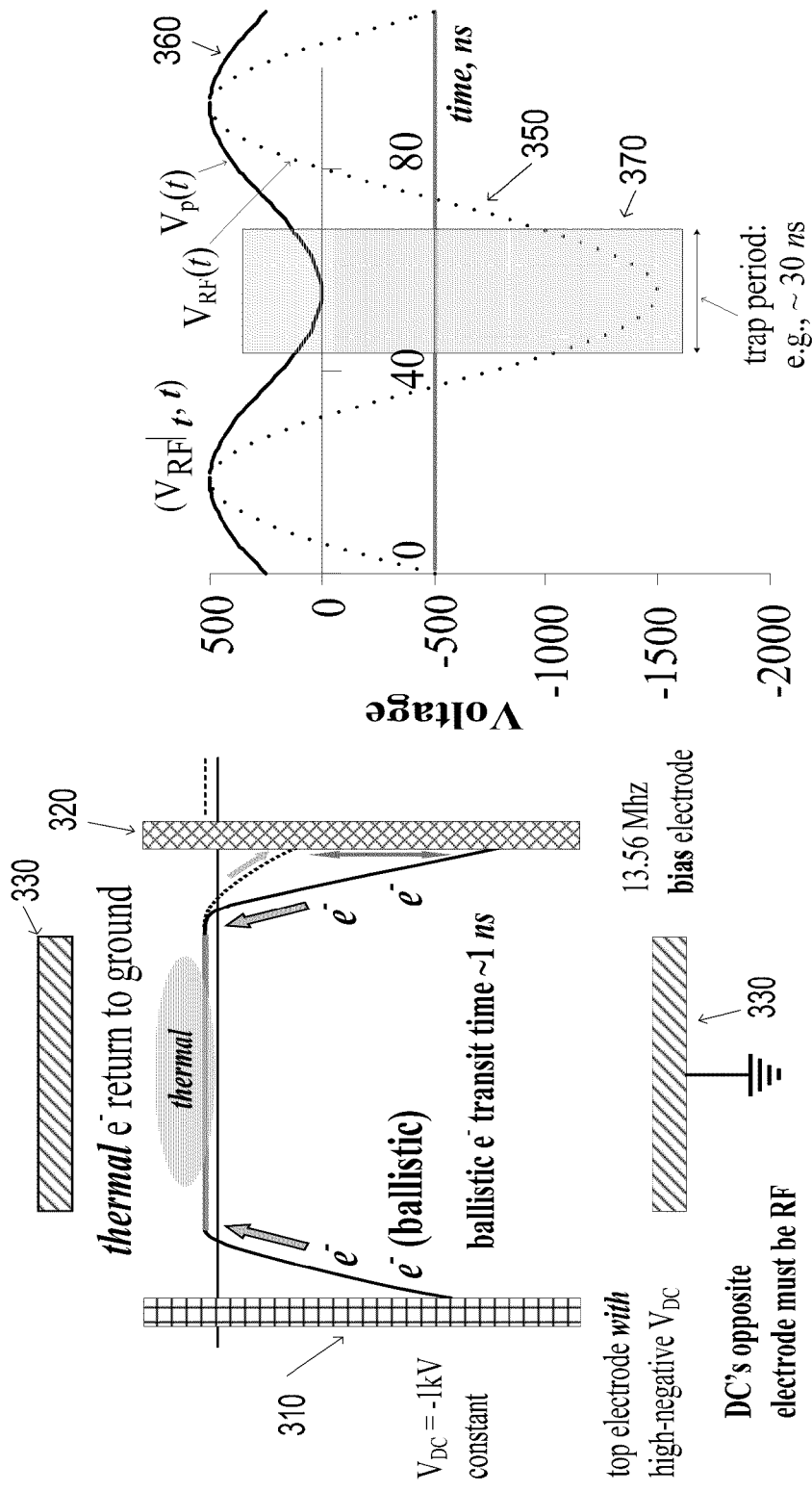
FIGS. 3A-3C illustrate exemplary DC/RFH processing system data in accordance with embodiments of the invention.

FIGS. 3A and 3B illustrate exemplary DC/RFH processing system data in accordance with embodiments of the invention. The DC/RFH processing system data can include qualitative electron motion data for an e⁻ beam (electron beam) plasma. A 13.56 MHz bias example is shown in which the DC voltage can be about −500 volts; the RF peak-to-peak voltage can be about 2 kV; the RF power can be about 1 kW; and the trap period can be about 30 ns.

FIG. 3A illustrates a spatial snapshot of an exemplary DC/RFH process chamber having a DC electrode 310, an RF electrode 320, and a plurality of ground elements 330. The DC electrode 310 can be a top electrode with a high negative $V_{DC}$ (−1 kV) imposed thereon; the RF electrode 320 can have an RF bias (13.56 MHz) imposed thereon; the thermal electrons can return to one of the ground elements 330; and the ballistic electrons e⁻ (BEs) can have a transit time in the DC/RFH process chamber of about 1 ns. In the DC/RFH process chamber, the DC electrode 310 must be located opposing the RF electrode 320.

FIG. 3B illustrates temporal snapshot that can include a graph of voltage versus time having a first RF voltage 350 and a first peak voltage 360 shown thereon. In addition, an exemplary trap period 370 is also shown, and the length of the trap period 370 can be about 30 ns. For example, $V_{RF}(t)$ can be the voltage (1000V) applied to the RF electrode 320 at 13.56 MHz, and $V_{pp}$ can be the peak-to-peak RF voltage (2 kV) on the bias substrate.

Figure 3C:
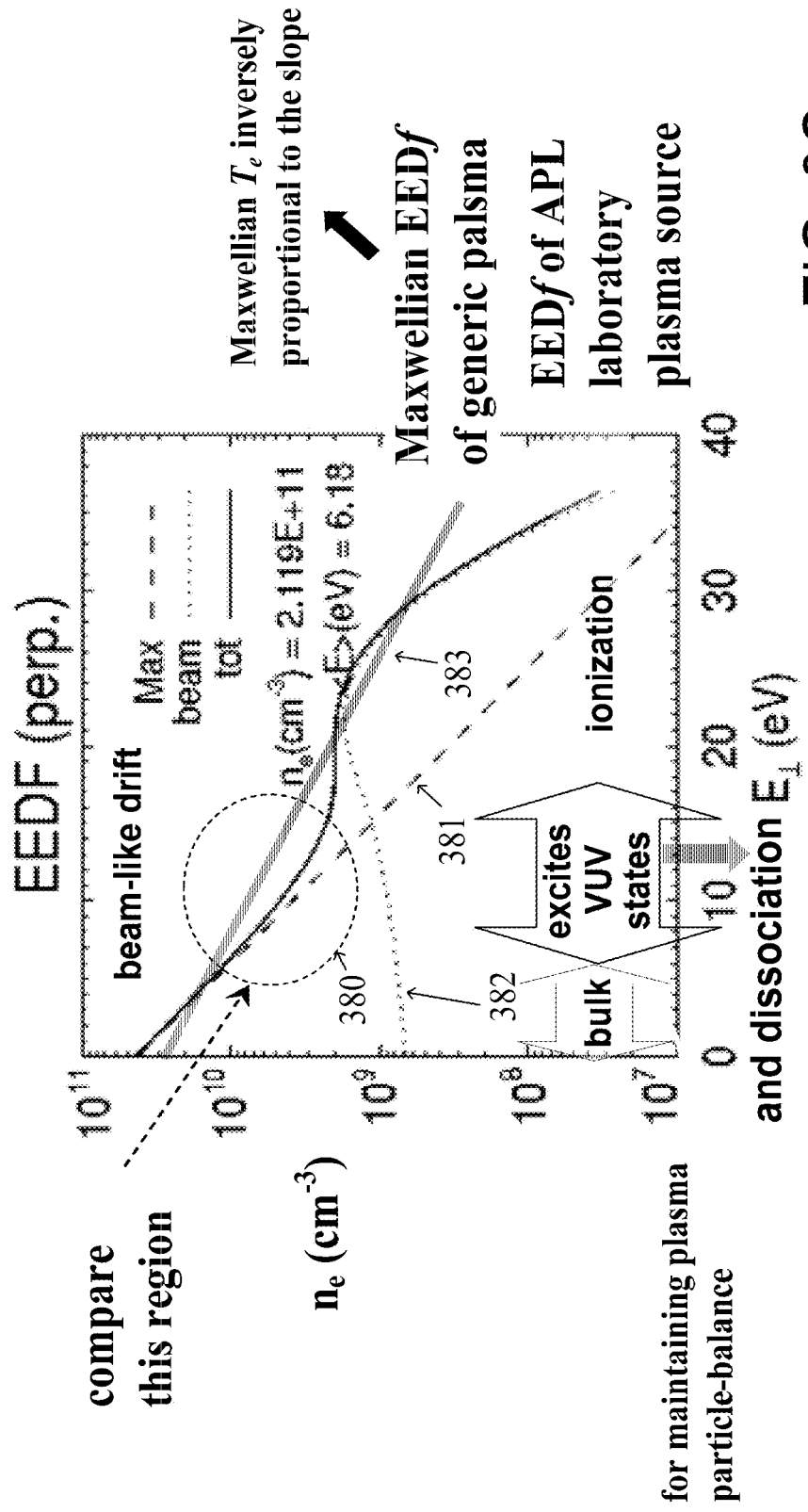

FIG. 3C illustrates an exemplary method of controlling the plasma EEDƒ to control the plasma chemistry; i.e., one objective is to control the EEDƒ in such a way that electron population in the energy range of −6 eV to 17 eV be "minimized". This method can require optimization and can depend on the molecular species. This is because the electrons in this energy range can dissociate molecules, producing F, O, etc. and producing vacuum ultraviolet (VUV) radiation. In addition, for different molecules, the range is slightly different, and the range from about 0.6 eV to about 17 eV can be a first example. A first graph 381 is shown for a Maxwellian component, a second graph 382 is shown for a beam component, a third graph 383 is shown for the total component, and a comparison region 380 is shown.

Figure 4A:
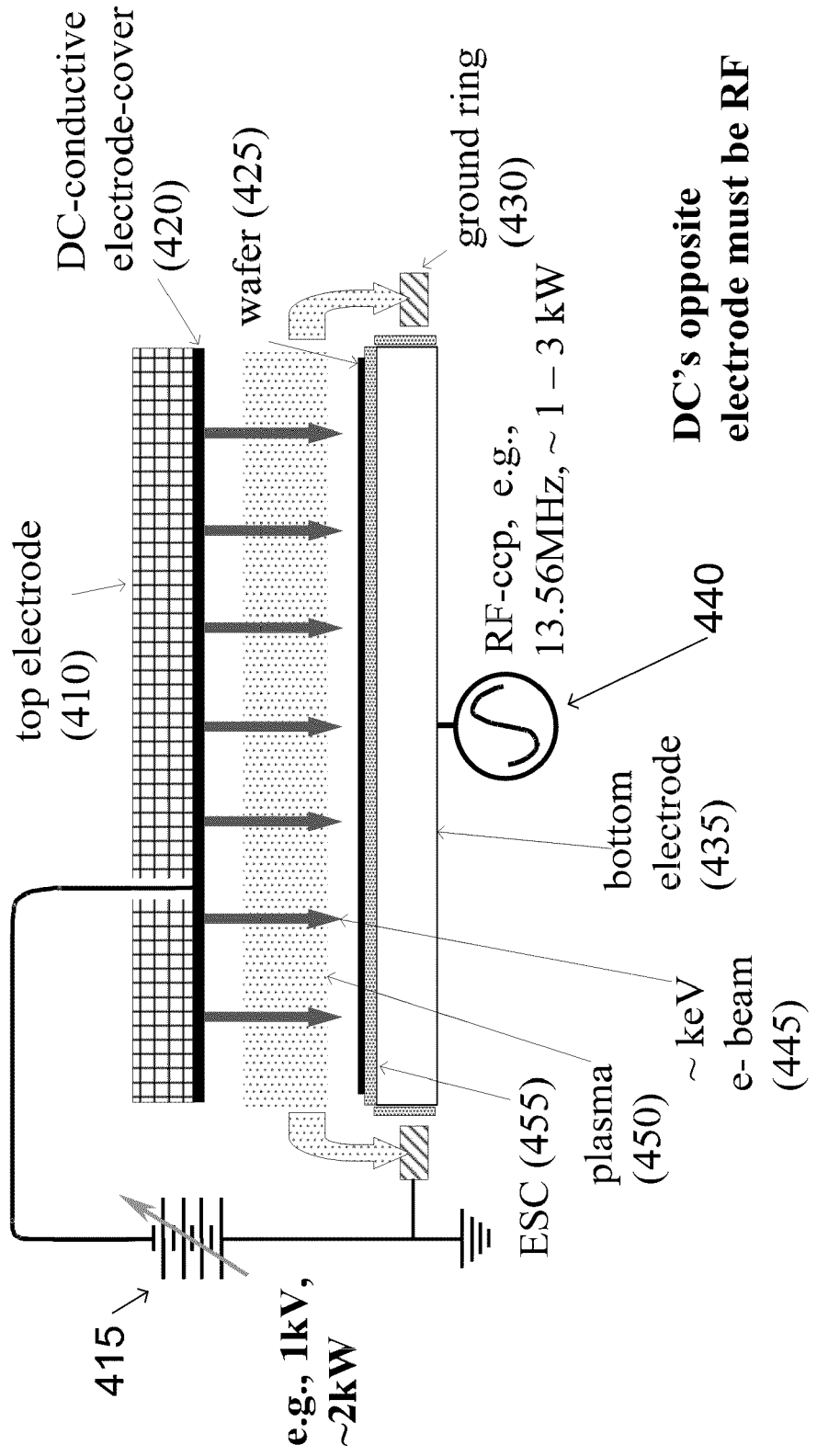
FIGS. 4A and 4B illustrate exemplary DC/RFH processing system data in accordance with embodiments of the invention.
Figure 4B:
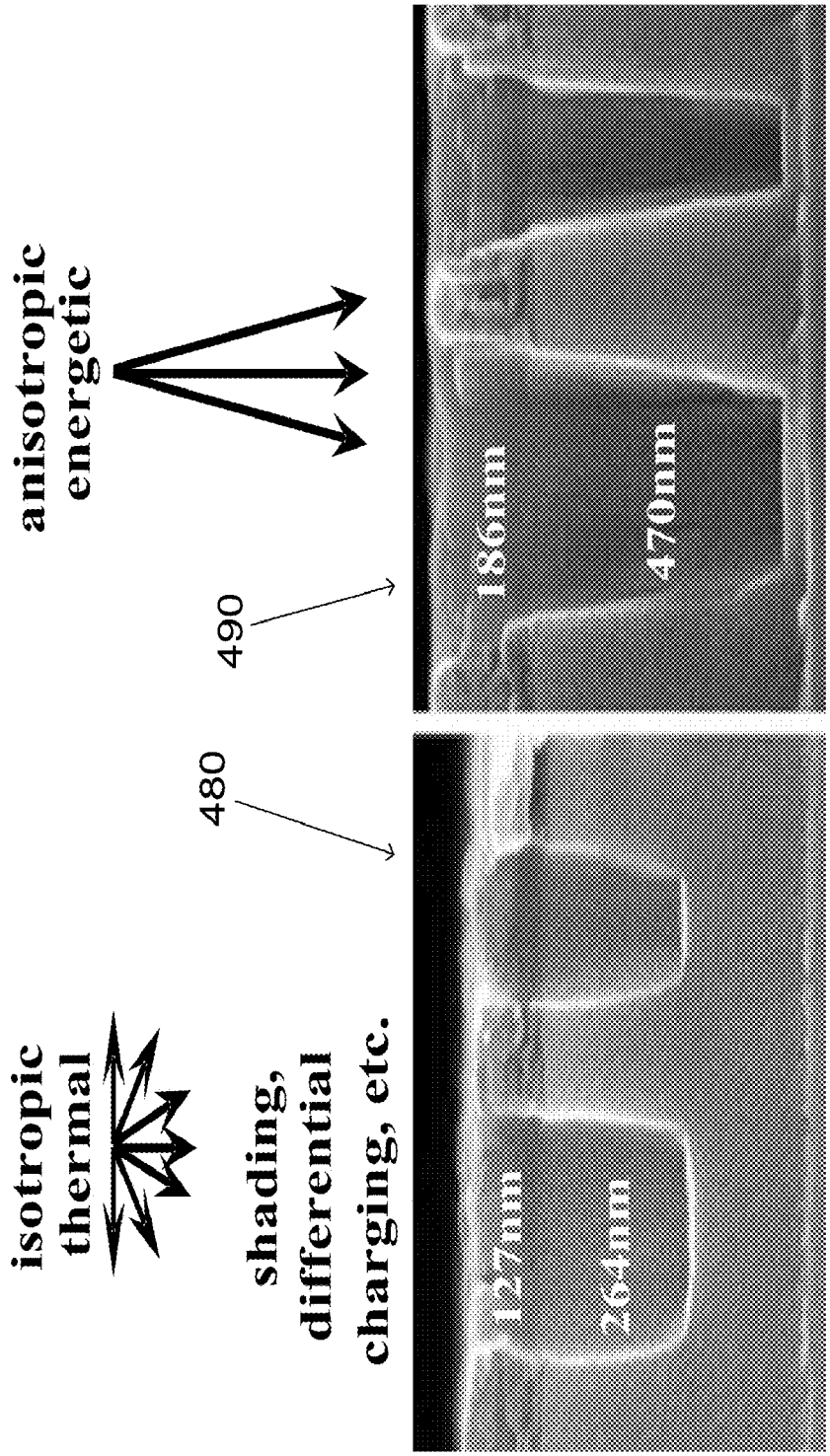

FIGS. 4A and 4B illustrate exemplary DC/RFH processing system data in accordance with embodiments of the invention. The DC/RFH processing system data can include a 13.56 MHz bias example in which the DC voltage can be about −1000 volts (about 2 kW); and the RF power can be vary from about 1 kW to about 3 kW.

FIG. 4A illustrates another exemplary DC/RFH process chamber having a top DC electrode 410, a variable DC source 415, a DC-conductive electrode cover 420, a ground ring 430, a bottom RF electrode 435, and a RF source 440. The DC electrode 410 can be coupled to the variable DC source 415 (−1 kV); the bottom RF electrode 435 can be coupled to the RF source 440 (13.56 Mhz, 1-3 kW); the ballistic electrons e⁻ (BEs) 445 can interact with the bulk plasma 450 in a positive manner to control the EEDƒ, the (BEs) can impact the sheath thereby increasing the etch rate; and the energetic electrons can impact on the substrate surface to improve the selectivity. The BEs can interact with the bulk plasma, the $n_e$ (electron density) value and the process chemistry ($CF_x/F$) can be can be used to control the EEDƒ, the BEs can have an impact on the plasma sheath and can increase the etch rate; and the energetic electrons can affect the wafer surfaces. In addition, there can be some electron stimulated surface chemistry; e.g., 193 nm-PR (photoresist) hardening, enhanced polymer mixing layer, and better selectivity.

FIG. 4B illustrates exemplary first process results 480 for a process without a DC source and second process results 490 for a process with a DC source. The critical dimensions (CDs) associated with the first process results 480 (incomplete etch) can vary from about 127 nm to about 264 nm; and the CDs associated with the second process results 480 (complete etch) can vary from about 186 nm to about 470 nm.

Figure 5A:
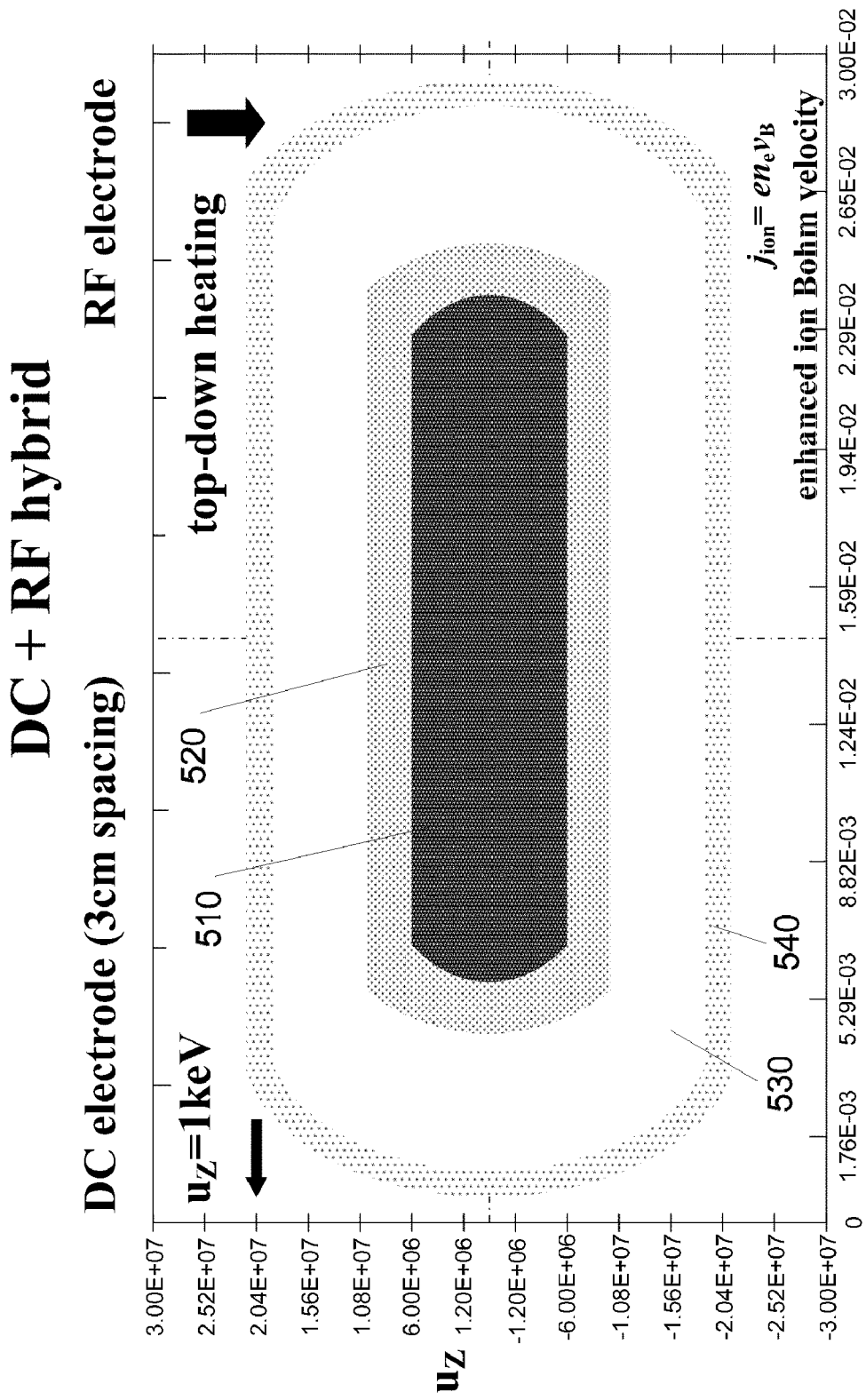
FIGS. 5A and 5B illustrate exemplary simulation data for the DC/RFH processing system in accordance with embodiments of the invention.
Figure 5B:
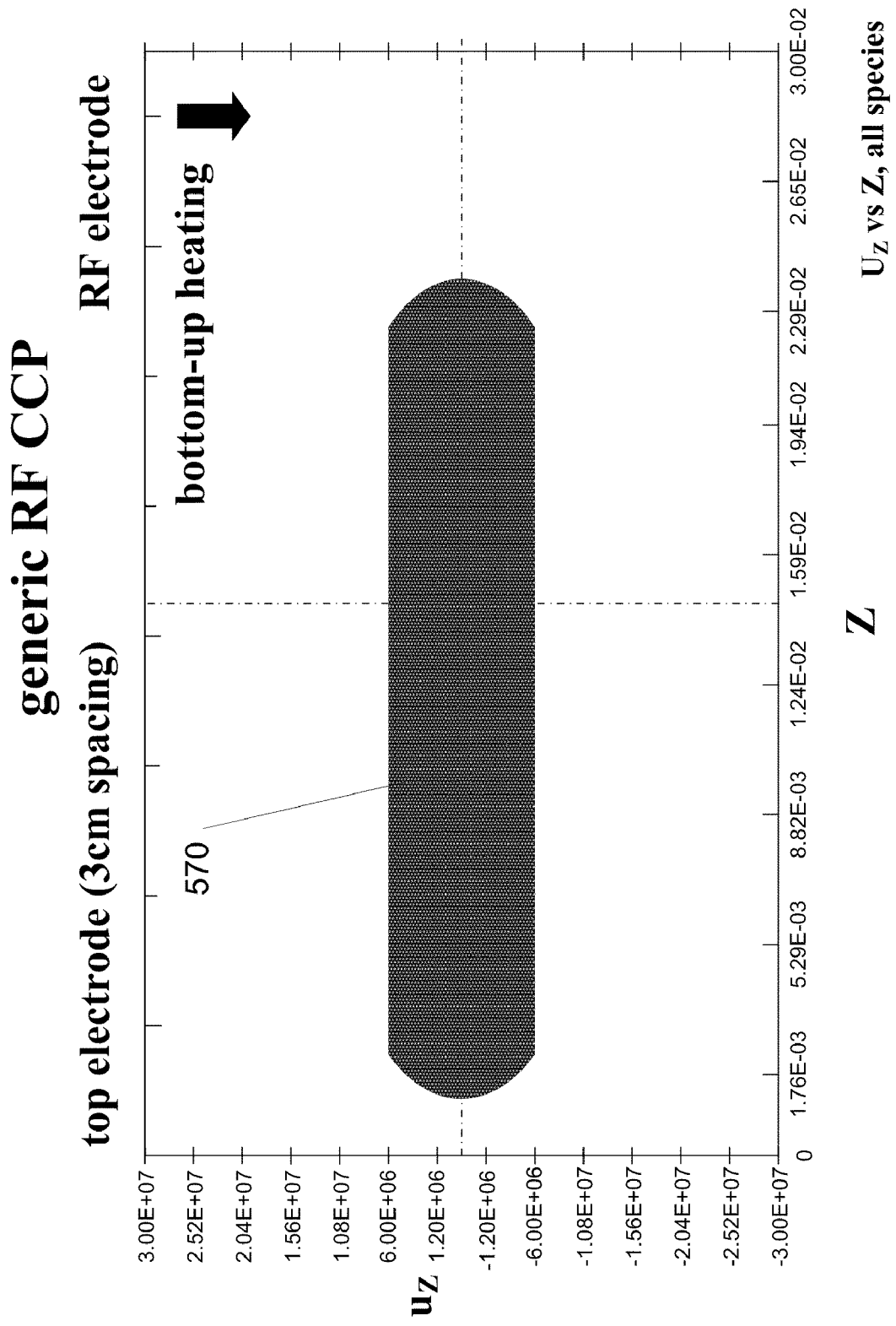

FIGS. 5A and 5B illustrate exemplary simulation data for the DC/RFH processing system in accordance with embodiments of the invention. The simulation data can include $U_Z$ (electron velocity in the z-direction) versus Z data for all species. FIG. 5A illustrates a substantially uniform graph for a DC/RFH processing system having a first very dense region 510, a second dense region 520, a third substantially clean region 530, and another less dense region 540. FIG. 5B illustrates a non-uniform graph for a generic RF system having a very dense non-uniform region 570.

Figure 6:
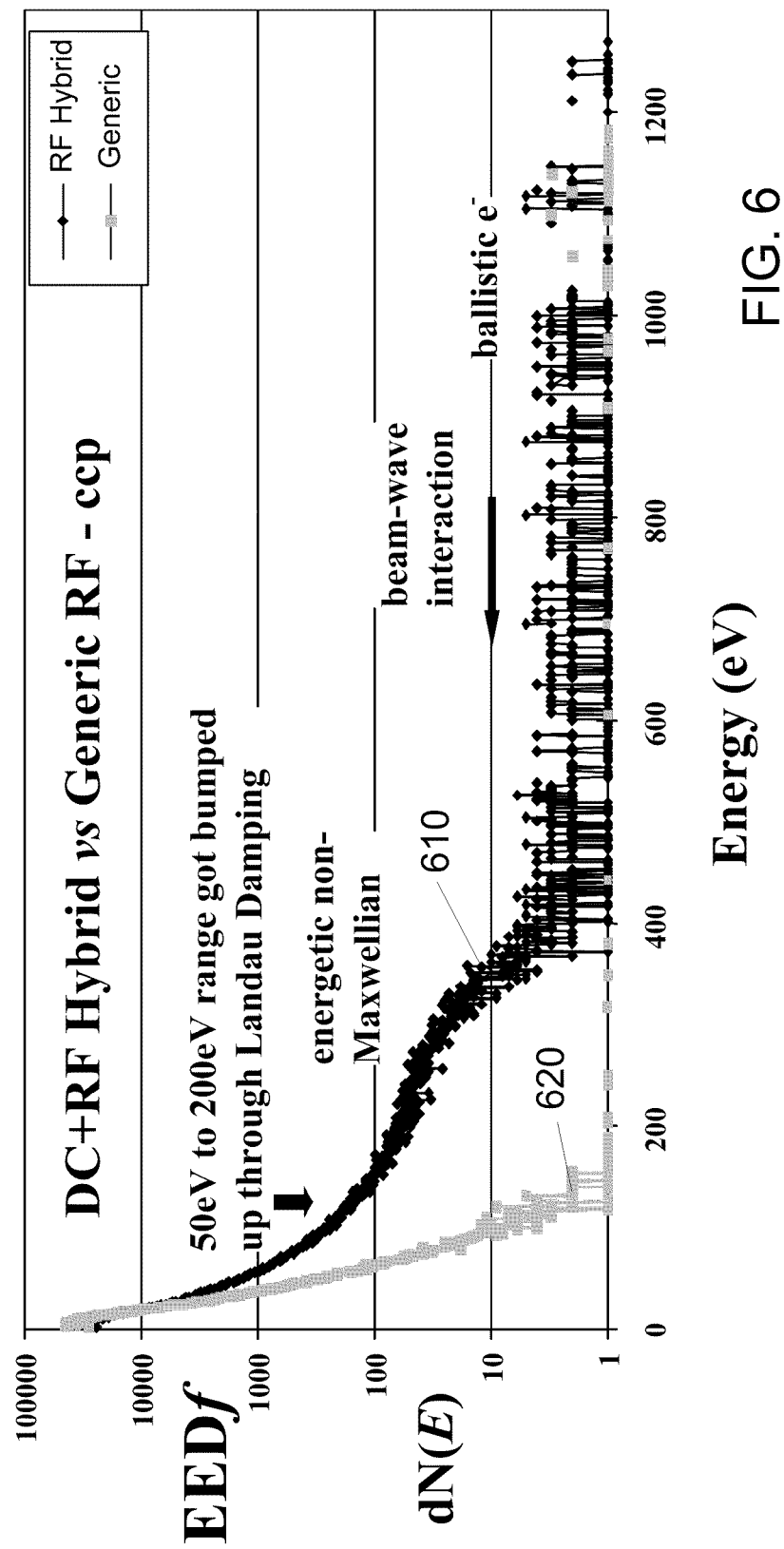
FIG. 6 illustrates exemplary process data for the DC/RFH processing system and a generic RF system in accordance with embodiments of the invention.

FIG. 6 illustrates exemplary process data for the DC/RFH processing system and a generic RF system in accordance with embodiments of the invention. The first process data 610 includes EEDƒ data for the DC/RFH processing system, and the second process data 620 includes EEDƒ data for a generic RF system. The first process data 610 includes an energetic non-Maxwellian region, a beam-wave interaction region, and a BE region. The energetic non-Maxwellian region can include a 50 eV to 200 eV range that is "bumped up" through Landau damping.

Figure 7:
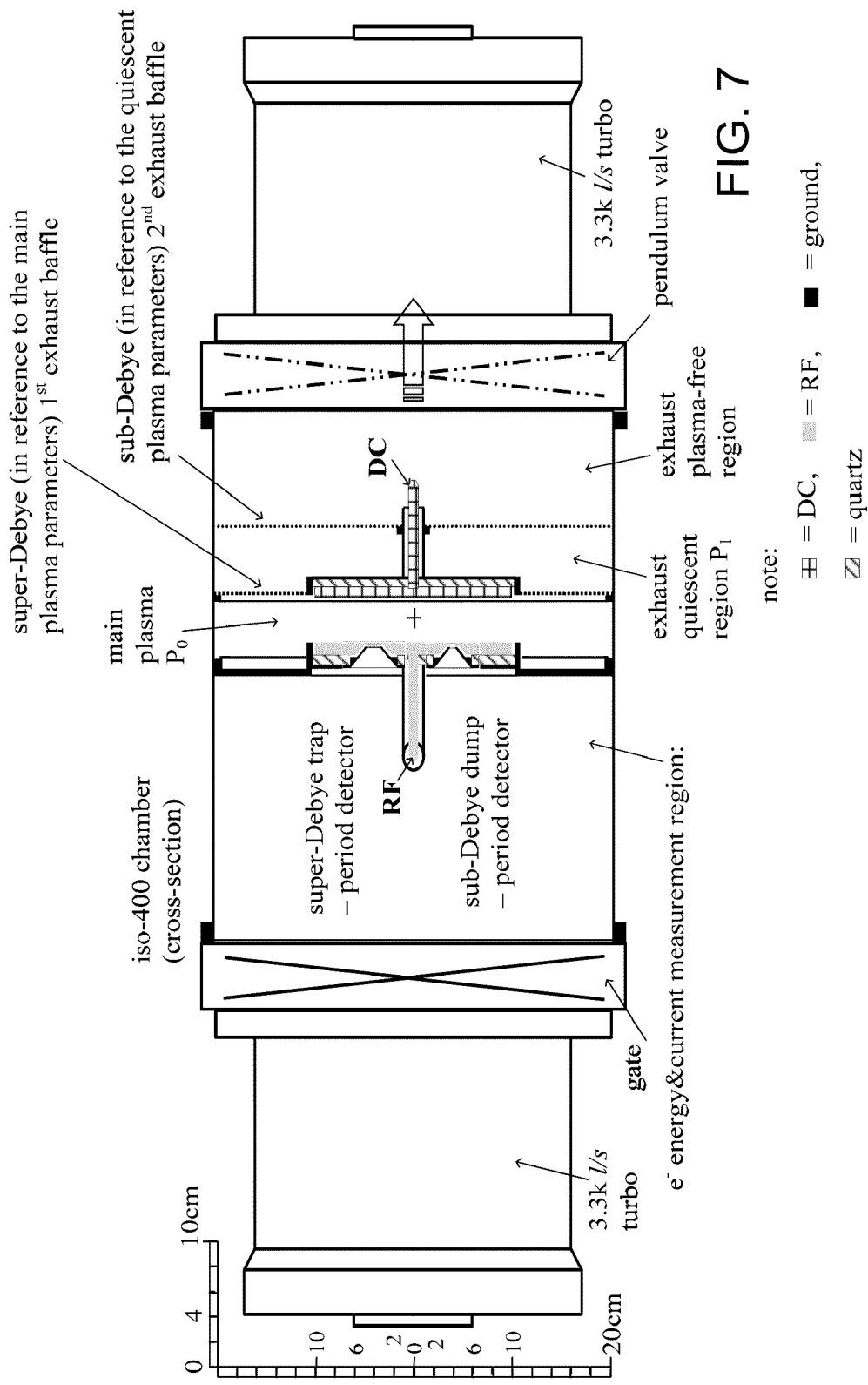
FIG. 7 illustrates an exemplary setup for experimental procedures for a DC/RFH processing system in accordance with embodiments of the invention.

FIG. 7 illustrates an exemplary setup for experimental procedures for a DC/RFH processing system in accordance with embodiments of the invention. The experimental setup can include a main plasma region surrounded by an RF electrode and a DC electrode. A measurement region can be configured outside of the RF electrode, and the measurement region can include a super-Debye trap-period detector and a sub-Debye dump-period detector. For example, a first turbo pump can be coupled to the measurement region through a gate valve, and can control the pressure in the measurement region. A first exhaust baffle can be configured to establish a plasma-free exhaust region. For example, a second turbo pump can be coupled to the plasma-free exhaust region through a pendulum valve, and can control the pressure in the plasma-free exhaust region.

Figure 8:
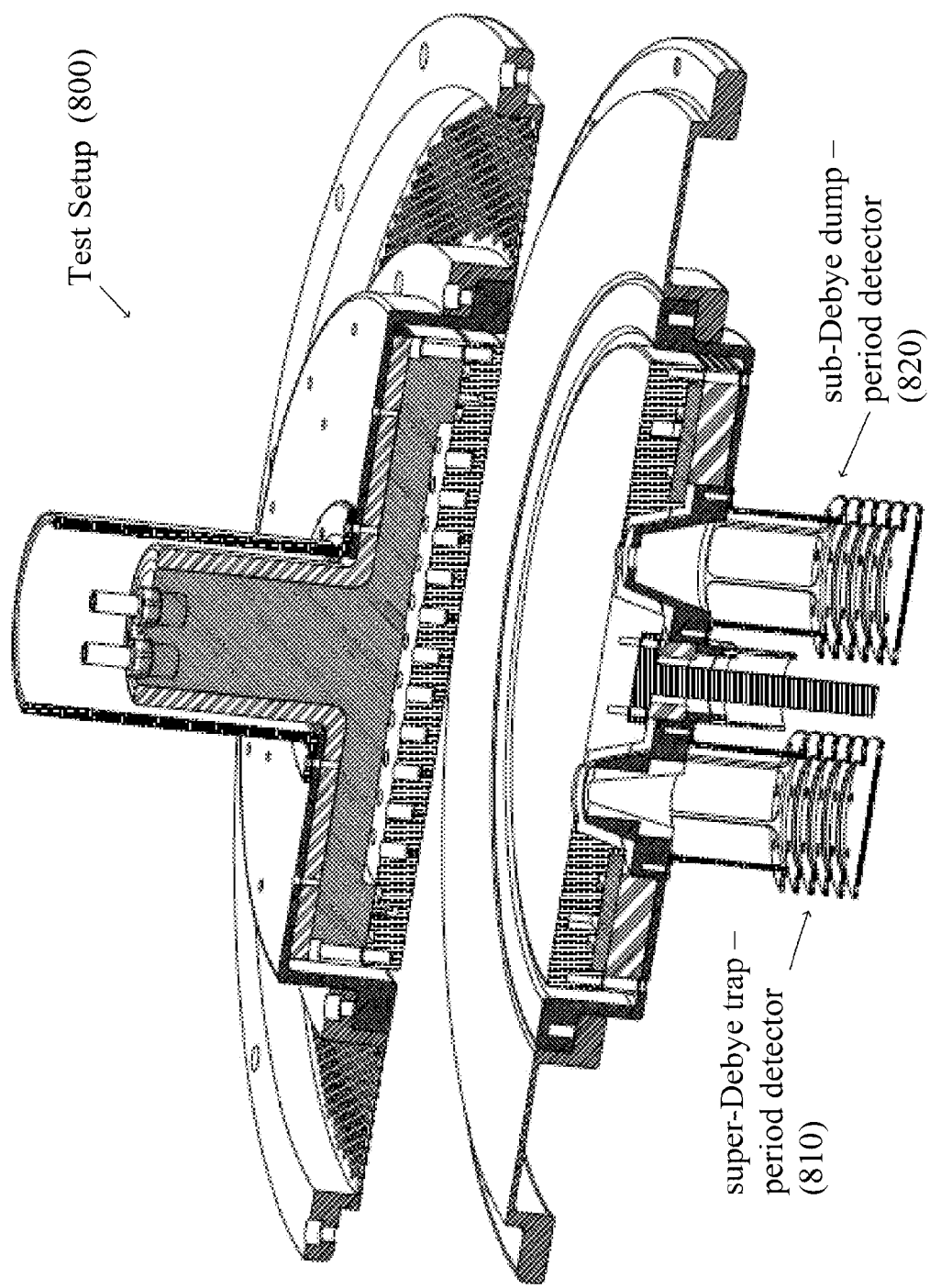
FIG. 8 illustrates an exploded view of an exemplary test structure for an experimental DC/RFH processing system in accordance with embodiments of the invention.

FIG. 8 illustrates an exploded view of an exemplary test structure for an experimental DC/RFH processing system in accordance with embodiments of the invention. The test structure 800 can include a plurality of super-Debye trap-period detectors 810 and a plurality of sub-Debye dump-period detectors 820. In some examples, one or more of the test structures 800 can be positioned at the bottom and/or side of the process chamber (210, FIGS. 2A-2B)

Figure 9:
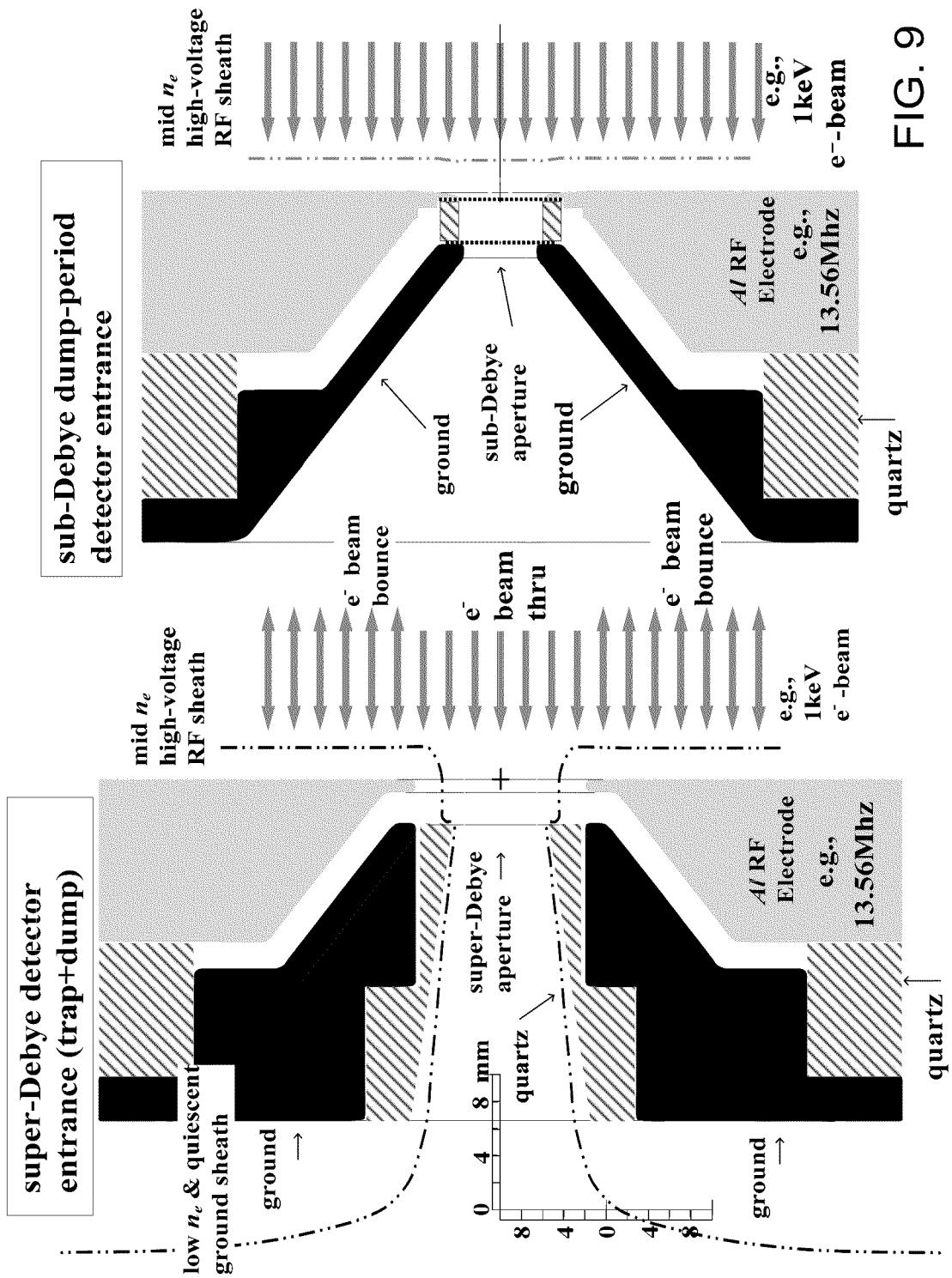
FIG. 9 illustrates exemplary detectors for the DC/RFH processing system in accordance with embodiments of the invention.

FIG. 9 illustrates exemplary detectors for the DC/RFH processing system in accordance with embodiments of the invention. FIG. 9 can include a super-Debye trap-period detector and a sub-Debye dump-period detector. A super-Debye detector can measure the anisotropic electrons of the bulk plasma at all times (during both trap and dump periods). The sub-Debye detector can only measure anisotropic electrons during the ~30 to 40 ns dump-period when $|V_{RF}|$<800V, and the sub-Debye detector can measure time-resolved energetic electron flux $|V_{RF}|$ dumped to the RF electrode.

Figure 10:
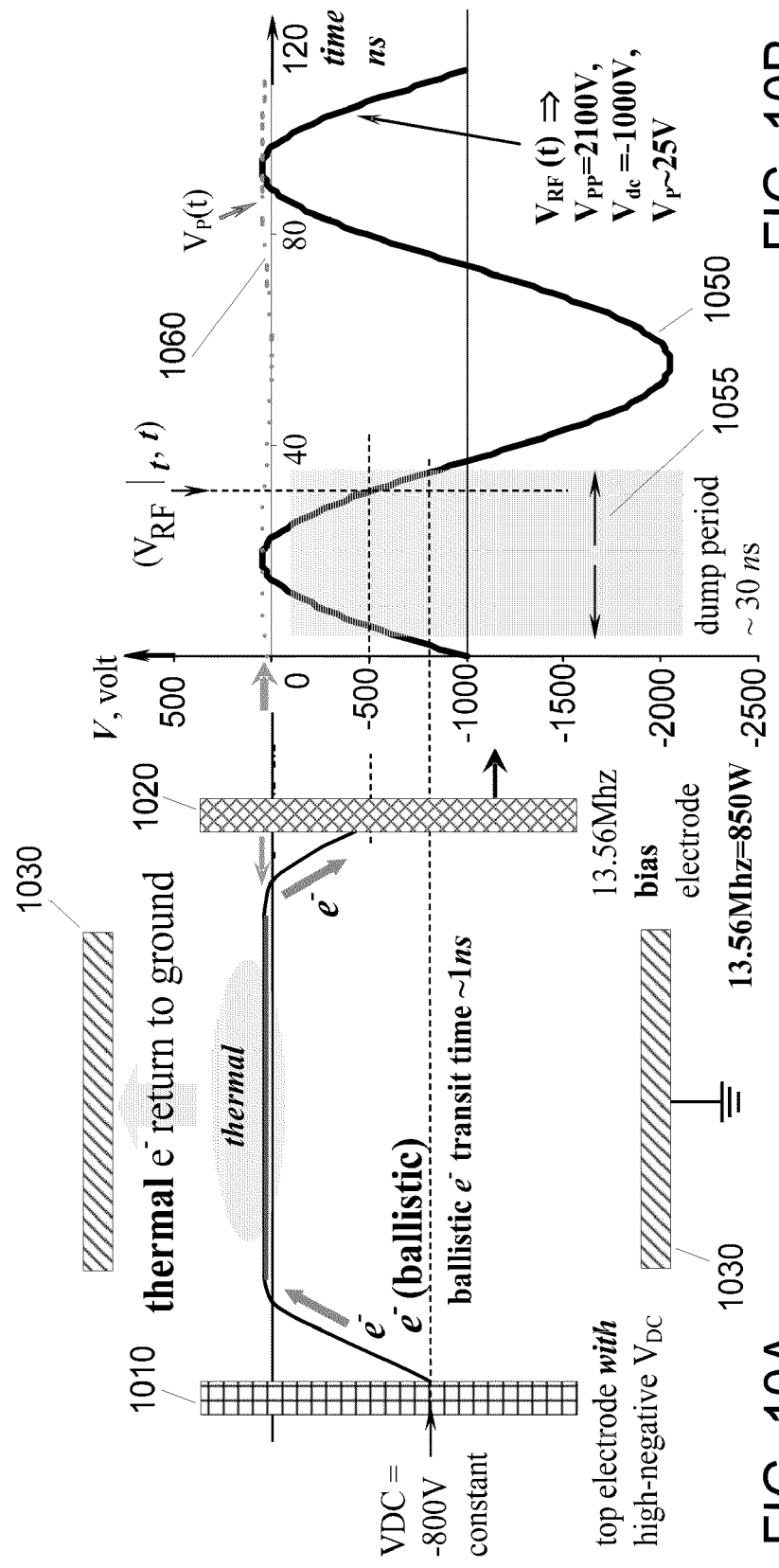
FIGS. 10A and 10B illustrate exemplary sub-Debye dump-period data in accordance with embodiments of the invention.

FIGS. 10A and 10B illustrate exemplary sub-Debye dump-period data in accordance with embodiments of the invention. The DC/RFH processing system data can include a 13.56 MHz bias example in which the DC voltage can be about −1000 volts (about 2 kW); and the RF power can be vary from about 1 kW to about 3 kW.

FIG. 10A illustrates another exemplary DC/RFH process chamber having a top DC electrode 1010, a RF bias electrode 1020, and ground elements 1030. The DC electrode 1010 can be a top electrode with a high negative $V_{DC}$ (−800V) imposed thereon; the RF electrode 1020 can have an RF bias (13.56 MHz, 850 W) imposed thereon; the thermal electrons can return to one of the ground elements 1030; and the ballistic electrons e⁻ (BEs) can have a transit time in the DC/RFH process chamber of about 1 ns. In the DC/RFH process chamber, the DC electrode 310 must be located opposing the RF electrode 320.

FIG. 10B illustrates a graph of voltage versus time having a first RF voltage 1050 and a first peak voltage 1060 shown thereon. In addition, an exemplary dump period 1055 is also shown, and the length of the dump period 1055 can be about 30 ns. For example, $V_{RF}(t)$ can be the voltage (2000V) applied to the RF electrode 1020 at 13.56 MHz, $V_P(t)$ can be about 25V, and $V_{pp}$ can be the peak-to-peak RF voltage (2100V) on the biased substrate.

Figure 11:
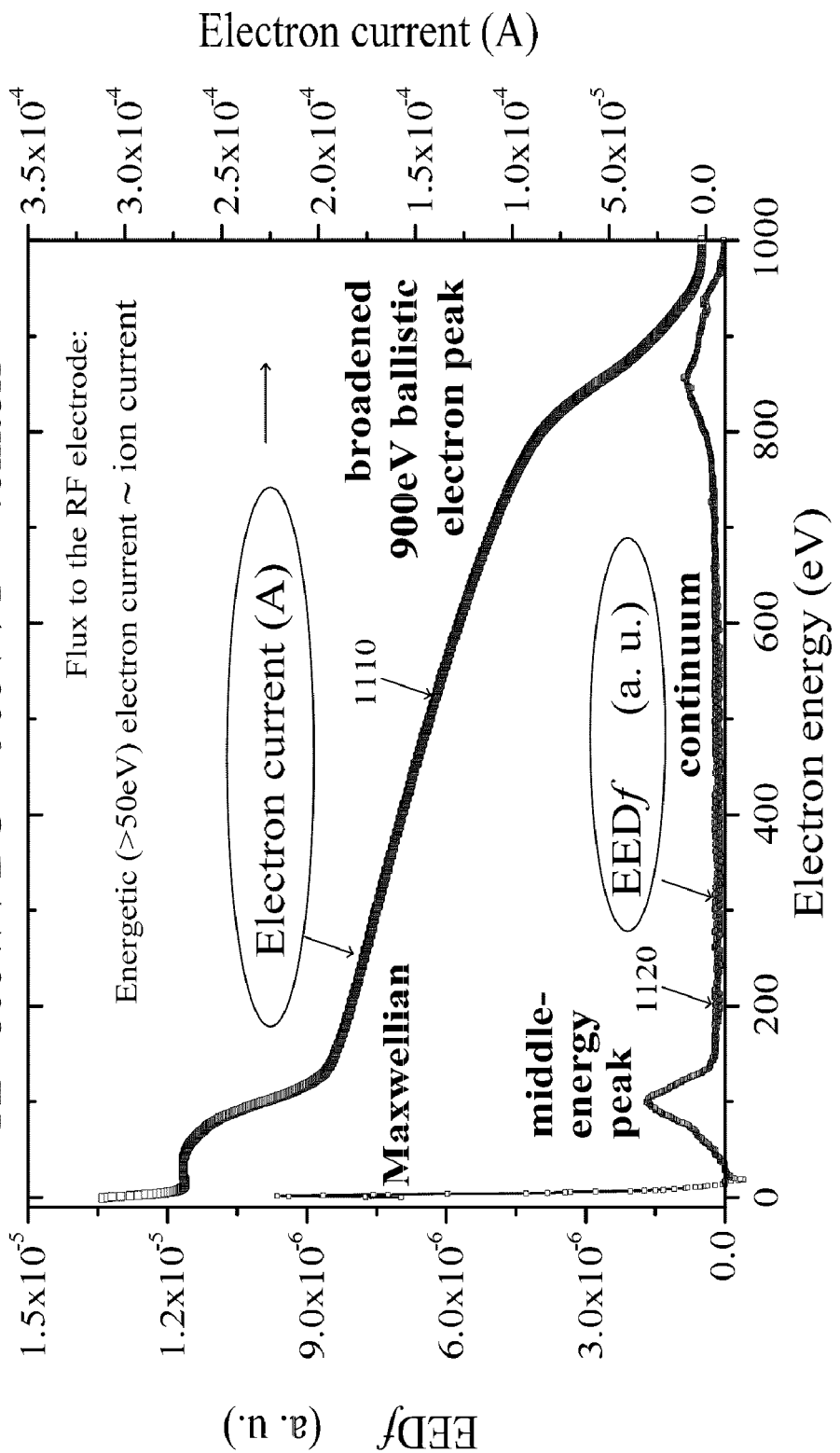
FIG. 11 illustrates exemplary process data for the DC/RFH processing system in accordance with embodiments of the invention.

FIG. 11 illustrates exemplary process data for the DC/RFH processing system in accordance with embodiments of the invention. The first process data 1110 includes a graph of electron current data (A, amps) versus electron energy (eV, electron volt) data, and the second process data 1120 includes a graph of EEDƒ (a.u., arbitrary units) data versus electron energy (eV) data for the DC/RFH processing system. For example, the middle-energy peak can have a triangular shape and can be dependent on the current and the pressure. For example, FIG. 11 shows that the DC/RFH processing system has a Maxwellian (thermal bulk/background) and a middle-energy peak; and the middle-energy peak electrons are in the range of the most efficient impact-ionization, i.e., the middle-energy peak electrons sustain and support the plasma. As a result (i.e., the plasma ionization is almost entirely supported by the middle-energy peak electrons), the plasma's Maxwellian thermal bulk is "mainly" for the purpose of particle balance (i.e., the $T_e$ electron temperature of the Maxwellian thermal bulk drives the ion-loss term and, at steady state, the electron-loss equals the ion-loss).

For example, an inverse-Landau process can generate a Langmuir wave (e– plasma wave) whose phase velocity equals the initial BE beam velocity ($v_\phi = v_b$); the initial BE energy was 900 eV+/–10 eV; the middle-energy peak is always similar shape and is in the energy range of efficient ionization; and the BE peak shape varies depending on current, pressure, etc.

In addition, the graphs (1110 and 1120) illustrate that by controlling the plasma EEDƒ, the plasma chemistry can be controlled. The EEDƒ is controlled such that the electron population is in the energy range of ~6 eV to 17 eV for some DC/RFH procedures, and the electron population can be minimized for the molecular species used in the DC/RFH procedures. The reason being that energy range electrons can dissociate molecules producing fluorine (F), oxygen (O) ions, etc. and can produce VUV radiation, and for different molecules, the range is slightly different (6 to 17 eV is just an example).

Figure 12:
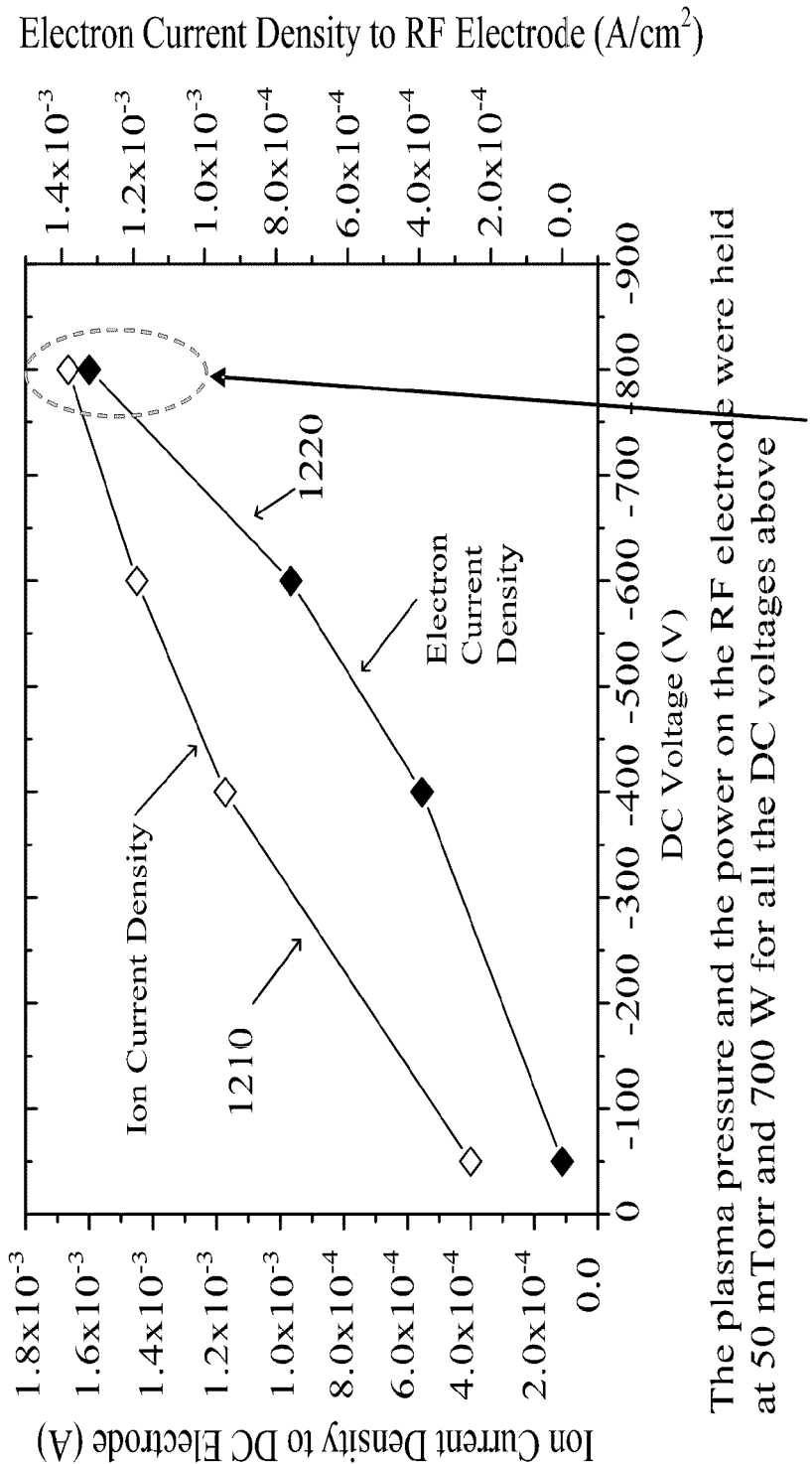
FIG. 12 illustrates exemplary ballistic electron (BE) data for the DC/RFH processing system in accordance with embodiments of the invention.

FIG. 12 illustrates exemplary ballistic electron (BE) data for the DC/RFH processing system in accordance with embodiments of the invention. The first process data 1210 includes a graph of ion current density data versus DC voltage (V) data, and the second process data 1220 includes a graph of electron current density data versus DC voltage (V) data for the DC/RFH processing system. For example, large (BE) current can be dumped to the substrate that can be comparable to the ion current during the sub-Debye dump period. In addition, the plasma pressure and the power on the RF electrode were held at 50 mTorr and 700 W for all the DC voltages shown in FIG. 12. Note: BE current density should be ten times less than the ion current density to the DC electrode since secondary electron yield is ~<0.1 under ion bombardment. BE amplification is due to trapping, and the secondary-electrons are from electrodes.

Figure 13:
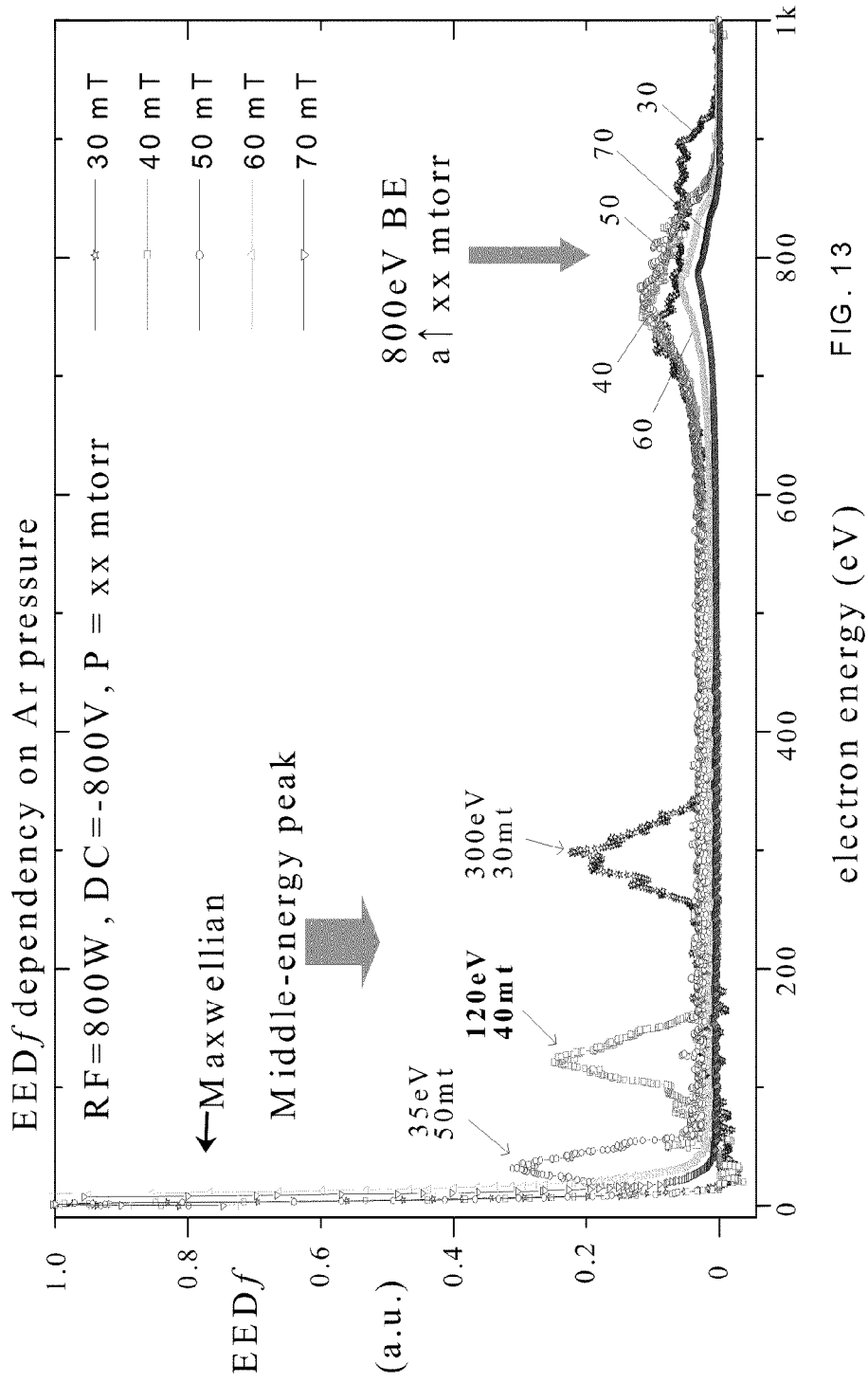
FIG. 13 illustrates exemplary process result data for the DC/RFH processing system in accordance with embodiments of the invention.

FIG. 13 illustrates exemplary process result data for the DC/RFH processing system in accordance with embodiments of the invention. The process result data can include a plurality of graphs of EEDƒ (a.u.) data versus electron energy (eV) data for the DC/RFH processing system. During these procedures, the 13.56 MHz RF bias power can be about 800 W, and the DC voltage can be about –800 volts. For example, the plurality of graphs of EEDƒ (a.u.) data versus electron energy (eV) data can include exemplary middle-energy peak data at different pressures and different energies or eVs (300 eV@30 mt, 120 eV@40 mt, and 35 eV@)50 mt), and the middle-energy peak data can be dependent upon these different pressures. In addition, the plurality of graphs of EEDƒ (a.u.) data versus electron energy (eV) data can include exemplary BE peak data at different pressures (30 mt, 40 mt, 50 mt, 60 mt, and 70 mt), and the middle-energy peak data can be dependent upon these different pressures.

Figure 14:
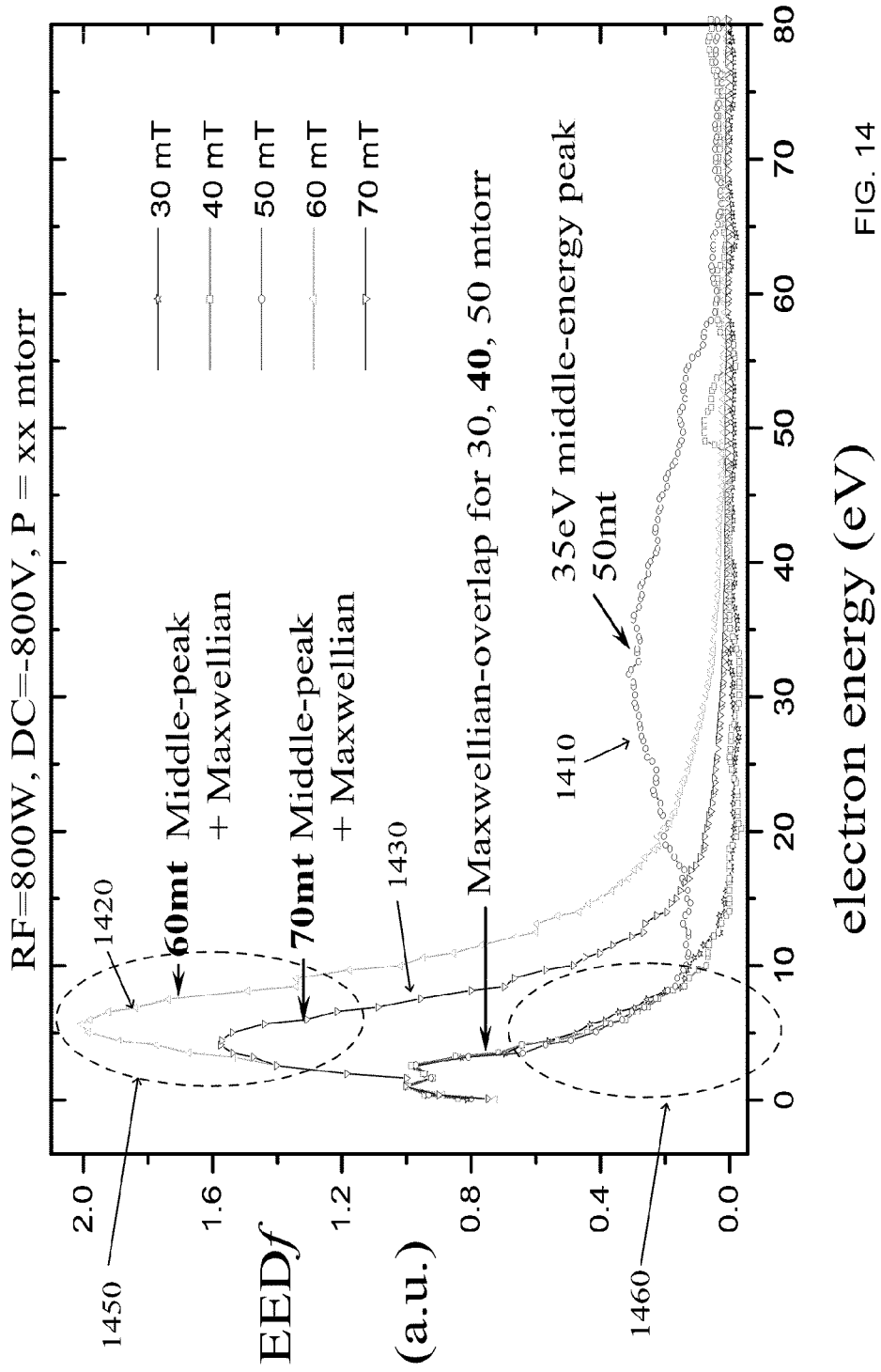
FIG. 14 illustrates exemplary low energy process result data for the DC/RFH processing system in accordance with embodiments of the invention.

FIG. 14 illustrates exemplary low energy process result data for the DC/RFH processing system in accordance with embodiments of the invention. The process result data can include a plurality of graphs of EEDƒ (a.u.) data versus electron energy (eV) data for the DC/RFH processing system. During these procedures, the 13.56 MHz RF bias power was about 800 W, the DC voltage was about –800 volts, and the process gas was only Argon (Ar). During other procedures, other process results can be expected when process gas is used. For example, the plurality of graphs of EEDƒ (a.u.) data versus electron energy (eV) data can include exemplary data at different pressures (50 mt, 60 mt, and 70 mt), and the "Middle-peak+Maxwellian" data can be dependent upon these different pressures. The first low-energy process result data (1410) includes a 35 eV middle-energy peak for a 50 mt procedure. The second low-energy process result data (1420) includes "Middle-peak+Maxwellian" data for a 60 mt procedure. The third low-energy process result data (1430) includes "Middle-peak+Maxwellian" data for a 70 mt procedure. A first region (1450) is shown that includes bad process results, and a second region (1460) is shown that includes good process results. For example, the 50 mt's middle-energy peak has its peak's energy at 35 eV, i.e., all of the Maxwellian data merge for 30 mt, 40 mt, 50 mt, and this is "very good", because at these DC/RFH pressures, the ionization is efficient, and the energy is not pumped into the Maxwellian thermal bulk population. All of the Maxwellian data merge at Te ~1.8 eV, and this is a good result.

FIG. 14 further illustrates the 60 mt and 70 mt conditions, and their middle-energy peaks have such low energy for their peaks that their middle-energy peaks merge into the Maxwellian data. As a result, their electron populations in the range from ~6 eV to 17 eV (for this example) have been severely pumped up, and this is bad for chemistry because there is large (too much) molecular dissociation and VUV generation. In addition, the illustrated data are pure Ar, and the parameters will be slightly different for a DC/RFH process recipe.

Figures 15A, 15B:
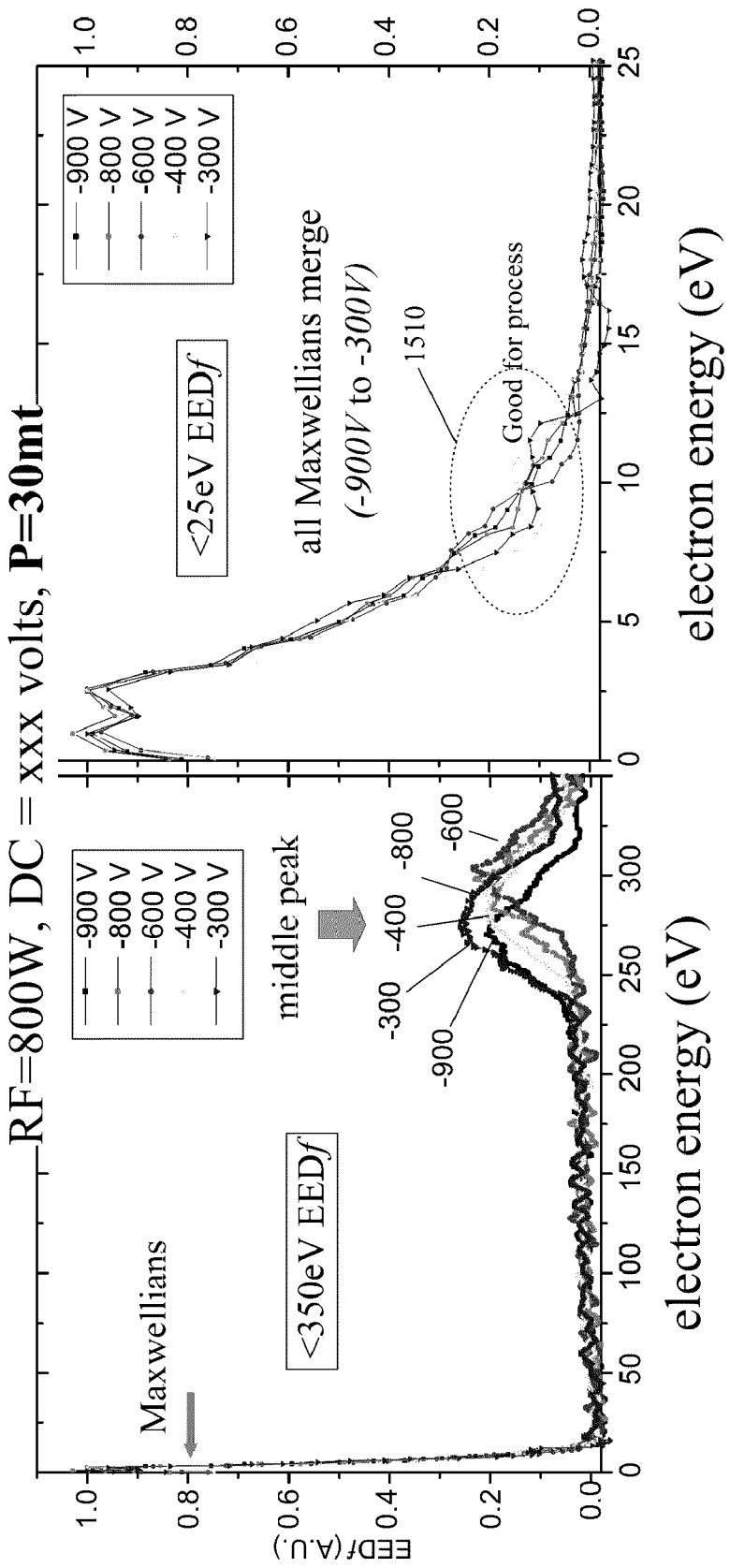
FIGS. 15A and 15B illustrate exemplary Maxwellian merge data for the DC/RFH processing system in accordance with embodiments of the invention.

FIGS. 15A and 15B illustrate exemplary Maxwellian merge data for the DC/RFH processing system in accordance with embodiments of the invention. The process result data can include a plurality of graphs of EEDƒ (a.u.) data versus electron energy (eV) data for the DC/RFH processing system and that illustrate the dependence on the DC voltage. During these procedures, the 13.56 MHz RF bias power was about 800 W; the chamber pressure was about 30 mt; and the DC voltages were varied from about –300V to about –900V. FIG. 15A shows middle energy peaks for the various DC voltages (–300V, –400V, –600V, –800V, and –900V) at about 250 eV to about 350 eV. FIG. 15B shows that all the Maxwellian data merge for the various DC voltages (–300V, –400V, –600V, –800V, and –900V) at less than about 25 eV, and a region 1510 is shown in which the eV values are "good for DC/RFH processing".

For example, FIGS. 15A and 15B illustrate the Maxwellian bulk's $T_e$ is about constant and does not change much. This can be because the plasma ionization is almost entirely supported by the middle-energy peak electrons, the plasma's Maxwellian thermal bulk is "mainly" for the purpose of particle balance. In addition, the $T_e$ of the Maxwellian thermal bulk drives the ion-loss term and at steady state, the electrons-loss equals the ion-loss.

Figure 16:
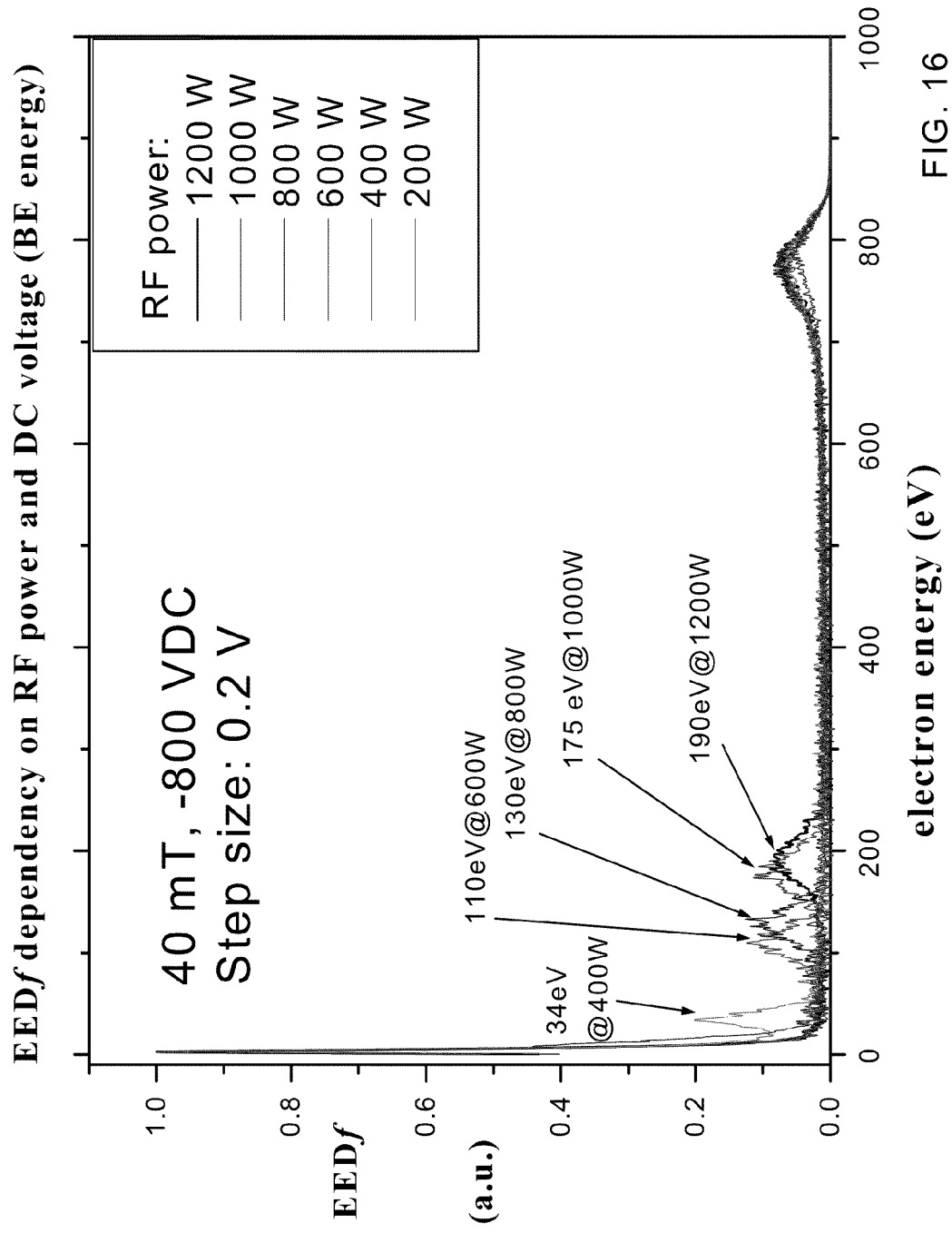
FIG. 16 illustrates exemplary ballistic electron (BE) energy data for the DC/RFH processing system in accordance with embodiments of the invention.

FIG. 16 illustrates exemplary ballistic electron (BE) energy data for the DC/RFH processing system in accordance with embodiments of the invention. The (BE) energy data can include a plurality of graphs of EEDƒ (a.u.) data versus electron energy (eV) data for the DC/RFH processing system. During these procedures, the chamber pressure was about 40 mT, the 13.56 MHz RF bias power was varied from about 200 W to about 1200 W, and the DC voltage was about –800 volts. FIG. 16 shows middle energy peaks for the various RF powers (34 eV @400 W), (110 eV @600 W), (130 eV @800 W), (175 eV @1000 W), and (190 eV @1200 W). The (BE) energy data illustrates a dependency on the RF power.

FIGS. 17A and 17B illustrate additional exemplary ballistic electron (BE) energy data for the DC/RFH processing system in accordance with embodiments of the invention. The (BE) energy data can include a plurality of graphs of EEDƒ

(a.u.) data versus electron energy (eV) data for the DC/RFH processing system and that illustrate the dependence on the RF power. FIG. 17A shows middle energy peaks for the various RF powers (8 eV @200 W), (34 eV @400 W), (110 eV @600 W), (130 eV @800 W), (175 eV @1000 W), and (190 eV @1200 W). During these procedures, the chamber pressure was about 40 mT, the 13.56 MHz RF bias power was varied from about 200 W to about 1200 W, and the DC voltage was about −800 volts. FIG. 17B shows middle energy peaks for the various RF powers (130 eV @600 W), (170 eV @800 W), (203 eV @1000 W), and (228 eV @1200 W). The (BE) energy data illustrates a dependency on the RF power. During these procedures, the chamber pressure was about 40 mT, the 13.56 MHz RF bias power was varied from about 200 W to about 1200 W, and the DC voltage was about −600 volts. This data shows the middle energy peaks can depend upon the RF power applied.

Figure 18:
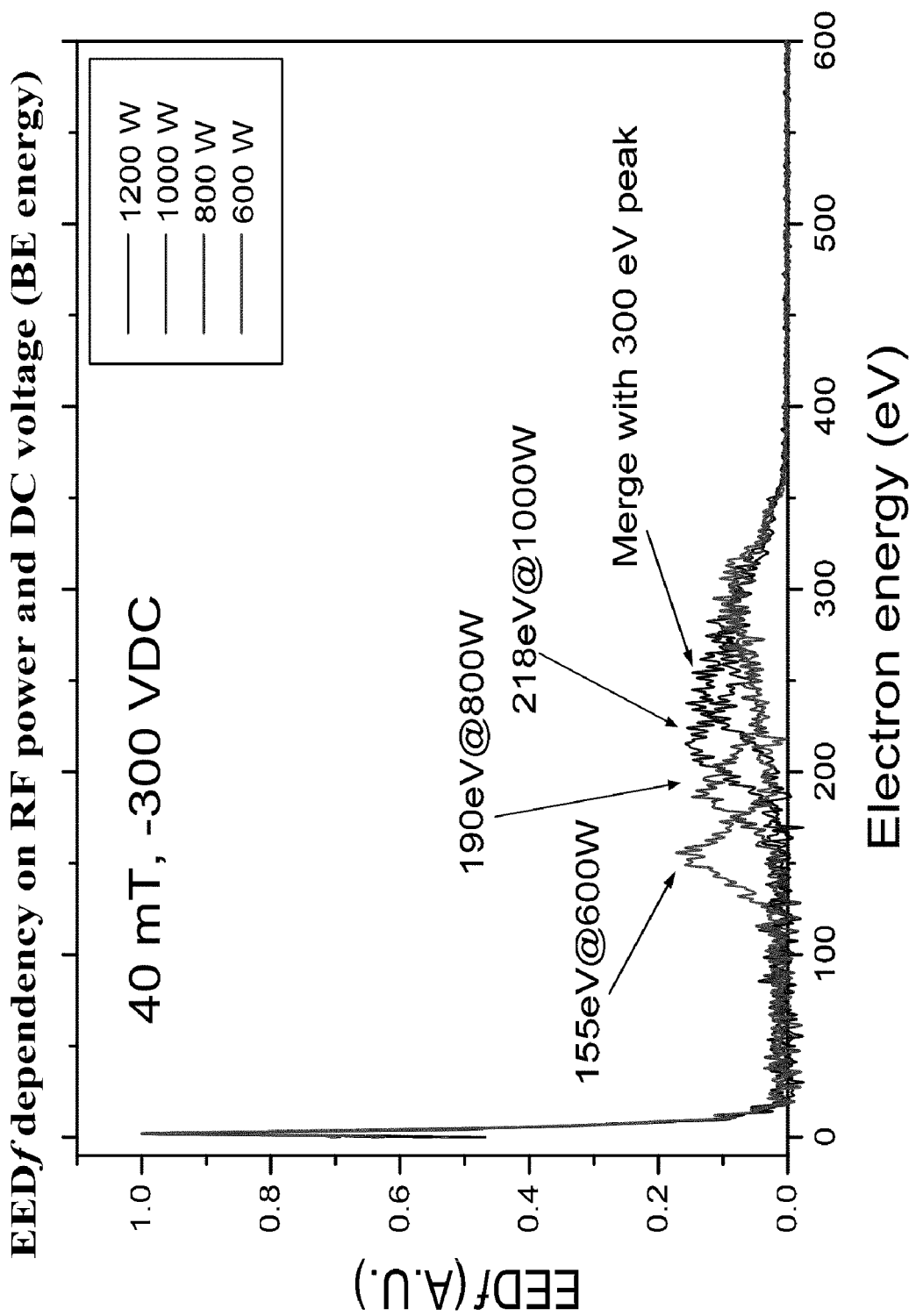
FIG. 18 illustrates additional exemplary ballistic electron (BE) energy data for the DC/RFH processing system in accordance with embodiments of the invention.

FIG. 18 illustrates additional exemplary ballistic electron (BE) energy data for the DC/RFH processing system in accordance with embodiments of the invention. The (BE) energy data can include a plurality of graphs of EEDƒ (a.u.) data versus electron energy (eV) data for the DC/RFH processing system. During these procedures, the chamber pressure was about 40 mT, the 13.56 MHz RF bias power was varied from about 600 W to about 1200 W, and the DC voltage was constant at about −300$V_{DC}$. FIG. 18 shows middle energy peaks for the various RF powers (155 eV @600 W), (190 eV @800 W), and (218 eV @1000 W). The (BE) energy data illustrates that the middle energy peaks begin to merge at these process conditions.

Figure 19:
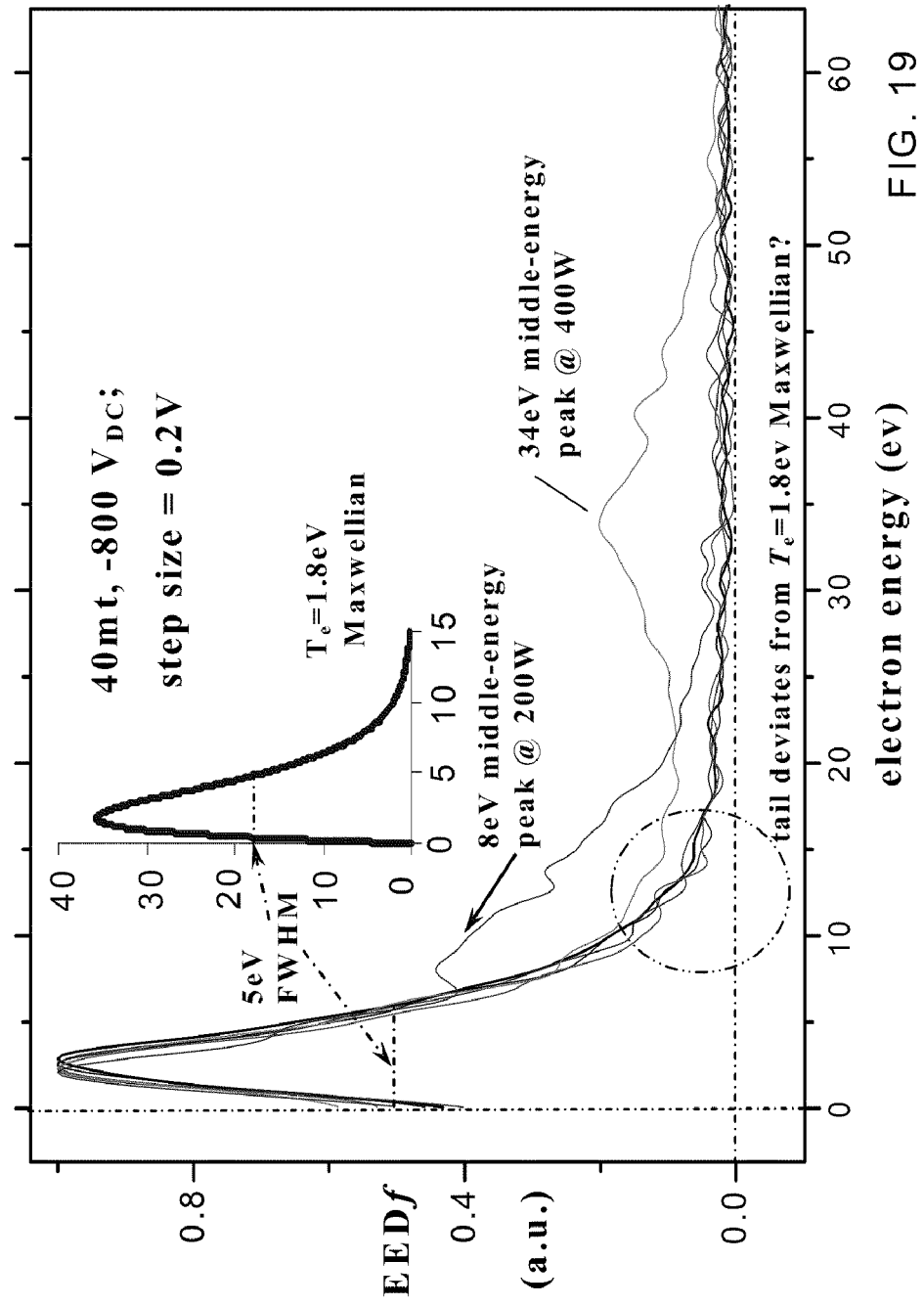
FIG. 19 illustrates exemplary Maxwellian (thermal energy) data for the DC/RFH processing system in accordance with embodiments of the invention.

FIG. 19 illustrates exemplary Maxwellian (thermal energy) data for the DC/RFH processing system in accordance with embodiments of the invention. The Maxwellian (thermal energy) data can include a plurality of graphs of EEDƒ (a.u.) data versus electron energy (eV) data for the DC/RFH processing system. During these procedures, the chamber pressure was about 40 mT, the 13.56 MHz RF bias power was varied from about 600 W to about 1200 W, and the DC voltage was about −800$V_{DC}$.

FIG. 19 shows Maxwellian (thermal energy) data for the various RF powers (8 eV @200 W), and (34 eV @400 W). The Maxwellian (thermal energy) data illustrates that the Maxwellian (thermal energy) data are substantially constant at these process conditions. For example, the thermal population Maxwellian $T_e$ can be about 1.8 eV regardless of the RF power, the DC voltage, and the chamber pressure; the RF compensated Langmuir probe can measure a $T_e$ of about 2 eV; and independent laser Thompson scattering measures 1.77 eV.

Figure 20A:
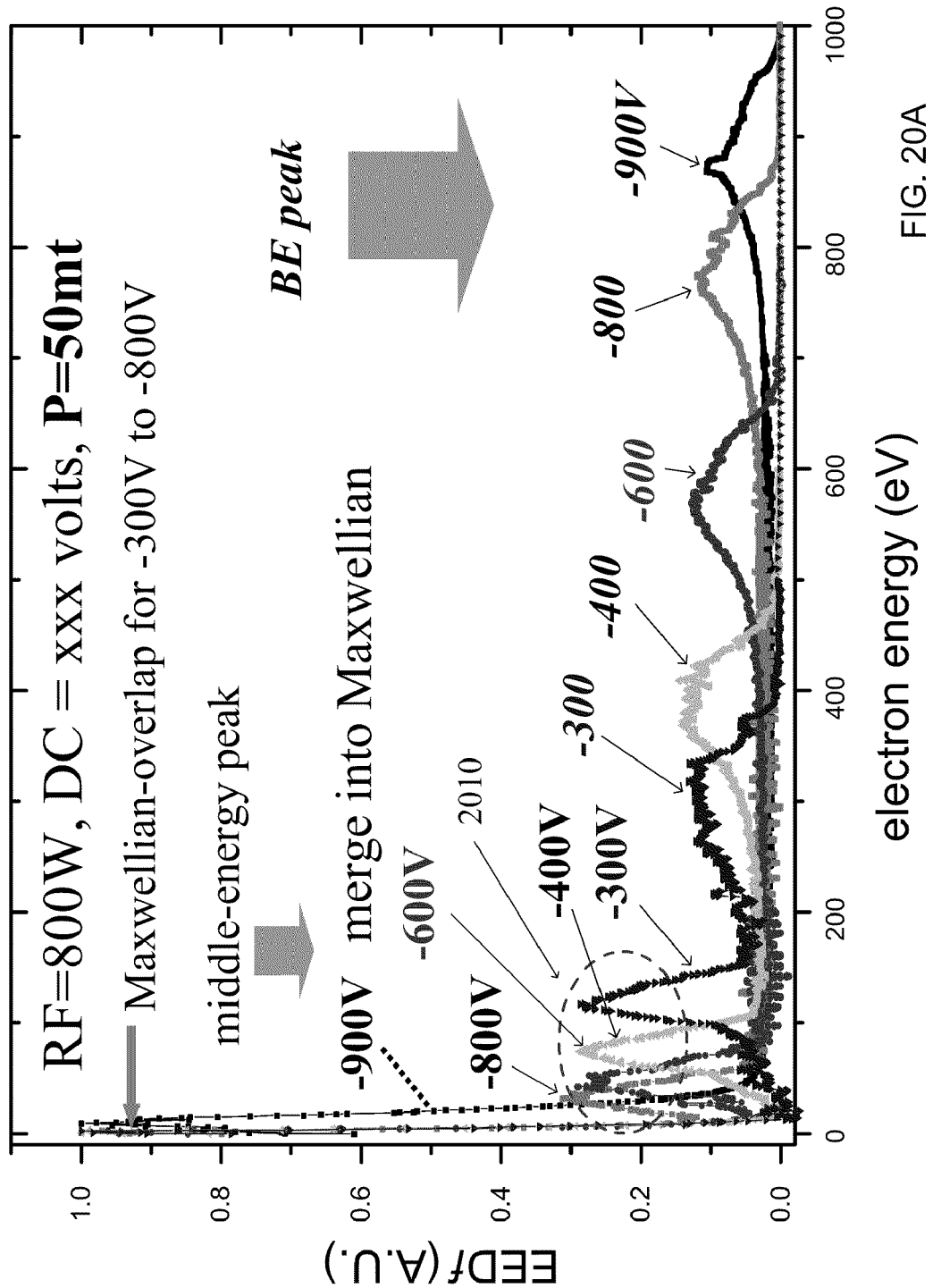
FIGS. 20A, 20B, and 20C illustrate additional exemplary electron energy distribution data for the DC/RFH processing system in accordance with embodiments of the invention.
Figure 20B:
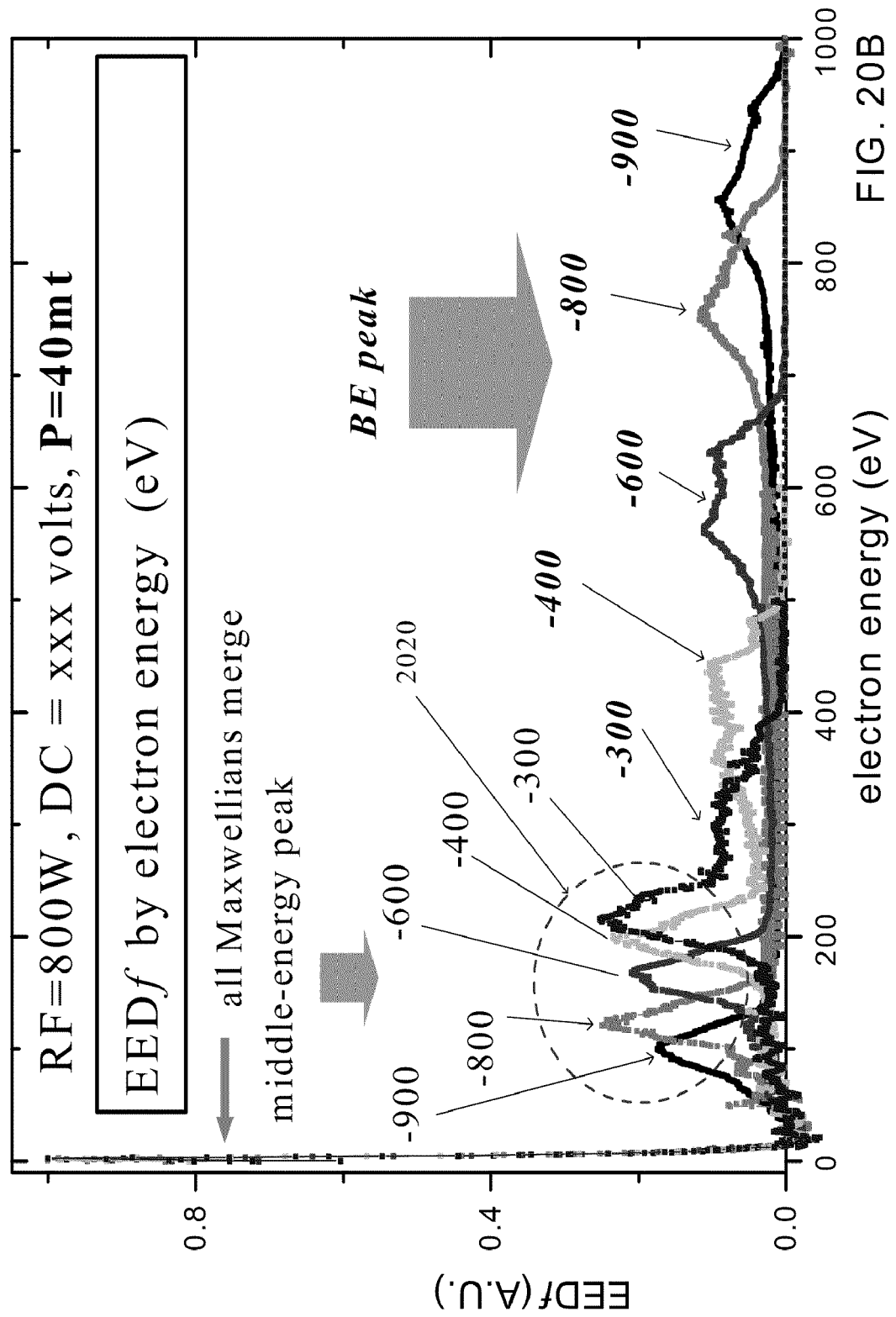
Figure 20C:
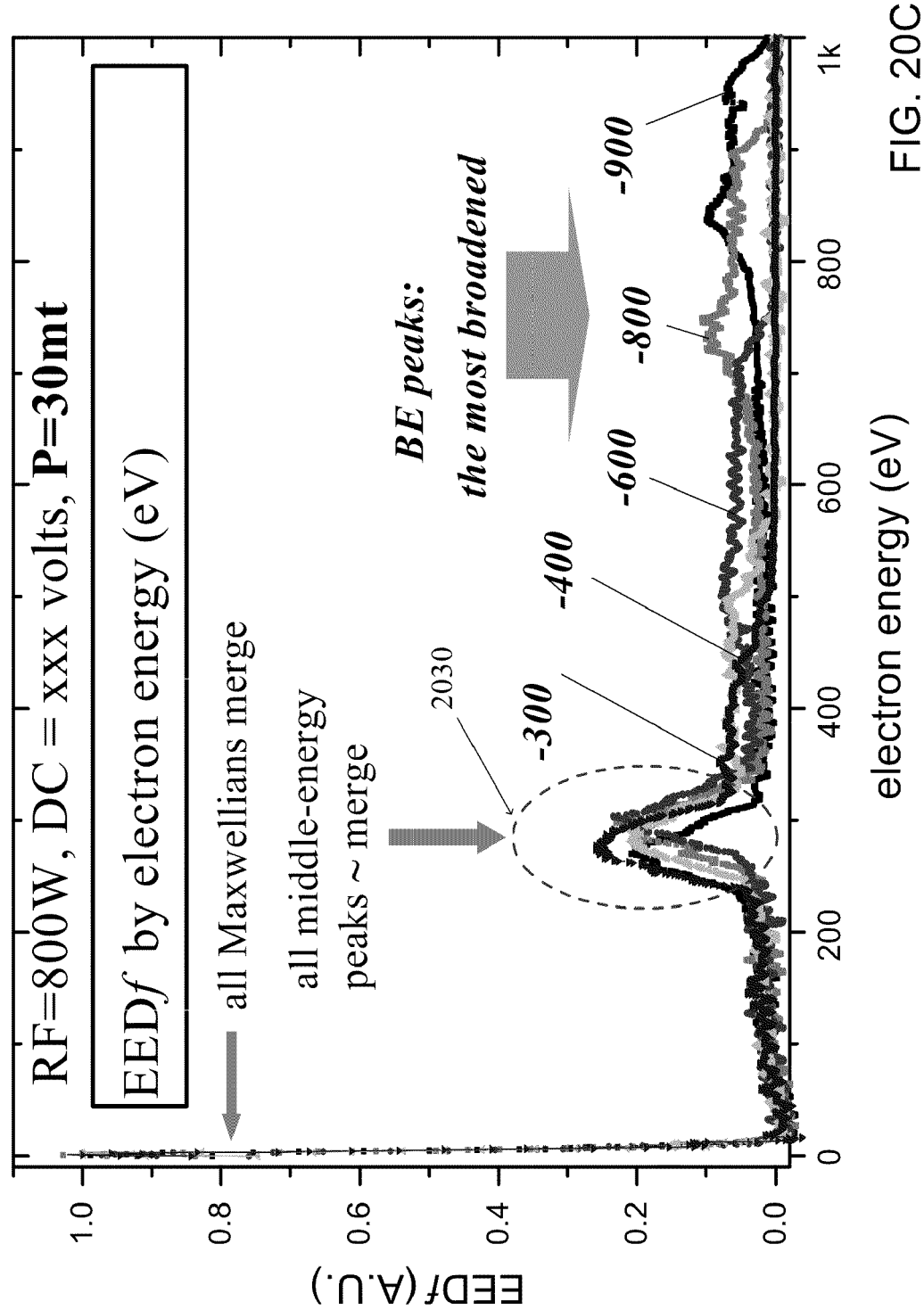

FIGS. 20A, 20B, and 20C illustrate additional exemplary electron energy distribution data for the DC/RFH processing system in accordance with embodiments of the invention. The electron energy distribution data can include a plurality of graphs of normalized EEDƒ (a.u.) data versus electron energy (eV) data for the DC/RFH processing system and that illustrate the dependence on the pressure and the DC voltage. During these procedures, the chamber pressure was about 50 mT, the 13.56 MHz RF bias power was about 800 W, and the DC voltage was varied from about −300V to about −800V. FIG. 20A shows middle energy peaks merging into the Maxwellian data in a first region 2010 for the various DC voltages (−300V, −400V, −600V, −800V, and −900V), and illustrates ballistic energy (BE) peaks at different locations for the various DC voltages (−300V, −400V, −600V, −800V, and −900V). FIG. 20B shows middle energy peaks merging together in a second region 2020 for the various DC voltages (−300V, −400V, −600V, −800V, and −900V), and illustrates ballistic energy (BE) peaks at different locations for the various DC voltages (−300V, −400V, −600V, −800V, and −900V). FIG. 20C shows middle energy peaks merged together in a third region 2030 for the various DC voltages (−300V, −400V, −600V, −800V, and −900V), and illustrates broadened ballistic energy (BE) peaks at different locations for the various DC voltages (−300V, −400V, −600V, −800V, and −900V).

FIG. 21 illustrates an exemplary flow diagram of the distribution of wave energy in accordance with embodiments of the invention. This data shows how high-$v_\phi$ initial Langmuir waves pump energy into plasma using a rate equation model. $W_1$, $W_2$, and $W_s$ are the energy densities of the primary electrostatic, secondary electrostatic, and ion energy waves. TS=two-stream, OTS-oscillation two-stream, DO is the interaction between the electrostatic and ion waves, L=Landau damping, and DW is the nonlinear ion wave damping term. The Langmuir wave ($W_1$, primary wave) has to be slowed down to secondary wave ($W_2$), then Landau damping can take place with the lower energy electrons. Ion wave ($W_s$) is excited as $W_1$ is slowed, thus, promoting new energy coupling channels. In addition, the injected energetic electrons (e.g., 1 keV) are basically collisionless. However, the ballistic e⁻ beam makes Langmuir waves ($W_1$, primary plasma waves) whose phase velocity equals the BE velocity ($v_\phi = V_b$).

Figure 22A:
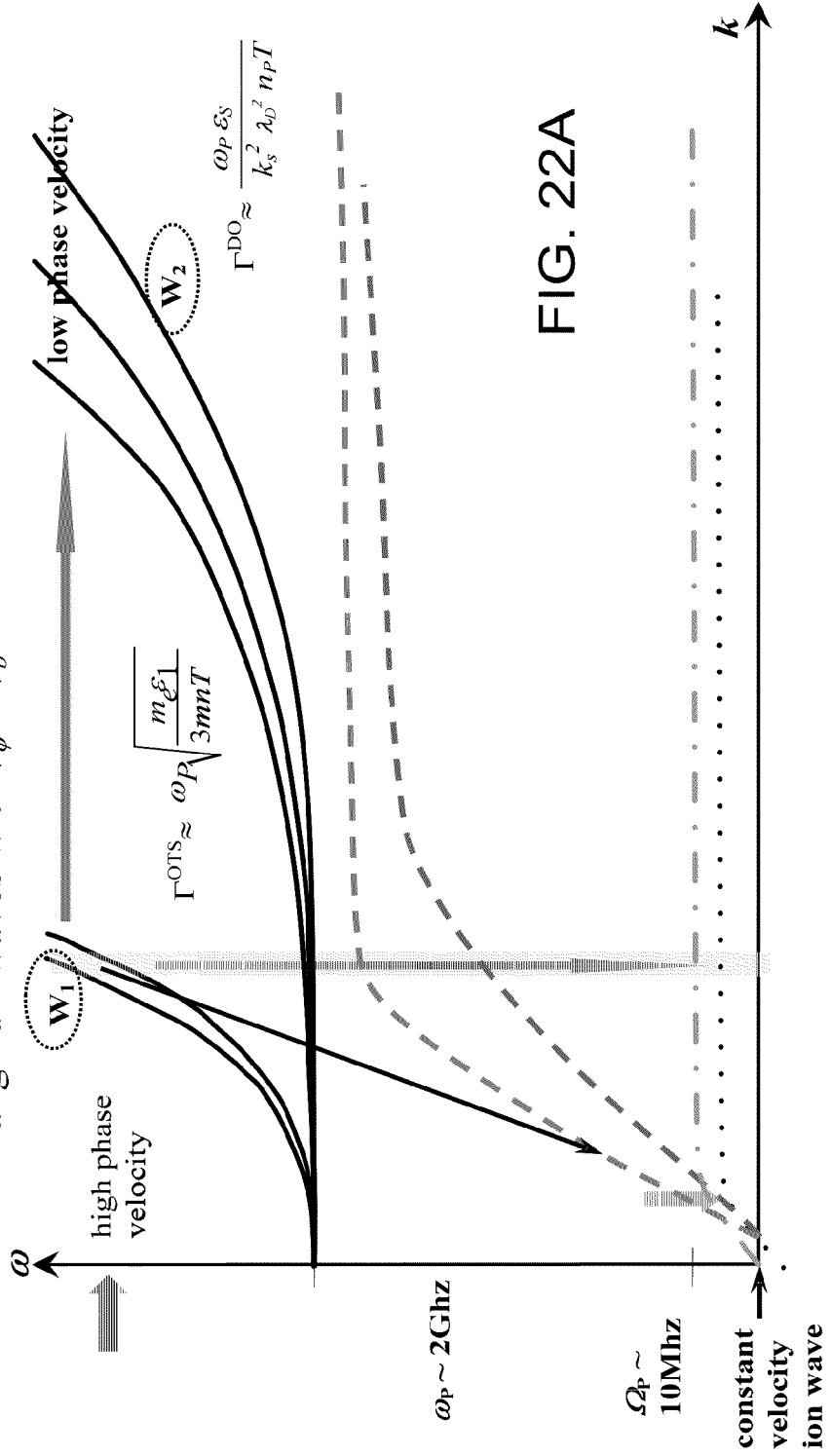

FIGS. 22A and 22B illustrate wave instability summary data for the DC/RFH processing system in accordance with embodiments of the invention. FIG. 22A includes a plurality of graphs of radian frequency (ω) data versus the ion wave number (k) data for the DC/RFH processing system. For example, a first group $W_i$ of high phase velocity waves can be illustrated and determined using equation (1) shown below:

$$\Gamma^{OTS} = \omega_P \sqrt{\frac{m_e \varepsilon_1}{3mnT}} \quad (1)$$

and, a second group $W_2$ of low phase velocity waves can be illustrated and determined using equation (2) shown below:

$$\Gamma^{DO} \approx \frac{\omega_P \varepsilon_S}{k_s^2 \lambda_D^2 n_P T} \quad (2)$$

In addition, inverse-Landau waves through 2-stream instability, ballistic e⁻, excites constant-ω (with thermal spread) primary Langmuir waves with $v_\phi$-$v_b$.

FIG. 22B includes a plurality of notes and references. For example, the wave instability can be summarized as: (1) main branch: oscillating 2-stream instability (OTS)[4]⇒$W_1$ is converted to shorter λ secondary-wave $W_2$ and ion-wave $W_s$. Reduced $v_\phi$ of $W_2$ is Landau damped by lower-velocity electrons and the Maxwellian tail, increasing their population. The instability growth rate[8,9] ($W_2$ growth rate is $\Gamma^{OTS}$, where $m_e/m_i$ is e⁻/ion mass, T is the plasma temperature, $\varepsilon_1$ is $W_1$ energy density. (2) parametric oscillations[5,6] and Doppler shift[2,7] of moving frame $\omega_P$ to lap-frame $\omega_P$ (e.g., for RF-sheath-edge stochastic e⁻ stream) both an produce ω<$\omega_P$ damping waves (imaginary). Without even invoking the ion waves[5,6], the ω<$\omega_P$ waves are damped by thermal e⁻ toward the shorter $\lambda_\phi$; reduced $v_\phi$ can then couple to the Maxwellian tail via Landau damping. Also, the electrostatic waves can be broadband through interactions and couple strongly to ion density waves as their frequencies near[2,4]. Ion waves can then become resonantly strong at frequencies (e.g., 20 kHz) characteristic to the chamber size. (3) Interaction between the electrostatic and ion waves (DO)[4]⇒as $W_s$ grow strong, ion waves can interact nonlinearly with the higher $v_\phi$ plasma waves and thereby increase the energy density of the second wave $W_2$ (and that of $W_S$ as well). The massive ions easily damp the primary waves to shorter λ (lower $v_\phi$) secondary waves. Its $W_2$ growth rate[10,11] is $\Gamma^{DO}$, where $\in_S$ is ion-wave energy density, $k_S$ is the ion-wave number, $\lambda_D$ is Debye length.

In addition, the following references have been cited:
[2]F. F. Chen, *Introduction to Plasma Physics*, 1st ed. (Plenum Press, New York, 1974)
[4]D. V. Rose, J. U. Guillory, J. H. Beall, *Phys. Plasmas* 9, 1000 (2002)
[5]I. Silin, R. Sydora, K. Sauer, *Phys. Plasmas* 14, 012106 (2007)
[6]P. Gopalraja, J. Foster, *Appl. Phys. Lett.* 77, 3526 (2000)
[7]P. Rolland, *Phys. Fluids* 8, 2114 (1965)
[8]H. P. Freund et al., *Phys. Fluids* 23, 518 (1980)
[9]H. P. Freund et al., *Phys. Fluids* 23, 139 (1980)
[10]Dawson et al., *Phys. Fluids* 5, 517 (1962)
[11]Dawson et al., *Phys. Fluids* 6, 394 (1963).

Figure 23:
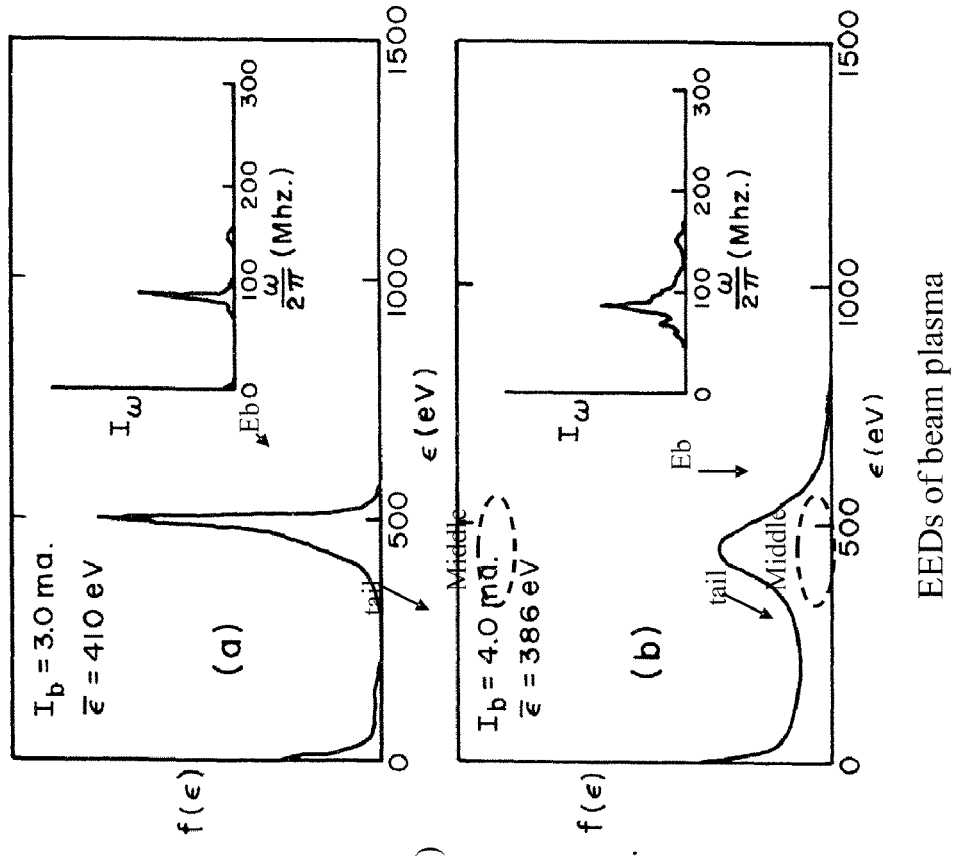
FIG. 23 illustrates some beam-plasma references in accordance with embodiments of the invention.

FIG. 23 illustrates some beam-plasma data and associated references in accordance with embodiments of the invention. The graphs show $f(\in)$ versus $\in$(eV) data. These references do not include the bounded plasma used in the (3 cm) DC/RFH processing system. These are open system (unbounded plasma) experiments. The continuum populations are high and there is no middle-energy peak. Experiments' pressures are typically collisionless; injected e-beam broadens more at the higher injection current regime.

Figure 24:
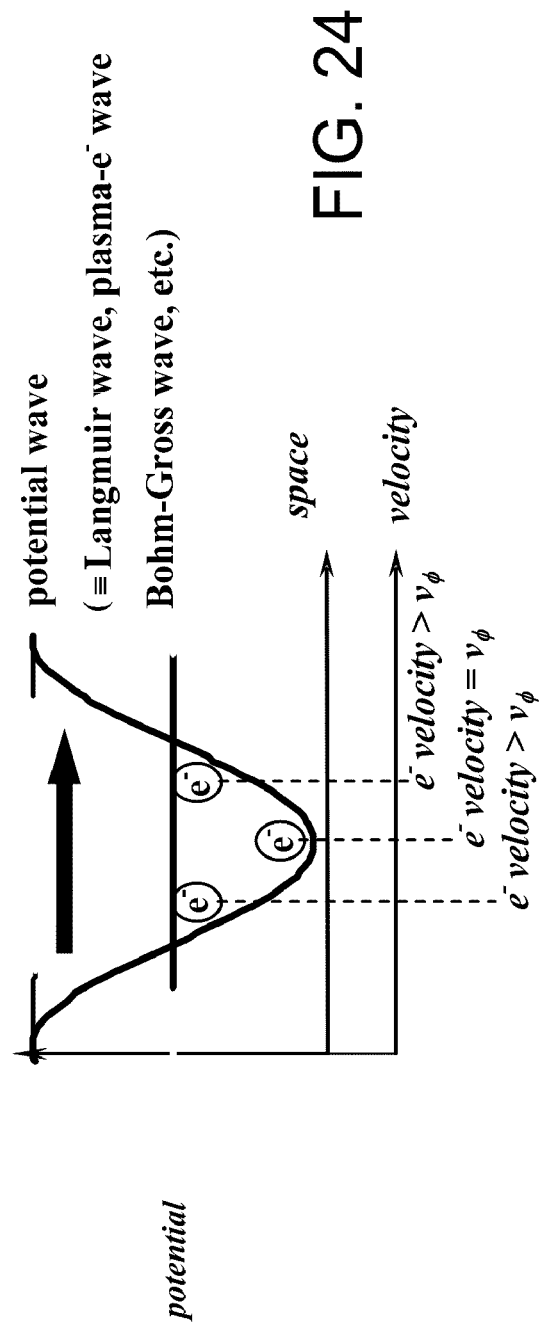
FIG. 24 illustrates exemplary plasma wave data for Landau and inverse-Landau waves in accordance with embodiments of the invention.

FIG. 24 illustrates exemplary plasma wave data for Landau and inverse-Landau waves in accordance with embodiments of the invention. (1) BE gained energy through continuous acceleration by sheath field. Specific $-v_\phi$ Landau Damping makes $v_\phi$-equivalent mono-energetic electrons. Electrons with velocity just below the specific $-v_\phi$ are accelerated by the wave-field and Landau damps the wave; the accelerated electrons with velocity just above the specific $-v_\phi$ outruns the wave pumping energy back into outruns the wave pumping energy back into the wave as inverse-Landau. The net effect is no electrons with energies above and below the $v_\phi$-equivalent; only electrons with the $v_\phi$-equivalent energy grow in population while $v_\phi$-wave losses its energy. This process continues until wave-energy equates the total energy of the mono-energetic electron group. More specifically, the population of this mono-energetic electron group is determined by dN/dt=supply+loss=0. This additional loss is electron inelastic collisions (e.g., ionization). (2) In most systems, open and closed plasma, there are Langmuir waves of all wavelengths (various $v_\phi$). Therefore, there is the energy continuum. (3) Energetic electrons "could" lose their energy through exciting plasma waves much easier than they do through collisions: collisional energy loss time-scale ~MFP/$v_\phi$; e⁻-wave excitation time-scale $\sim\lambda/v_\phi \sim f_P^{-1}$.

FIGS. 25A, 25B, and 25C illustrate additional ballistic electron (BE) data for the DC/RFH processing system in accordance with embodiments of the invention. The (BE) data can include a plurality of graphs of (BE) energy spread and (BE) peak shift data for the DC/RFH processing system. During the procedures shown in FIG. 25A, the chamber pressure was varied from about 20 mT to about 70 mT, the 13.56 Mhz RF bias power was about 800 W, and the DC voltage was about −800V. During the procedures shown in FIG. 25B, the chamber pressure was about 40 mT, the 13.56 Mhz RF bias power was about 800 W, and the DC voltage was varied from about −300V to about −800V. During the procedures shown in FIG. 25C, the chamber pressure was about 40 mT, the 13.56 Mhz RF bias power was varied from about 200 W to about 1200 W, and the DC voltage was about −800V.

For example, the ballistic electron (BE) energy can be calculated using the equation (3) shown below:

$$\frac{E^2}{4\pi} = \frac{\alpha n_b m_e V_b^3}{\gamma_{eff} L} \qquad (3)$$

where:
$\gamma_{eff}$=collision frequency;
L=length
$V_b$=beam velocity, and
$n_b$=beam density FIGS. 26A, 26B, and 26C illustrate middle-energy peak data for the DC/RFH processing system in accordance with embodiments of the invention. The middle-energy peak data can include a plurality of graphs of the triangle-shape middle-energy peak's dependence on the process parameters used by the DC/RFH processing system. During the procedures shown in FIG. 25A, the chamber pressure was about 40 mT, the 13.56 Mhz RF bias power was varied from about 200 W to about 1200 W, and the (BE) voltage was about 800 eV. During the procedures shown in FIG. 26B, the chamber pressure was about 40 mT, the 13.56 Mhz RF bias power was about 800 W, and the (BE) voltage was varied from about 300 eV to about 900 eV. During the procedures shown in FIG. 26C, the chamber pressure was varied from about 20 mT to about 70 mT, the 13.56 Mhz RF bias power was about 800 W, and the (BE) voltage was about 800 eV.

For example, the sheath thickness (S) can be calculated using the equation (4) shown below:

$$S \propto \frac{V_0^{3/4}}{n_e^{1/2} T_e^{3/4}} \qquad (4)$$

where:
$V_0$=thermal–electron–free sheath potential~$RFV_{pp}$

FIG. 27 illustrates additional plasma references in accordance with embodiments of the invention. These references include data for Langmuir waves in bounded plasma. It is well-known that plasma waves cannot exist inside the thermal-electron-free sheath because the sheath-edge will reflect Langmuir waves. For example, a first reference states (1) "reflection and absorption of electron plasma waves in a bounded plasma", H. Sugai, et al, Plasma Physic, Vol. 17, pp. 985-990, and a second reference states (2) "Landau resonant heating using standing waves excited by a distributed circuit for electron velocity distribution control", C. K. Birdsall, et al, Phys. of Plasma, vol. 9 #5, 2002. In addition, reflection at plasma sheath edge would set up standing waves, which significantly enhance the E field of the potential waves. Multi-mode standing waves are Landau damped producing broadband (energy) energetic electrons. Therefore, there must be of standing wave in order to produce a single peak.

Figure 28:
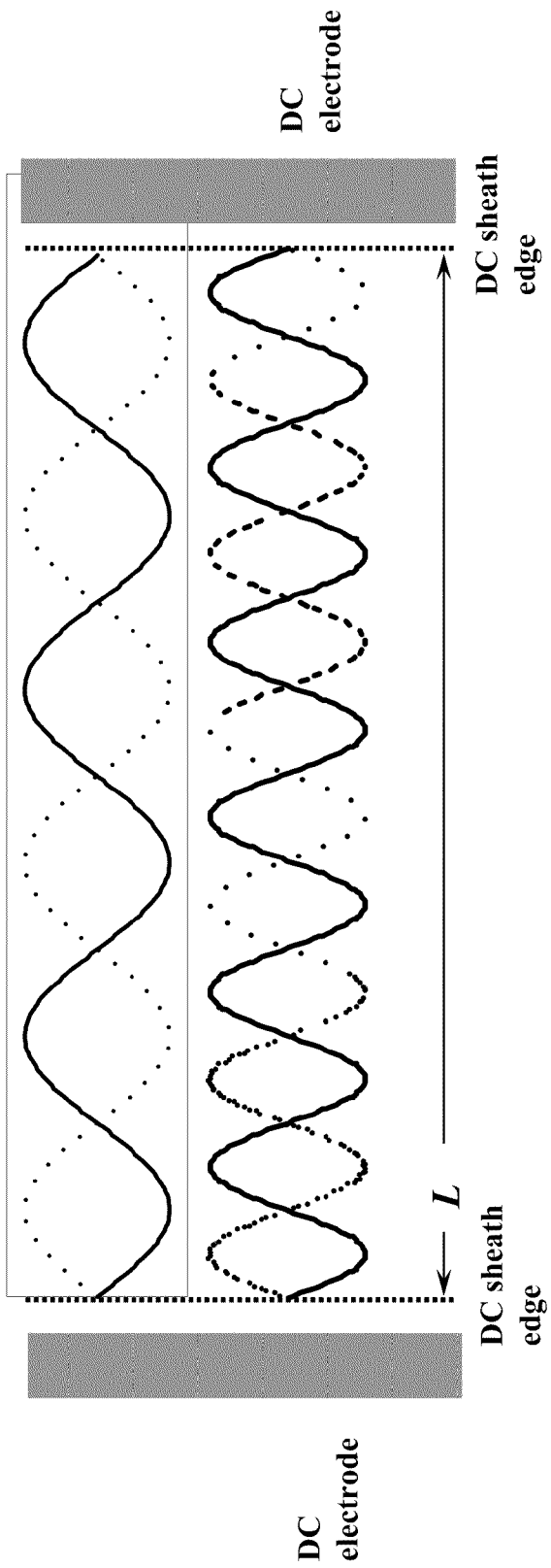
FIG. 28 illustrates exemplary bounded plasma data in accordance with embodiments of the invention.

FIG. 28 illustrates exemplary bounded plasma data in accordance with embodiments of the invention. The exemplary bounded plasma data can include data for DC-DC sheaths in bounded plasma. It is well-known that plasma electron waves reflect at sheath-edge [K. Saeki, H. Sugai et al., Plasma Phys. 17 (1975)] and therefore the wave cannot exist in the electron-free sheath region. For example, many standing wave modes are allowed—many middle-energy peaks ($E_M$s) with wavelength-spacing $\propto 2L/(n^2+n)$. That is essentially a continuum. Low $-v_\phi$ modes (~20 eV<$E_M$<300 eV=efficient ionization) could be localized bouncing between 2 electrodes growing without worrying about collisions: hence hollow cathode.

Figure 29:
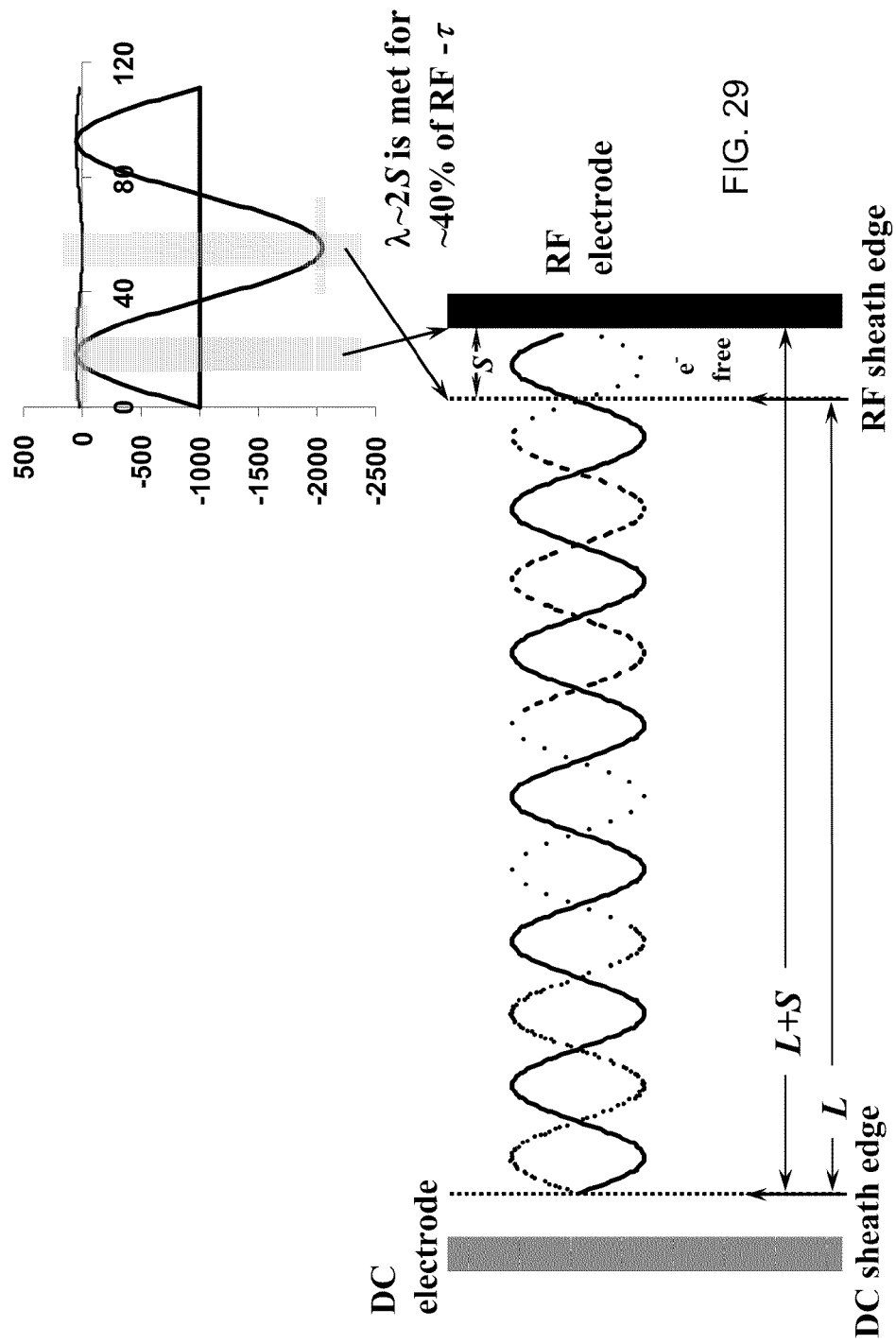
FIG. 29 illustrates other additional plasma references in accordance with embodiments of the invention.

FIG. 29 illustrates other additional plasma references in accordance with embodiments of the invention. These references include data for DC-RF sheaths in bounded plasma. The middle-energy peak can have a triangle shape with constant base-width. The DC/RFH experimental range can be $n_e$~2 to $4 \times 10^{10}$ cm$^{-3}$ ($\omega_p/2\pi$~1.6 Ghz). The lowest integer mode (highest $v_\phi$) fitting both L and L+S is $\lambda$~2S. For the example of 30 mt/−800V, the visually observed S is ~3 mm~$\lambda/2$, which gives $v_\phi$~107 m/s≅280 eV. The number is not exact but agree with all the trends.

Figure 30B:
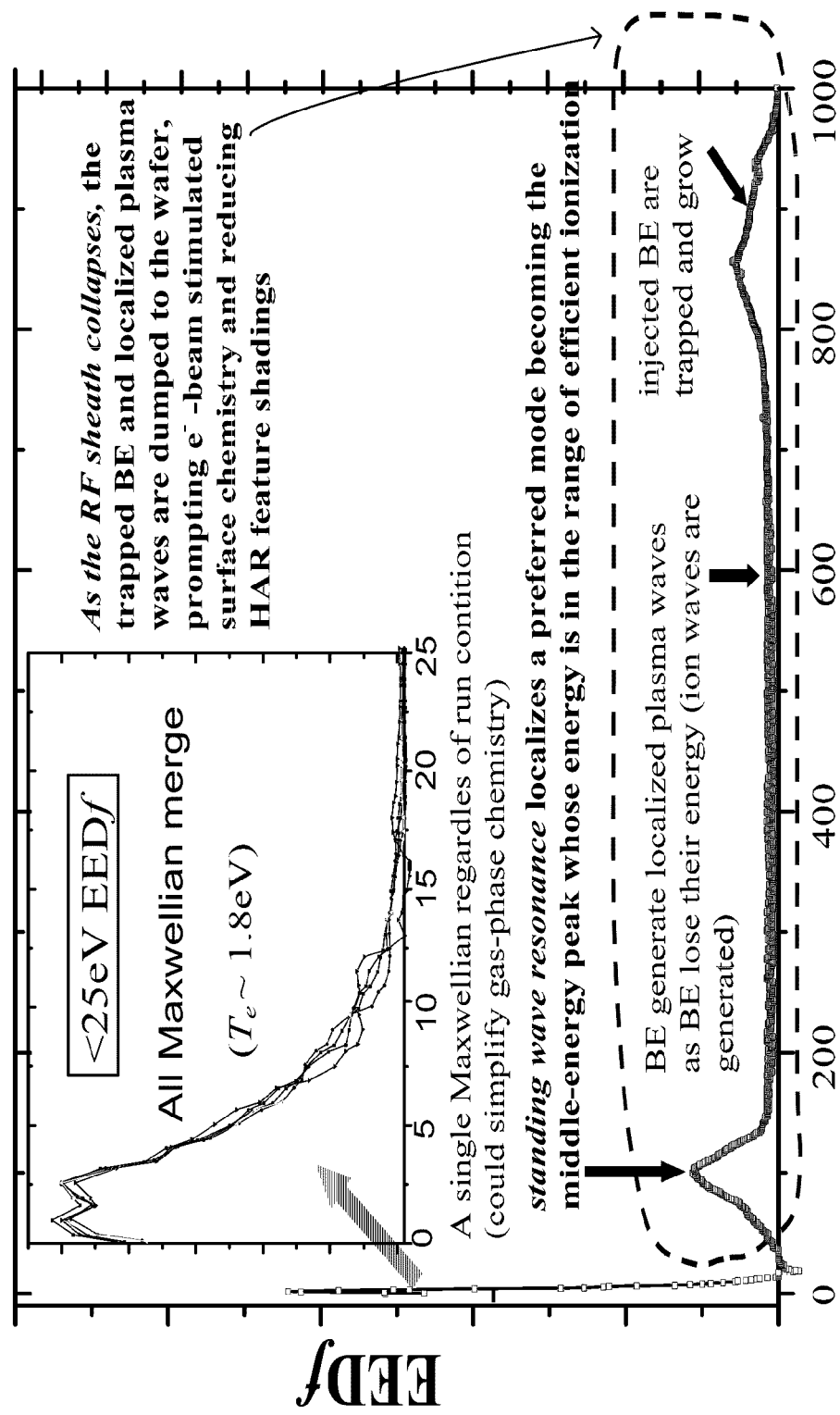

FIGS. 30A and 30B illustrate standing wave resonance (SWR) data and summary data in accordance with embodiments of the invention. FIG. 30A illustrates standing wave resonance (SWR) data in accordance with embodiments of the invention. In some embodiments, the SWR model can be used to determine the $E_M$.

In some embodiments, one or more simple equations can be used.

For example, the $E_M$ can be defined as the energy associated with a middle-energy peak can be calculated using the equation (5) shown below:

$$E_M = \frac{m_e \gamma_\phi^2}{2} \propto \left(\frac{\omega_P}{k_{SWR}}\right)^2 \propto (2s\sqrt{n_e})^2 \quad (5)$$

In addition, the sheath thickness (S) can be approximated using the equation (6) shown below:

$$S \propto \frac{V_{PP}^{3/4}}{n_e^{1/2} T_e^{1/4}} \quad (6)$$

As shown in FIG. 30A, the middle-energy peak energy $E_M$ can be approximated using the equations (7, 8, and 9) shown below:

$$E_M \sim \frac{V_{PP}^{3/2}}{v_B} \quad (7)$$

and $$v_B > \sqrt{\frac{kT_e}{M}} + \beta\sqrt{\frac{E_e}{M}} \quad (8)$$

and $$\beta \propto \frac{n_{b0}}{n_0} \quad (9)$$

In addition, when $T_e$ is a constant value the middle-energy peak energy $E_M$ can be approximated using the equation (10) shown below:

$$E_M \propto V_{PP}^{3/2} \quad (10)$$

where $v_B$ is the Bohm velocity). For conventional RF (CCP) the $v_B$ is simple and related to the square root of the Maxwellian $T_e$. However, for the DC/RFH processing system, it can be more complicated—that caused the miss-fit. The curve fit is assuming the conventional $v_B$ that is only proportional to the square root of $T_e$, not taking into account of the copious energetic electrons crossing the RF sheath boundary. Still, reasonable fit. The fit-trend shows that it will be a tight fit if $v_B$ is adjusted by equations shown on the middle-right portion of page 15. However, the value β can be approximated because it is very difficult to precisely determine. When DC/RFH procedures (recipe) are being developed, a SWR curve (FIG. 30A) can be developed when historical SWR curves are not available. In some embodiments, one or more test procedures can be performed in which $V_{pp}$ can be measured to develop, update, and/or verify the EEDƒ data and/or the SWR curve data. In other embodiments, one or more ion energy analyzers (IEA) test wafers and/or sensors can be used to determine IEA data that can be used to develop, update, and/or verify the EEDƒ data and/or the SWR curve data For an Ar-rich recipe, the process $V_{pp}$ can be about 1200V or higher, and can cause the $V_{dc}$ to be about 600V for the DC/RFH process chamber wherein $V_{dc}$ is the self-bias of the RF-biased wafer. As a result, the gas mixture can be adjusted accordingly to establish the $V_{dc}$ at about 600V. In addition, the ion energy can be established at a value that is less than about 600 eV because an ion energy above about 600 eV can cause problems such as sputtering the hard-mask corner. During some DC/RFH procedures, a process gas chemistry, having more $C_4F_8$ or more $C_5F_8$ with less $O_2$, can be used to generate a harder (more protective) polymer to eliminate the hard-mask corner sputtering problem.

When a DC/RFH procedure is being developed, the $E_M$ data is very important. Because, if $E_M$ is too low, the middle-energy peak electrons can be pushed into the Maxwellian thermal bulk, thereby pumping up the Maxwellian tail population that has values in the range from about 6 eV to about 17 eV.

FIG. 30B illustrates some summary data for the DC/RFH processing system. A first set of graphs (3010) shows that all of the Maxwellians can merge for some DC/RFH procedures. When a single Maxwellian can be approximated for a plurality of DC/RFH procedures (regardless of process conditions), this can simplify the gas-phase chemistry used in a DC/RFH procedure. A second graph (3020) having a middle-energy peak below about 200 eV is shown for another exemplary procedure. During some DC/RFH procedures, a standing wave resonance localizes a preferred mode and can become the middle-energy peak whose energy is in the range of efficient ionization. For example, the ballistic electrons (BE) can generate localized plasma waves, and when BEs lose their energy ion waves are generated. In addition, as the RF sheath collapses, the trapped BEs and localized plasma waves are dumped to the wafer, thereby establishing/controlling e⁻-beam stimulated surface chemistry and reducing HAR feature shadings.

Figure 31A:
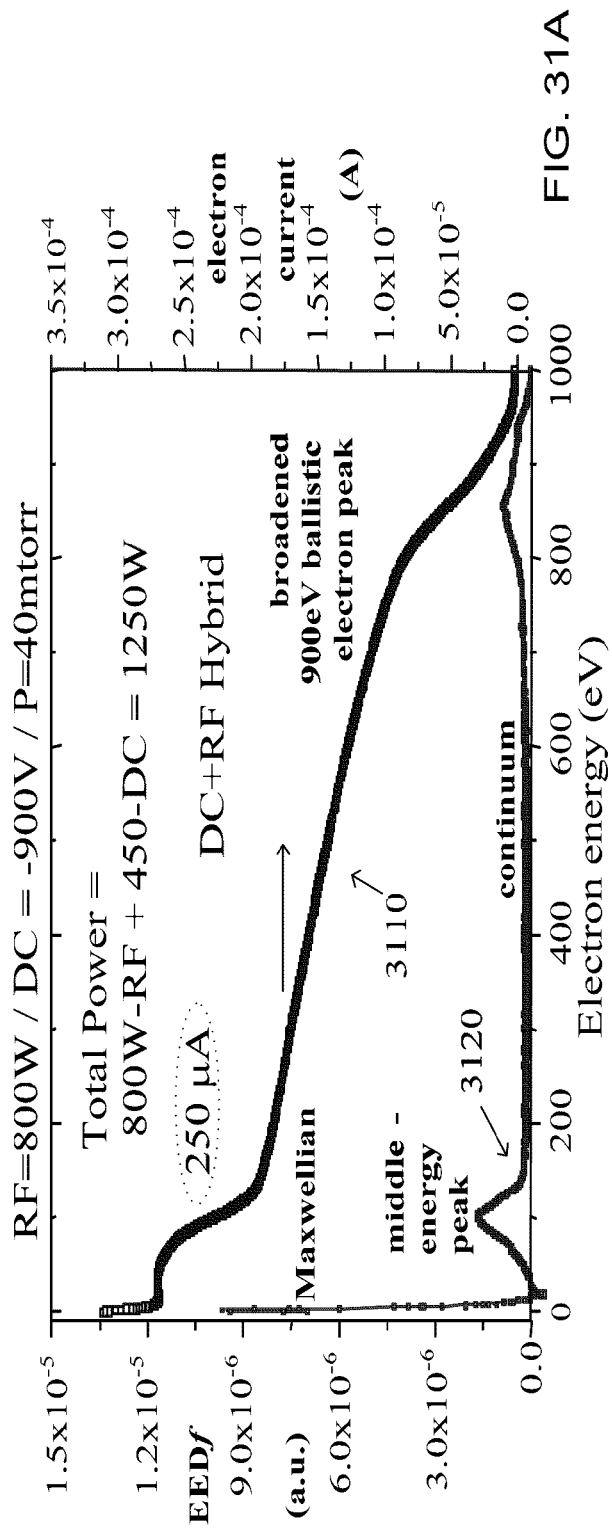
FIGS. 31A, 31B, and 31C illustrate process data for a Reactive Ion Etch (RIE) system in accordance with embodiments of the invention.
Figure 31B:
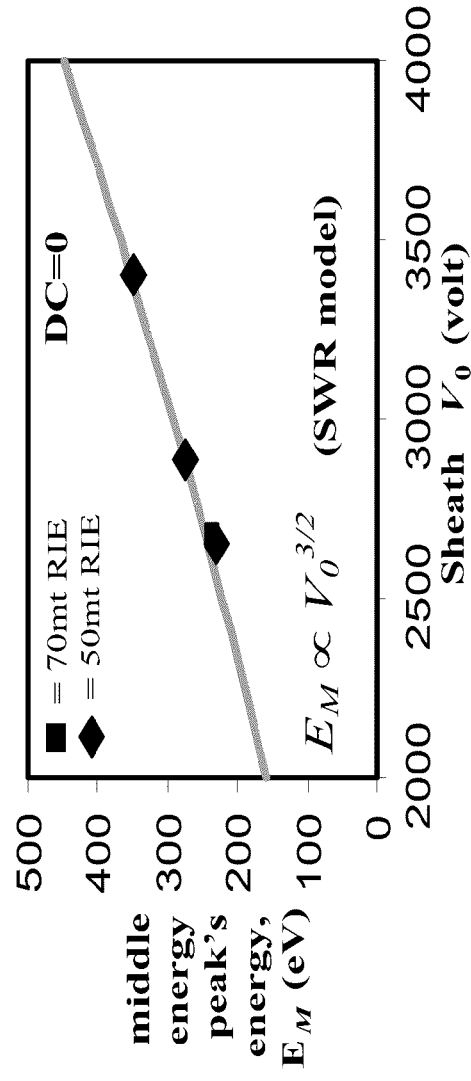
Figure 31C:
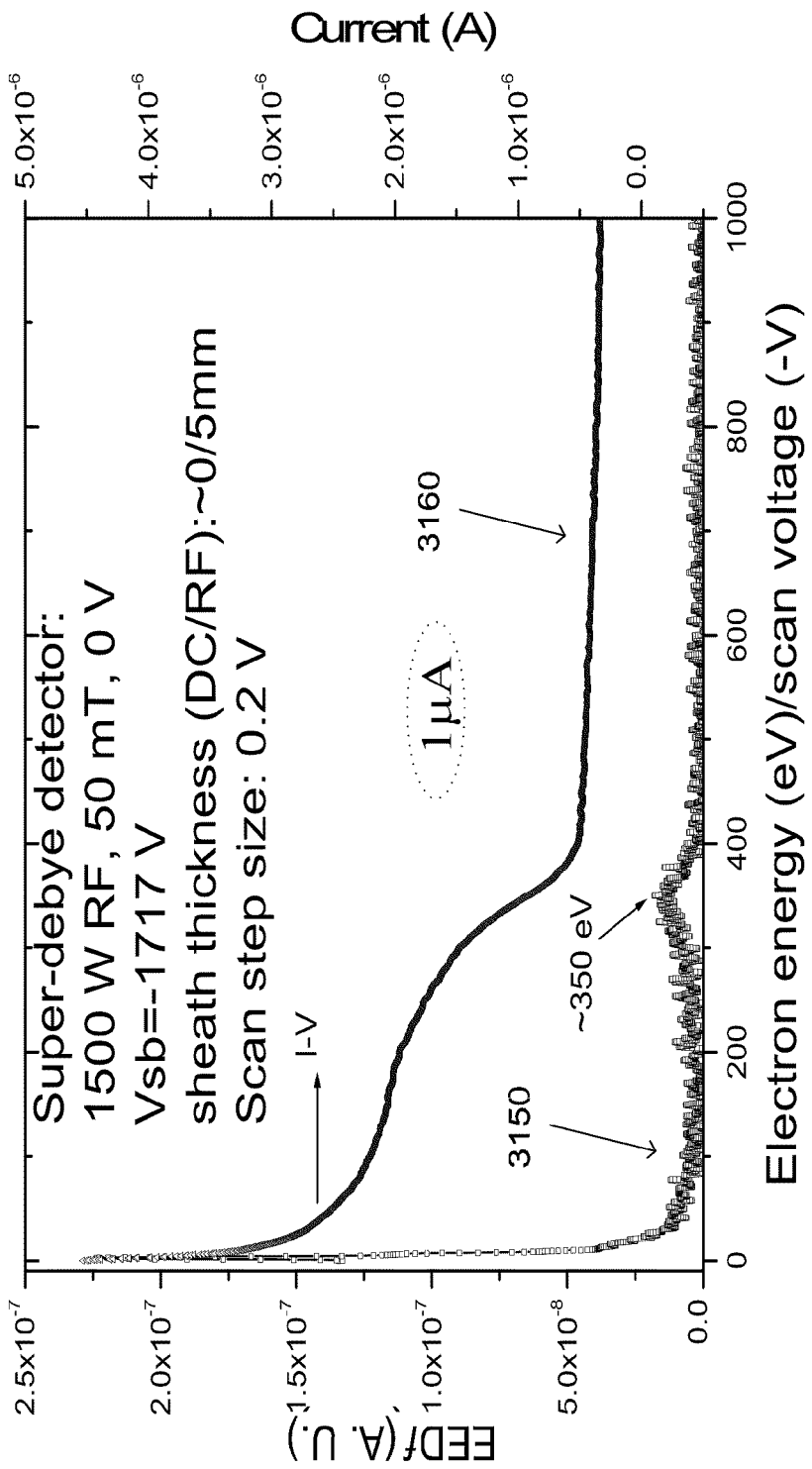

FIGS. 31A, 31B, and 31C illustrate process data for a Reactive Ion Etch (RIE) system in accordance with embodiments of the invention. FIG. 31A includes a graph (3110) of EEDƒ (a.u.) data versus electron energy (eV) data for the RIE system and a graph (3120) of electron current data (A) versus electron energy (eV) data for the RIE system. FIG. 31B includes a graph of the "middle energy peak's energy $E_M$ (eV) data versus the sheath $V_{PP}$ (volt) data for the RIE system determined using a SWR model. FIG. 31C includes a graph of EEDƒ (a.u.) data versus electron energy (eV) data (3150) for the RIE system, and a graph of current (A) versus the scan voltage (−V) for the RIE system (3160).

In addition, the graphs (3110, 3120, 3150, and 3160) illustrate that by controlling the plasma EEDƒ, the plasma chemistry can be controlled. The EEDƒ is controlled such that the electron population is in the energy range of ~6 eV to 17 eV for some DC/RFH procedures, and the electron population can be minimized for the molecular species used in thee DC/RFH procedures. The reason being that energy range electrons can dissociate molecules producing fluorine (F), oxygen (O) ions, etc. and can produce VUV radiation, and for different molecules, the range is slightly different (6 to 17 eV is just an example).

Figure 32:
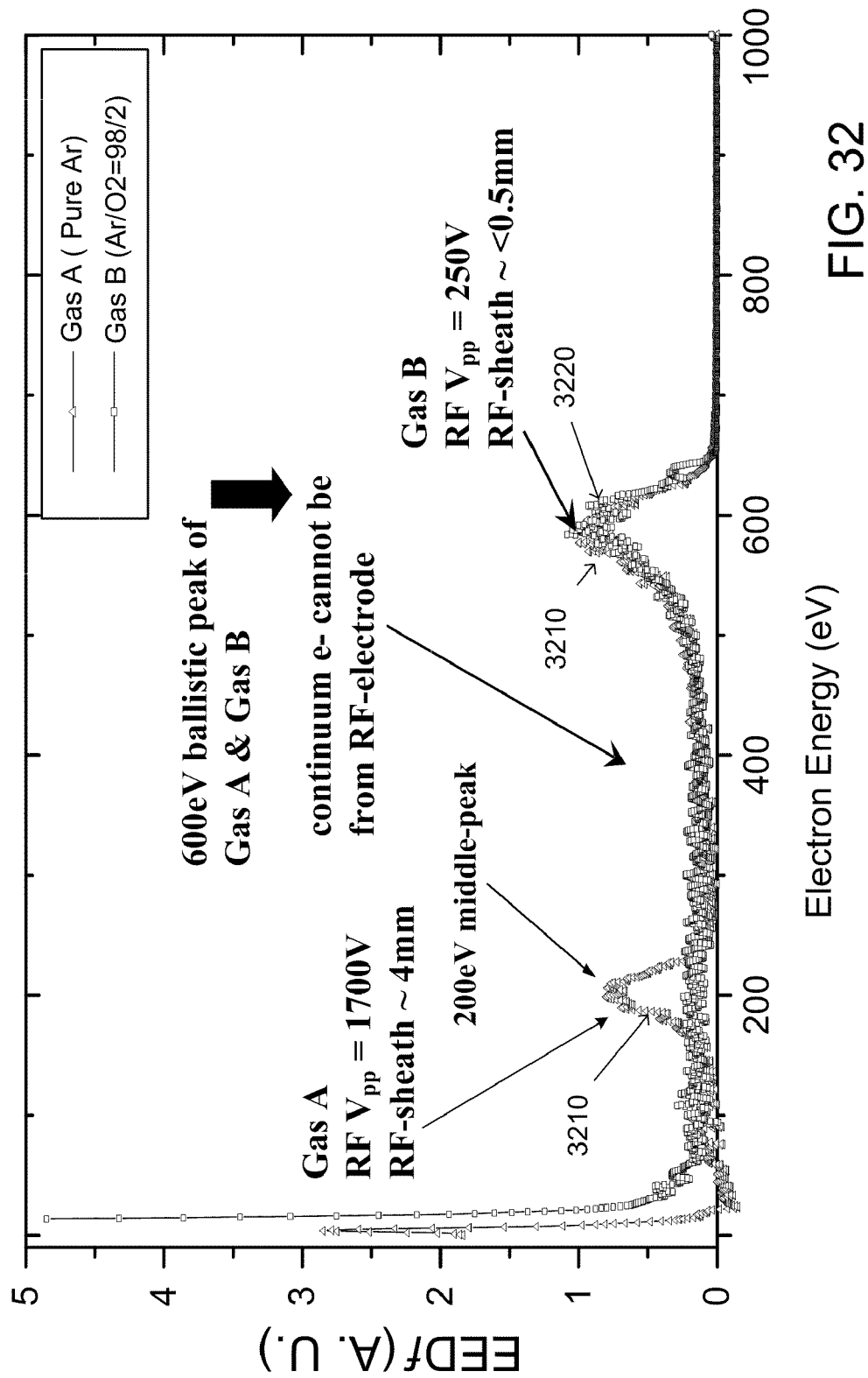
FIG. 32 illustrates process gas data for the DC/RFH processing system in accordance with embodiments of the invention.

FIG. 32 illustrates process gas data for the DC/RFH processing system in accordance with embodiments of the invention. The (BE) data can include a plurality of graphs of (BE) energy spread and (BE) peak shift data for the DC/RFH processing system. FIG. 32 includes a first graph of EED$f$ (a.u.) data versus electron energy (eV) data (3210) for the DC/RFH processing system, and during this first procedure, the chamber pressure was about 30 mT, the 13.56 Mhz RF bias power was about 600 W, the DC voltage was about $-600V_{DC}$, and the process gas (A) included Ar. FIG. 32 also includes a second graph of EED$f$ (a.u.) data versus electron energy (eV) data (3220) for the DC/RFH processing system, and during this first procedure, the chamber pressure was about 30 mT, the 13.56 Mhz RF bias power was about 600 W, the DC voltage was about $-600V_{DC}$, and the process gas (B) included Ar/$O_2$. The graphs (3210 and 3220) show that the "continuum" portion is not dependent upon the RF electrode and a "600 eV ballistic peak" is shown in both graphs (3210 and 3220).

Figure 33:
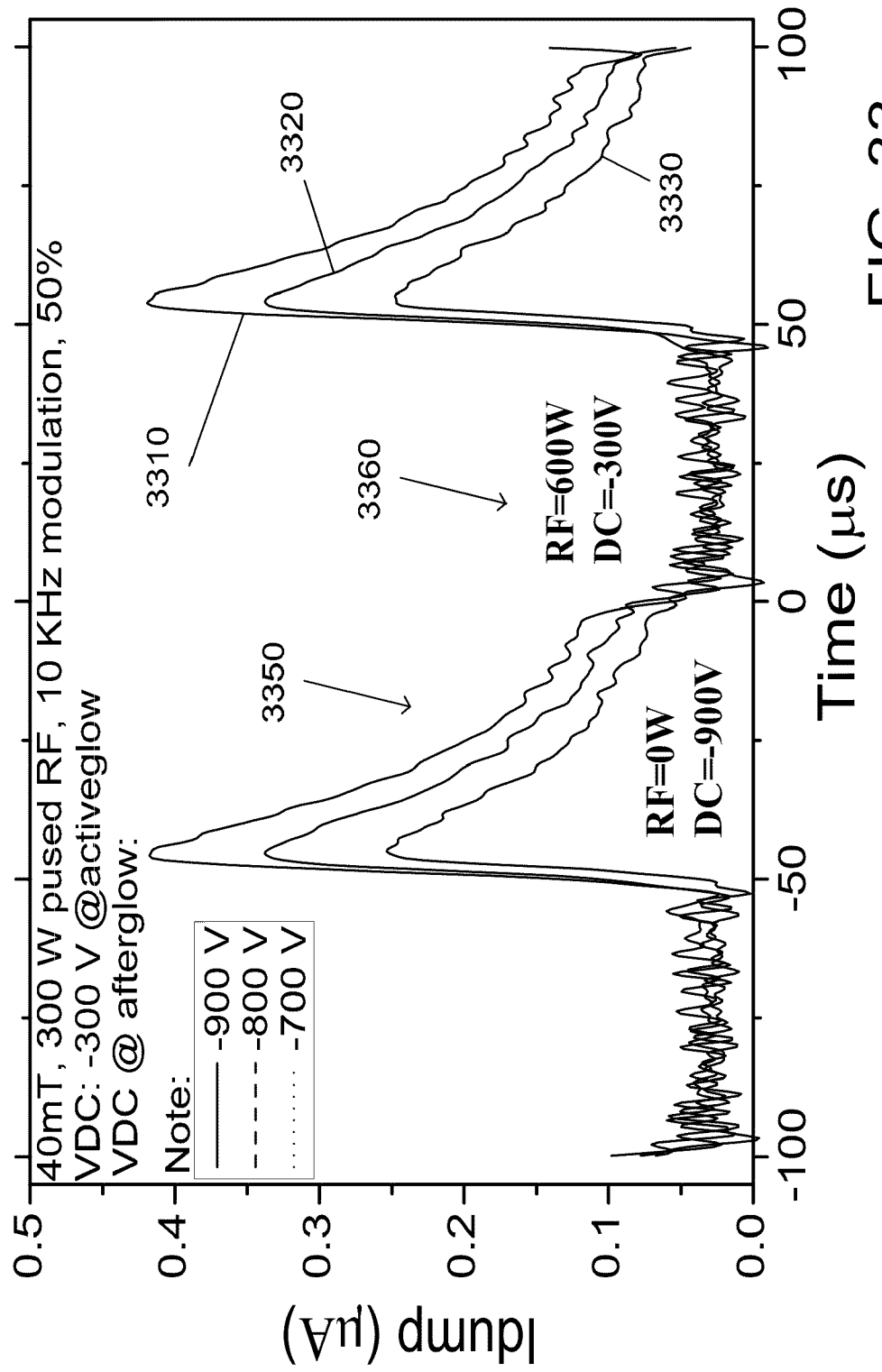
FIG. 33 illustrates pulsed RF data for the DC/RFH processing system in accordance with embodiments of the invention.

FIG. 33 illustrates pulsed RF data for the DC/RFH processing system in accordance with embodiments of the invention. FIG. 33 includes a first graph of $I_{dump}$ (microamps) data versus time (microseconds) data (3310) for the DC/RFH processing system, and during this first procedure, the chamber pressure was about 40 mT, the 13.56 Mhz RF bias power (300 W) was pulsed, the DC voltage was about $-900V_{DC}$. FIG. 33 includes a second graph of $I_{dump}$ (microamps) data versus time (microseconds) data (3320) for the DC/RFH processing system, and during this second procedure, the chamber pressure was about 40 mT, the 13.56 Mhz RF bias power (300 W) was pulsed, the DC voltage was about $-800V_{DC}$. FIG. 33 includes a third graph of $I_{dump}$ (microamps) data versus time (microseconds) data (3330) for the DC/RFH processing system, and during this third procedure, the chamber pressure was about 40 mT, the 13.56 Mhz RF bias power (300 W) was pulsed, the DC voltage was about $-700V_{DC}$. In addition, a first region 3350 is shown in which the RF signal is turned off (0 W), and second region 3360 is shown in which the RF signal is turned on (600 W).

Figure 34:
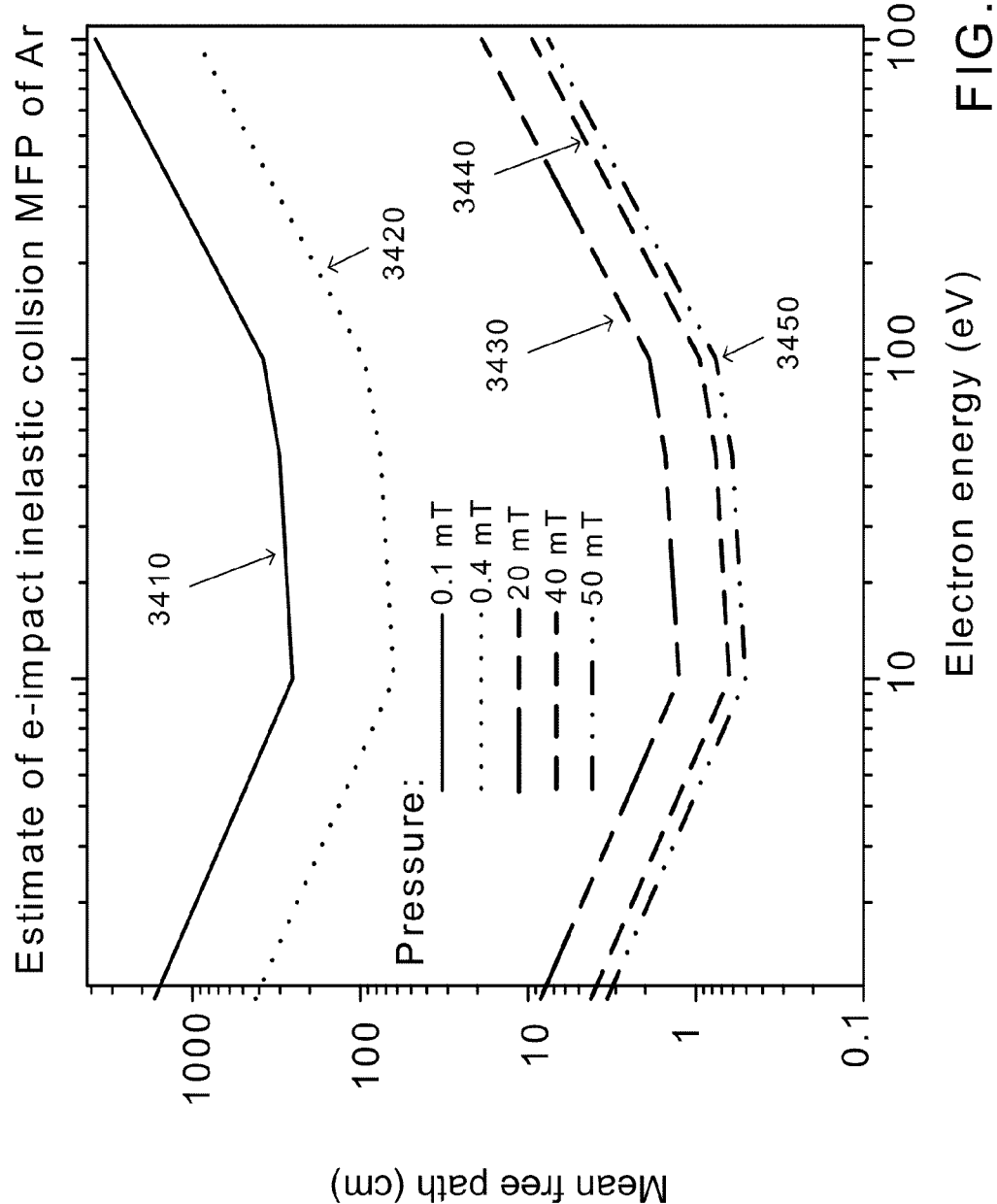
FIG. 34 illustrates mean free path data for the DC/RFH processing system in accordance with embodiments of the invention.

FIG. 34 illustrates mean free path data for the DC/RFH processing system in accordance with embodiments of the invention. FIG. 34 includes a first graph of mean free path (cm) data versus electron energy (eV) data (3410) for a chamber pressure of about 0.1 mT, a second graph of mean free path (cm) data versus electron energy (eV) data (3420) for a chamber pressure of about 0.4 mT, a third graph of mean free path (cm) data versus electron energy (eV) data (3430) for a chamber pressure of about 20 mT, a fourth graph of mean free path (cm) data versus electron energy (eV) data (3440) for a chamber pressure of about 40 mT, and a fifth graph of mean free path (cm) data versus electron energy (eV) data (3410) for a chamber pressure of about 50 mT. This data shows the dependence upon pressure.

The inventors have determined that (1) the plasma electron energy distribution (EED$f$) controls the bulk plasma physical and chemical properties which affects etching, and the EED$f$ must be controlled in the DC/RFH processing system, and (2) when energetic part of the EED$f$ penetrates the wafer-sheath and comes in contact with the wafer in the DC/RFH processing system, positive effects occur to etch rates, selectivity, and profiles, and the DC+RF sources in the DC/RFH processing system can be configured to control and/or optimize the positive effects.

Figure 35:
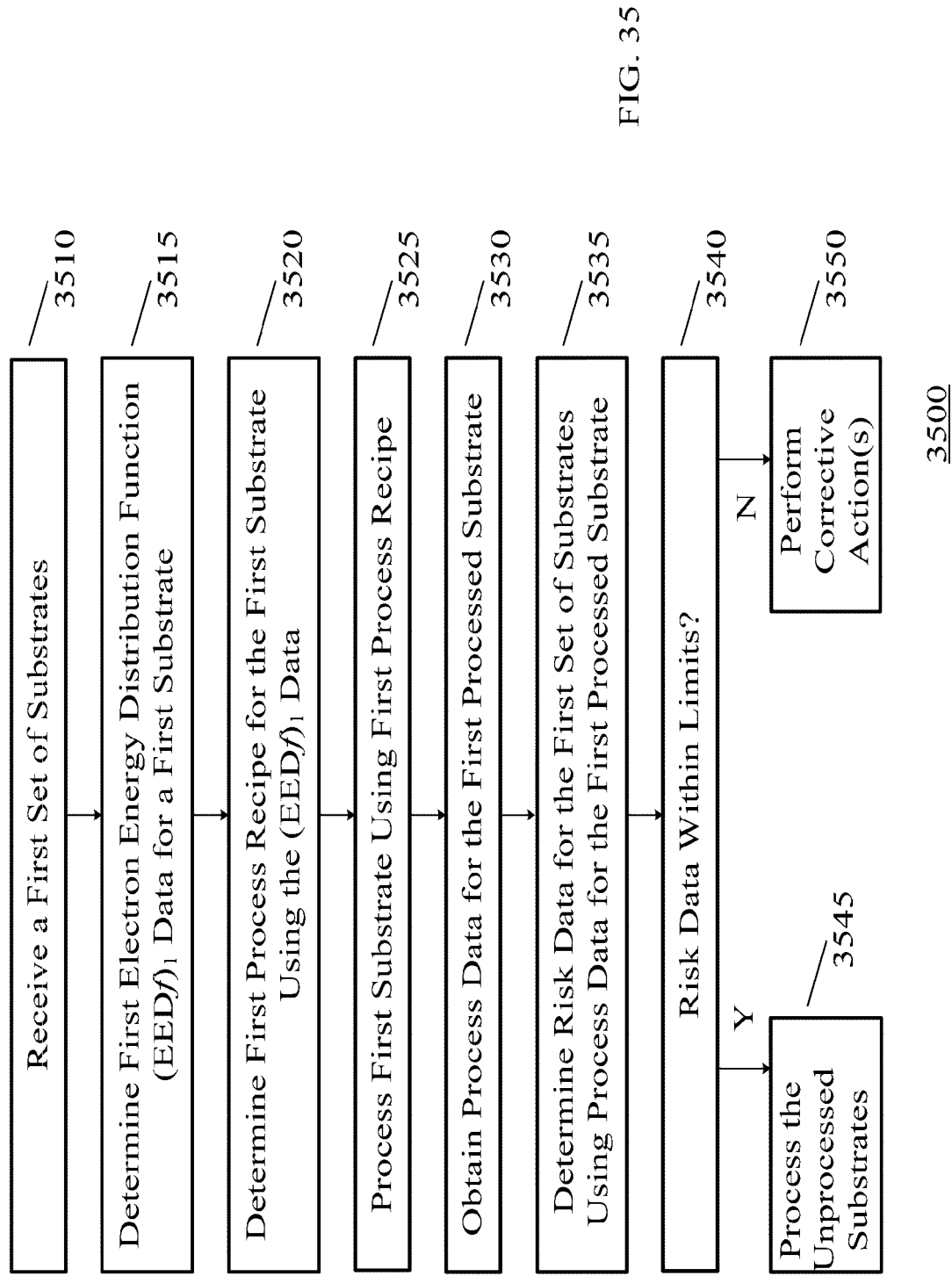
FIG. 35 shows an exemplary flow diagram of a method of processing a first set of substrates using a DC/RFH processing system in accordance with embodiments of the invention.

FIG. 35 shows an exemplary flow diagram of a method of processing a first set of substrates using a Direct Current (DC)/Radio Frequency (RF) Hybrid (DC/RFH) processing system in accordance with embodiments of the invention.

In 3510, a first set of substrates can be received by the DC/RFH processing system or a transfer subsystem coupled to the DC/RFH processing system. The substrates can have one or more deposited layers thereon, and the deposited layers can include Anti-Reflective Coating (ARC) material, Bottom Anti-Reflective Coating (BARC) material, Top Anti-Reflective Coating (TARC) material, organic planarization layer (OPL) material, organic dielectric layer (ODL) material, single-frequency resist material, dual-tone resist material, freezable or frozen resist material, Ultra-Violet (UV) resist material, or Extreme Ultra-Violet (EUV) resist material, or any combination thereof. For example, during some DC/RFH procedures, the substrate can have at least one un-exposed layer thereon, and during other DC/RFH procedures, the substrate can have at least one exposed layer thereon. When the DC/RFH procedures are performed during double-exposure sequences, different DC/RFH recipes can be used during the different double-exposure sequences.

In 3515, first Electron Energy Distribution Function (EED$f$)$_1$ data can be determined for a first substrate in the first set of substrates. The first (EED$f$)$_1$ data can include at least one of a Maxwellian component, a high-energy component, and a middle-energy component. The middle-energy component can be located between the Maxwellian component and the high-energy component, and middle-energy component can include at least one middle-energy peak.

In 3520, a first DC/RFH process recipe can be determined for a first substrate using the first (EED$f$)$_1$ data. In some embodiments, the first DC/RFH process recipe can be determined using the middle-energy peak in the (EED$f$) data. In other embodiments, the first DC/RFH process recipe can be determined using at least one of the Maxwellian component, the high-energy component, and the middle-energy component.

In 3525, the first substrate can be processed using the first DC/RFH process recipe. In some DC/RFH procedures, the first plasma can be created using a first process gas in the processing region (206, FIGS. 2A-2D). As illustrated in FIGS. 2A, 2B, 2C, and 2D, the processing region 206 may be located in a process chamber (210, FIGS. 2A-2D), and a RF generator 230 and a DC supply subsystem 240 can be coupled to a DC electrode 245 in the process chamber (210, FIGS. 2A-2D) in order to form the first plasma. A first process gas can be provided to the process chamber (210, FIGS. 2A-2D), and the flow rate for the first process gas can be monitored and controlled to optimize the first plasma.

In 3530, process (EED$f$)$_1$ data can be obtained for the first substrate before, during, and/or after the first substrate is processed. For example, the process (EED$f$)$_1$ data can be obtained using at least one super-Debye trap-period detector and/or at least one sub-Debye dump-period detector configured within the process chamber (210). In addition, the process (EED$f$)$_1$ data can be obtained using one or more of the sensors 250 or one or more of the measurement devices 234. When additional data is required, the first processed substrate can be transferred to the inspection subsystem (150, FIG. 1) and/or the evaluation subsystem (160, FIG. 1), and inspection and/or evaluation data can be obtained for the first substrate.

In 3535, risk data can be determined for the first set of substrates using the process (EED$f$)$_1$ data for the first substrate, and can include risk data for a Maxwellian component, risk data for a high-energy component, risk data for a middle-energy component, and/or risk data for at least one middle-energy peak. In addition, confidence data can be determined for the first set of substrates using the process $(EEDf)_1$ data for the first substrate, and can include confidence data for a Maxwellian component, confidence data for a high-energy component, confidence data for a middle-energy component, and/or confidence data for at least one middle-energy peak.

In 3540, a query can be performed to determine if the risk data is within $(EEDf)_1$ limits for the DC/RFH process recipe. When the risk data is within the $(EEDf)_1$ limits for the DC/RFH process recipe, procedure 3500 can branch to 3545, and the unprocessed substrates can be processed. When the risk data is not within the $(EEDf)_1$ limits for the DC/RFH process recipe, procedure 3500 can branch to 3550, and one or more corrective actions can be performed.

One or more of the controllers (114, 124, 134, 144, 154, 164, and 190) can be used to receive, determine, and/or send real-time and/or historical data associated with one or more of the first set of un-patterned and/or patterned substrates. For example, the real-time and/or historical data can include $(EEDf)$ data for patterned and/or un-patterned masking layers, $(EEDf)$ data for the masking features, and metrology data for the at least one periodic evaluation structure. In addition, the metrology data can include profile data, diffraction signal data, CD data, and sidewall angle (SWA) data that can be used to establish limits for the etching process.

In some examples, corrective actions can include stopping the processing, pausing the processing, re-evaluating one or more of the substrates, re-measuring one or more of the substrates, re-inspecting one or more of the substrates, re-working one or more of the substrates, storing one or more of the substrates, cleaning one or more of the substrates, delaying one or more of the substrates, or stripping one or more of the substrates, or any combination thereof.

Corrective actions can include calculating new and/or updated $(EEDf)$ data for one or more of the substrates. In addition, corrective actions can include increasing the number of required evaluation sites by one or more sites when one or more values in the risk map and/or confidence map are not within a limit; and decreasing the number of required evaluation sites by one or more sites when one or more values in the risk and/or confidence map are within the limit.

In some examples, individual and/or total confidence values for the DC/RFH procedure can be compared to individual and/or total confidence limits. The processing of a set of substrates can continue, if one or more of the confidence limits are met, or corrective actions can be applied if one or more of the confidence limits are not met. Corrective actions can include establishing confidence values for one or more additional substrates in the first set of substrates, comparing the confidence values for one or more of the additional substrates to additional confidence limits, and either continuing the DC/RFH procedure, if one or more of the additional confidence limits are met, or stopping the DC/RFH procedure, if one or more of the additional confidence limits are not met.

In other examples, individual and/or total risk values for the substrate can be compared to individual and/or total risk limits. The processing of a set of substrates can continue, if one or more of the risk limits are met, or corrective actions can be applied if one or more of the risk limits are not met. Corrective actions can include establishing risk values for one or more additional substrates in the first set of substrates, comparing the risk values for one or more of the additional substrates to additional risk limits; and either continuing the DC/RFH procedure, if one or more of the additional risk limits are met, or stopping the DC/RFH procedure, if one or more of the additional risk limits are not met.

FIG. 36 illustrates an exemplary view of a DC/RFH etching procedure using a dielectric structure in accordance with embodiments of the invention. In the illustrated embodiment, two exemplary stacks (3600A and 3600B) are shown, but this is not required for the invention. Alternatively, a different number of stacks and different configurations may be used.

A first stack 3600A is shown that includes a substrate layer 3610, a dielectric layer 3620, and a mask layer 3630. For example, the substrate layer 3610 can include a semiconductor material, metal gate ($HfO_2$) material, poly-gate material, TiN material, and/or amorphous silicon (a-Si) material; the dielectric layer 3620 can include low-k and/or ultra-low-k material; the mask layer 3630 can include silicon-containing anti-reflective coating (SiARC) material, ArF photoresist material, single-frequency resist material, dual-tone resist material, freezable or frozen resist material, Ultra-Violet (UV) resist and/or ARC material, or Extreme Ultra-Violet (EUV) resist and/or ARC material.

A second stack 3600B is shown that includes a substrate layer 3610 and an etched dielectric layer 3650. For example, the substrate layer 3610 can include a semiconductor material, metal gate ($HfO_2$) material, poly-gate material, TiN material, and/or amorphous silicon (a-Si) material; the etched dielectric layer 3650 can include etched low-k and/or etched ultra-low-k material.

The etched dielectric layer 3650 includes a plurality of dielectric features 3670 and a plurality of high aspect ratio vias and/or high aspect ratio contacts 3660. The dielectric features 3670 can have a thickness (height) 3671 that can vary from 10 nm to 500 nm and can have widths 3672 that can vary from 10 nm to 500 nm. The high aspect ratio vias and/or high aspect ratio contacts 3660 can have depths 3661 that can vary from 10 nm to 500 nm and can have openings 3662 that can vary from 10 nm to 500 nm. When the DC/RFH procedures use $(EEDf)$ data, the openings 3662 have a more circular shape, and the improved shape allows a more uniform filling of the high aspect ratio vias and/or high aspect ratio contacts 3660.

FIG. 37 shows an exemplary flow diagram of another method of processing substrates using a Direct Current (DC)/Radio Frequency (RF) Hybrid (DC/RFH) processing system in accordance with embodiments of the invention.

In 3710, one or more substrates can be received by the DC/RFH processing system, and a first substrate can be positioned on a substrate holder in a process chamber in the DC/RFH processing system. The substrates can have one or more deposited layers thereon, and the deposited layers can include ARC material, BARC material, TARC material, organic planarization layer (OPL) material, organic dielectric layer (ODL) material, single-frequency resist material, dual-tone resist material, freezable or frozen resist material, Ultra-Violet (UV) resist material, or Extreme Ultra-Violet (EUV) resist material, or any combination thereof. For example, during some DC/RFH procedures, the substrate can have at least one un-exposed layer thereon, and during other DC/RFH procedures, the substrate can have at least one exposed layer thereon. When the DC/RFH procedures are performed during double-exposure sequences, different DC/RFH recipes can be used during the different double-exposure sequences.

In 3715, first Electron Energy Distribution Function $(EEDf)_1$ data can be determined for a first substrate in the first set of substrates. The first $(EEDf)_1$ data can include at least one of a Maxwellian component, a high-energy component, and a middle-energy component. The middle-energy component can be located between the Maxwellian component and the high-energy component, and middle-energy component can include at least one middle-energy peak.

In 3720, a first DC/RFH procedure and first DC/RFH process recipe can be determined for a first substrate using the first $(EEDf)_1$ data. In some embodiments, the first DC/RFH procedure and first process recipe can be determined using the middle-energy peak. In other embodiments, the first DC/RFH procedure and first process recipe can be determined using at least one of the Maxwellian component, the high-energy component, and the middle-energy component.

In 3725, the first substrate can be processed using the first process parameters established by the first DC/RFH procedure. In some DC/RFH procedures, the first plasma can be created using a first process gas in the processing region (206, FIGS. 2A-2D). As illustrated in FIGS. 2A, 2B, 2C, and 2D, the processing region (206, FIGS. 2A-2D) may be located in a process chamber (210, FIGS. 2A-2D), and a RF generator (230, FIGS. 2A-2D) and a DC supply subsystem 240 can be coupled to the process chamber (210, FIGS. 2A-2D) in order to form the first plasma. A first process gas can be provided to the process chamber (210, FIGS. 2A-2D), and the flow rate for the first process gas can be monitored and controlled to optimize the first plasma.

In 3730, $EEDf$-related data can be obtained in real-time for the first substrate using $EEDf$-related sensors configured within the process chamber. When additional data is required, the first processed substrate can be transferred to the inspection subsystem (150, FIG. 1) and/or the evaluation subsystem (160, FIG. 1), and inspection and/or evaluation data can be obtained for the first substrate. For example, the $EEDf$-related data can include real-time data for a Maxwellian component, real-time data for a high-energy component, real-time data for a middle-energy component, and/or real-time data for at least one middle-energy peak. In addition, risk data and/or confidence data can be determined for the substrates using the $EEDf$-related data for the first substrate, and can include risk/confidence data for a Maxwellian component, risk/confidence data for a high-energy component, risk/confidence data for a middle-energy component, and/or risk/confidence data for at least one middle-energy peak.

In 3735, a query can be performed to determine if the $EEDf$-related data is within $EEDf$-related limits for the first DC/RFH procedure and first process recipe. When the $EEDf$-related data is within the $(EEDf)_1$ limits for the DC/RFH process recipe, procedure 3700 can branch to 3740, and the first DC/RFH procedure can continue. When the $EEDf$-related data is not within the $(EEDf)_1$ limits for the DC/RFH process recipe, procedure 3700 can branch to 3745, and one or more corrective actions can be performed.

In some examples, corrective actions can include obtaining new correct data from at least one super-Debye trap-period detector and/or at least one sub-Debye dump-period detector, and modifying one of the process parameters in real-time correct this incorrect data.

In other examples, corrective actions can include stopping the processing, pausing the processing, re-evaluating one or more of the substrates, re-measuring one or more of the substrates, re-inspecting one or more of the substrates, re-working one or more of the substrates, storing one or more of the substrates, cleaning one or more of the substrates, delaying one or more of the substrates, or stripping one or more of the substrates, or any combination thereof.

In still other embodiments, one or more sensor substrates can be processed to obtain a verified DC/RFH procedure and/or verified DC/RFH data. When a DC/RFH procedure is being verified, one or more verification (sensor) structures can be created on a sensor substrate. When the sensor substrate is used, one or more sensor structure can be selected from a number of previously verified sensor structures on the sensor substrate. During the verification, ($EEDf$) data can be obtained from at least one of the verification (sensor) structures that can include super-Debye trap-period detectors and sub-Debye dump-period detectors. The verified ($EEDf$) data can be stored as verified library data that is associated with the DC/RFH procedure. Confidence data and/or risk data can be determined and/or stored for the verified ($EEDf$) data. In addition, the ($EEDf$) data in the library can include goodness of fit (GOF) data, creation rules data, measurement data, inspection data, verification data, map data, confidence data, accuracy data, process data, or uniformity data, or any combination thereof.

FIG. 38 shows an exemplary flow diagram of another method of processing substrates using a Direct Current (DC)/Radio Frequency (RF) Hybrid (DC/RFH) processing system in accordance with embodiments of the invention.

In 3810, a test (data-collection) substrate can be selected from one or more substrates received by the DC/RFH processing system. In some embodiments, the test (data-collection) substrate can include a test structure (800, FIG. 8) and can include a plurality of super-Debye trap-period detectors (810, FIG. 8) and a plurality of sub-Debye dump-period detectors (820, FIG. 8). In other embodiments, the test (data-collection) substrate can include one or more process stacks (3600A and 3600B, FIG. 36), and the test (data-collection) substrates can have one or more layers thereon, and the layers can include ARC material, BARC material, TARC material, organic planarization layer (OPL) material, organic dielectric layer (ODL) material, single-frequency resist material, dual-tone resist material, freezable or frozen resist material, Ultra-Violet (UV) resist material, or Extreme Ultra-Violet (EUV) resist material, or any combination thereof.

In 3815, the selected test (data-collection) substrate can be positioned on a substrate holder (220, FIGS. 2A-2D) in a process chamber (210, FIGS. 2A-2D) in the DC/RFH processing system (200A-200D, FIGS. 2A-2D). In addition, when a new test (data-collection) substrate has been selected, the new test (data-collection) substrate can be positioned on a substrate holder (220, FIGS. 2A-2D) in a process chamber (210, FIGS. 2A-2D) in the DC/RFH processing system (200A-200D, FIGS. 2A-2D).

In 3820, Electron Energy Distribution Function ($EEDf$) data can be determined for the test substrate, and the $EEDf$ data can include a Maxwellian component, a high-energy component, or a middle-energy component, or any combination thereof. The middle-energy component can be located between the Maxwellian component and the high-energy component, and middle-energy component can include at least one middle-energy peak. In addition, when a new test (data-collection) substrate has been selected, new $EEDf$ data can be determined for the new test substrate, and the new $EEDf$ data can include a new Maxwellian component, a new high-energy component, or a new middle-energy component, or any combination thereof.

In 3825, a DC/RFH procedure and a DC/RFH process recipe can be selected for the selected substrate using the previously-determined $EEDf$ data. In some embodiments, the DC/RFH procedure and the DC/RFH process recipe can be selected using the middle-energy peak data. In other embodiments, the DC/RFH procedure and a DC/RFH process recipe can be selected using the Maxwellian data, the high-energy data, or the middle-energy data. In addition, when a new test (data-collection) substrate has been selected, a new DC/RFH procedure and a new DC/RFH process recipe can be selected for the new selected substrate using the previously-determined EEDƒ data and/or new EEDƒ data In 3830, EEDƒ-related data can be obtained in real-time when the selected substrate is being processed using the DC/RFH process parameters established by the DC/RFH procedure. In some DC/RFH procedures, plasma can be created using a process gas in the processing region (206, FIGS. 2A-2D). As illustrated in FIGS. 2A, 2B, 2C, and 2D, the processing region (206, FIGS. 2A-2D) may be located in a process chamber (210, FIGS. 2A-2D), and a RF generator (230, FIGS. 2A-2D) and a DC supply subsystem (240, FIGS. 2A-2D) can be coupled to the process chamber (210, FIGS. 2A-2D) in order to form the first plasma. A first process gas can be provided to the process chamber (210, FIGS. 2A-2D), and the flow rate for the first process gas can be monitored and controlled to optimize the first plasma. In addition, new EEDƒ-related data can be obtained in real-time when the new selected substrate is being processed using the new DC/RFH process parameters established by the new .DC/RFH procedure.

In 3835, a query can be performed to determine if the EEDƒ-related data collection process has been completed for the selected substrate, the selected DC/RFH procedure, and the selected DC/RFH process recipe. When the EEDƒ-related data collection process has been completed, procedure 3800 can branch to 3870, and the procedure 3800 can end. When the EEDƒ-related data collection process has not been completed, procedure 3800 can branch to 3840 and procedure 3800 can continue as shown in FIG. 38. In addition, when the new EEDƒ-related data collection process has been completed, procedure 3800 can branch to 3870, and the procedure 3800 can end, and when the new EEDƒ-related data collection process has not been completed, procedure 3800 can branch to 3840 and procedure 3800 can continue as shown in FIG. 38.

In 3840, a query can be performed to determine if a cleaning procedure is required for the selected or the new selected substrate. When a cleaning procedure is required for the selected or the new selected substrate, procedure 3800 can branch to 3845, and procedure 3800 can continue as shown in FIG. 38. When a cleaning procedure is not required for the selected or the new selected substrate, procedure 3800 can branch to 3850 and procedure 3800 can continue as shown in FIG. 38.

In 3845, a cleaning procedure can be performed for the selected or the new selected test substrate. In some embodiments, the selected or the new selected test substrate can be positioned in the process chamber (210, FIGS. 2A-2D) when the cleaning procedure is performed. In other embodiments, the selected or the new selected test substrate is not positioned in the process chamber (210, FIGS. 2A-2D) when the cleaning procedure is performed.

In 3850, a query can be performed to determine if a new DC/RFH procedure and/or a new DC/RFH process recipe is required for the selected test substrate or the new selected test substrate. When a new DC/RFH procedure and/or a new DC/RFH process recipe is required for the selected test substrate or the new selected test substrate, procedure 3800 can branch to 3855, and the procedure 3800 can continue as shown in FIG. 38. When a new DC/RFH procedure and/or a new DC/RFH process recipe is not required for the selected test substrate or the new selected test substrate, procedure 3800 can branch to 3860 and procedure 3800 can continue as shown in FIG. 38.

In 3855, a new DC/RFH procedure and/or a new DC/RFH process recipe can be determined for the selected test substrate or the new selected test substrate.

In 3860, a query can be performed to determine if a new test substrate is required. When a new test substrate is required, procedure 3800 can branch to 3865, and the procedure 3800 can continue as shown in FIG. 38. When a new test substrate is not required procedure 3800 can branch to 3870 and procedure 3800 can end.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed:

1. A method of processing a substrate using a Direct Current (DC)/Radio Frequency (RF) Hybrid (DC/RFH) processing system, the method comprising:
   receiving a first set of substrates by a transfer subsystem coupled to the DC/RFH processing system;
   determining at least one first Electron Energy Distribution Function $(EEDƒ)_1$ data for a first substrate;
   determining a first DC/RFH process recipe for the first substrate using the at least one $(EEDƒ)_1$ data;
   processing the first substrate using the first DC/RFH process recipe;
   obtaining process data for the first substrate;
   determining risk data for the first set of substrates using process data for the first processed substrate;
   comparing the risk data to processing limits;
   processing additional substrates in the first set of substrates when the risk data does not exceed at least one of the processing limits; and
   performing a corrective action when the risk data exceeds one or more of the processing limits.

2. The method of claim 1, wherein the at least one first $(EEDƒ)_1$ data includes at least one of a Maxwellian component, a high-energy component, and a middle-energy component.

3. The method of claim 2, wherein the middle-energy component is located between the Maxwellian component and the high-energy component, and the middle-energy component includes at least one middle-energy peak.

4. The method of claim 1, wherein the first substrate includes at least one substrate layer having a semiconductor material therein or thereon, at least one dielectric layer having a low-k material therein or thereon, and at least mask layer having photoresist and/or anti-reflecting coating (ARC) therein or thereon.

5. The method of claim 1, wherein the first DC/RFH process recipe is determined using at least one Maxwellian component, at least one high-energy component, or at least one middle-energy component, or any combination thereof.

6. The method of claim 5, wherein the first DC/RFH process recipe is determined using at least one middle-energy peak in at least one middle-energy component.

7. The method of claim 1, wherein the processing the first substrate further comprises:
positioning the first substrate on a substrate holder configured within a process chamber of the DC/RFH processing system;
providing at first process gas to a process region above the first substrate in the process chamber using a gas supply system coupled to an upper assembly configured within the process chamber;
providing a direct current (DC) voltage to a DC electrode in the upper assembly, wherein a DC supply subsystem is coupled to the DC electrode and is configured to provide the DC voltage to the DC electrode, the DC voltage ranges from about −2000.0 $V_{DC}$ to about 0.0 $V_{DC}$;
establishing a pressure within the process chamber, wherein a pressure control subsystem is coupled to the process chamber and is configured to control the pressure within the process chamber, the pressure within the process chamber varying between about 5 mTorr and about 400 mTorr when the first substrate is processed; and
applying a RF signal to a lower electrode configured in the substrate holder, wherein a RF generator is coupled to the lower electrode and is configured to apply the RF signal to the lower electrode to establish plasma in the process region.

8. The method of claim 7, wherein the first process gas includes at least one fluorocarbon gas and at least one inert gas, a first fluorocarbon gas flow rate varying between approximately 10 sccm and approximately 50 sccm and a first inert gas flow rate varying between approximately 3 sccm and approximately 20 sccm, wherein the fluorocarbon gas comprises $C_4F_6$, $C_4F_8$, $C_5F_8$, $CHF_3$, or $CF_4$, or any combination thereof, and the inert gas comprises Argon (Ar), Helium (He), Krypton (Kr), Neon (Ne), Radon (Rn), or Xenon (Xe), or any combination thereof.

9. The method of claim 1, wherein performing the corrective action further comprises:
establishing risk values for one or more additional substrates in the first set of substrates;
comparing the risk values for one or more of the additional substrates to additional risk limits;
continuing the processing, when one or more of the additional risk limits are met; and
stopping the processing, if one or more of the additional risk limits are not met.

10. A method of processing a substrate using a Direct Current (DC)/Radio Frequency (RF) Hybrid (DC/RFH) processing system, the method comprising:
selecting a first substrate from a first set of substrates received by the DC/RFH processing system;
determining first Electron Energy Distribution Function $(EEDf)_1$ data for the first substrate;
determining a first DC/RFH procedure and a first DC/RFH process recipe for the first substrate using the first $(EEDf)_1$ data;
processing the first substrate using first process parameters established for the first DC/RFH process recipe;
obtaining EEDf-related data in real-time for the first substrate using EEDf-related sensors configured within a process chamber for performing the processing of the first substrate;
comparing the EEDf-related data to EEDf-related limits;
allowing the DC/RFH procedure to continue when the EEDf-related data does not exceed at least one of the EEDf-related limits; and
performing a corrective action when the EEDf-related data exceeds one or more of the EEDf-related limits.

11. The method of claim 10, wherein the first $(EEDf)_1$ data includes at least one of a Maxwellian component, a high-energy component, and a middle-energy component.

12. The method of claim 11, wherein the middle-energy component is located between the Maxwellian component and the high-energy component, and the middle-energy component includes at least one middle-energy peak.

13. The method of claim 10, wherein the first substrate includes at least one substrate layer having a semiconductor material therein or thereon, at least one dielectric layer having a low-k material therein or thereon, and at least mask layer having photoresist and/or anti-reflecting coating (ARC) therein or thereon.

14. The method of claim 10, wherein the first DC/RFH process recipe is determined using at least one Maxwellian component, at least one high-energy component, or at least one middle-energy component, or any combination thereof.

15. The method of claim 14, wherein the first DC/RFH process recipe is determined using at least one middle-energy peak in at least one middle-energy component.

16. The method of claim 10, wherein the processing the first substrate further comprises:
positioning the first substrate on a substrate holder configured within the process chamber of the DC/RFH processing system;
providing at first process gas to a process region above the first substrate in the process chamber using a gas supply system coupled to an upper assembly configured within the process chamber;
providing a direct current (DC) voltage to a DC electrode in the upper assembly, wherein a DC supply subsystem is coupled to the DC electrode and is configured to provide the DC voltage to the DC electrode, the DC voltage ranges from about −2000.0 $V_{DC}$ to about 0.0 $V_{DC}$;
establishing a pressure within the process chamber, wherein a pressure control subsystem is coupled to the process chamber and is configured to control the pressure within the process chamber, the pressure within the process chamber varying between about 5 mTorr and about 400 mTorr when the first substrate is processed; and
applying a RF signal to a lower electrode configured in the substrate holder, wherein a RF generator is coupled to the lower electrode and is configured to apply the RF signal to the lower electrode to establish plasma in the process region.

17. The method of claim 16, wherein the first process gas includes at least one fluorocarbon gas and at least one inert gas, a first fluorocarbon gas flow rate varying between approximately 10 sccm and approximately 50 sccm and a first inert gas flow rate varying between approximately 3 sccm and approximately 20 sccm, wherein the fluorocarbon gas comprises $C_4F_6$, $C_4F_8$, $C_5F_8$, $CHF_3$, or $CF_4$, or any combination thereof, and the inert gas comprises Argon (Ar), Helium (He), Krypton (Kr), Neon (Ne), Radon (Rn), or Xenon (Xe), or any combination thereof.

18. The method of claim 17, wherein the substrate holder comprises dual backside gas elements coupled to a backside gas system and temperature control elements coupled to a temperature control system configured to establish a first edge temperature and a first center temperature for the first substrate, the first edge temperature and the first center temperature being between approximately −10 degrees Celsius and approximately 100 degrees Celsius.

19. The method of claim 10, wherein the performing the corrective action further comprises:
obtaining new correct data from at least one super-Debye trap-period detector and/or at least one sub-Debye dump-period detector; and
modifying one of the first process parameters in real-time using the new correct data.

* * * * *